(12) United States Patent
Tois et al.

(10) Patent No.: US 11,094,535 B2
(45) Date of Patent: Aug. 17, 2021

(54) SELECTIVE PASSIVATION AND SELECTIVE DEPOSITION

(71) Applicant: ASM IP HOLDING B.V., Almere (NL)

(72) Inventors: Eva E. Tois, Espoo (FI); Suvi P. Haukka, Helsinki (FI); Raija H. Matero, Helsinki (FI); Elina Färm, Helsinki (FI); Delphine Longrie, Ghent (BE); Hidemi Suemori, Helsinki (FI); Jan Willem Maes, Wilrijk (BE); Marko Tuominen, Espoo (FI); Shaoren Deng, Ghent (BE); Ivo Johannes Raaijmakers, Bilthoven (NL); Andrea Illiberi, Leuven (BE)

(73) Assignee: ASM IP HOLDING B.V., Almere (NL)

( * ) Notice: Subject to any disclaimer, the term of this patent is extended or adjusted under 35 U.S.C. 154(b) by 99 days.

(21) Appl. No.: 15/892,728

(22) Filed: Feb. 9, 2018

(65) Prior Publication Data

US 2018/0233350 A1    Aug. 16, 2018

Related U.S. Application Data

(60) Provisional application No. 62/458,952, filed on Feb. 14, 2017, provisional application No. 62/481,524, (Continued)

(51) Int. Cl.
*H01L 21/02* (2006.01)
*H01L 21/311* (2006.01)
(Continued)

(52) U.S. Cl.
CPC ...... *H01L 21/0228* (2013.01); *H01L 21/0272* (2013.01); *H01L 21/02118* (2013.01);
(Continued)

(58) Field of Classification Search
CPC .......... H01L 21/3105; H01L 21/31116; H01L 21/31144; H01L 21/76829;
(Continued)

(56) References Cited

U.S. PATENT DOCUMENTS

| 4,804,640 A | 2/1989 | Kaganowicz |
| 4,863,879 A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Suntola, "Handbook of Crystal Growth. vol. 3., Thin Films and Epitaxy, Part B: Growth mechanisms and Dynamics", Amsterdam: North Holland, Elsevier Science Publishers (1994), Chapter 14, pp. 601-663.

(Continued)

*Primary Examiner* — Mary A Wilczewski
(74) *Attorney, Agent, or Firm* — Knobbe, Martens, Olson & Bear, LLP

(57) ABSTRACT

Methods for selective deposition, and structures thereof, are provided. Material is selectively deposited on a first surface of a substrate relative to a second surface of a different material composition. A passivation layer is selectively formed from vapor phase reactants on the first surface while leaving the second surface without the passivation layer. A layer of interest is selectively deposited from vapor phase reactants on the second surface relative to the passivation layer. The first surface can be metallic while the second surface is dielectric, or the second surface is dielectric while the second surface is metallic. Accordingly, material, such as a dielectric, can be selectively deposited on either metallic (Continued)

or dielectric surfaces relative to the other type of surface using techniques described herein. Techniques and resultant structures are also disclosed for control of positioning and shape of layer edges relative to boundaries between underlying disparate materials.

19 Claims, 27 Drawing Sheets

Related U.S. Application Data filed on Apr. 4, 2017, provisional application No. 62/591,724, filed on Nov. 28, 2017.

(51) Int. Cl.
| | | |
|---|---|---|
| H01L 21/56 | (2006.01) | |
| H01L 21/67 | (2006.01) | |
| H01L 21/768 | (2006.01) | |
| H01L 23/31 | (2006.01) | |
| H01L 23/522 | (2006.01) | |
| H01L 23/528 | (2006.01) | |
| H01L 23/532 | (2006.01) | |
| H01L 21/32 | (2006.01) | |
| H01L 21/027 | (2006.01) | |
| H01L 21/321 | (2006.01) | |
| H01L 21/3105 | (2006.01) | |

(52) U.S. Cl.
CPC .. *H01L 21/02181* (2013.01); *H01L 21/02186* (2013.01); *H01L 21/02189* (2013.01); *H01L 21/3105* (2013.01); *H01L 21/31116* (2013.01); *H01L 21/31138* (2013.01); *H01L 21/31144* (2013.01); *H01L 21/32* (2013.01); *H01L 21/321* (2013.01); *H01L 21/56* (2013.01); *H01L 21/67069* (2013.01); *H01L 21/7682* (2013.01); *H01L 21/76829* (2013.01); *H01L 21/76834* (2013.01); *H01L 21/76877* (2013.01); *H01L 23/3171* (2013.01); *H01L 23/528* (2013.01); *H01L 23/5226* (2013.01); *H01L 23/53238* (2013.01); *H01L 23/53295* (2013.01)

(58) Field of Classification Search
CPC ......... H01L 21/76834; H01L 21/28562; H01L 21/02639; H01L 21/02642; H01L 21/76879; H01L 21/31138; H01L 21/7682; H01L 21/76877; H01L 23/3171; H01L 23/53238; H01L 23/53295; H01L 23/5226; H01L 21/02118; H01L 21/0228; H01L 21/02181; H01L 21/02186; H01L 21/02189; H01L 21/0272; H01L 21/32; H01L 21/321; H01L 21/56; H01L 21/67069
See application file for complete search history.

(56) References Cited

U.S. PATENT DOCUMENTS

| | | | |
|---|---|---|---|
| 4,948,755 A | 8/1990 | Mo | |
| 5,288,697 A | 2/1994 | Schrepp et al. | |
| 5,447,887 A | 9/1995 | Filipiak et al. | |
| 5,604,153 A | 2/1997 | Tsubouchi et al. | |
| 5,633,036 A | 5/1997 | Seebauer et al. | |
| 5,869,135 A | 2/1999 | Vaeth et al. | |
| 5,925,494 A | 7/1999 | Horn | |
| 6,046,108 A | 4/2000 | Liu et al. | |
| 6,416,577 B1 | 7/2002 | Suntoloa et al. | |
| 6,426,015 B1 | 7/2002 | Xia et al. | |
| 6,455,414 B1 | 9/2002 | Hillman et al. | |
| 6,482,740 B2 | 11/2002 | Soininen et al. | |
| 6,586,330 B1 | 7/2003 | Ludviksson et al. | |
| 6,679,951 B2 | 1/2004 | Soininen et al. | |
| 6,759,325 B2 | 7/2004 | Raaijmakers et al. | |
| 6,811,448 B1 | 11/2004 | Paton | |
| 6,844,258 B1 | 1/2005 | Fair et al. | |
| 6,852,635 B2 | 2/2005 | Satta et al. | |
| 6,858,533 B2 | 2/2005 | Chu et al. | |
| 6,878,628 B2 | 4/2005 | Sophie et al. | |
| 6,887,795 B2 | 5/2005 | Soininen et al. | |
| 6,921,712 B2 | 7/2005 | Soininen et al. | |
| 6,958,174 B1 | 10/2005 | Klaus et al. | |
| 7,041,609 B2 | 5/2006 | Vaartstra | |
| 7,067,407 B2 | 6/2006 | Kostamo et al. | |
| 7,084,060 B1 | 8/2006 | Furukawa et al. | |
| 7,118,779 B2 | 10/2006 | Verghese et al. | |
| 7,220,669 B2 | 5/2007 | Hujanen et al. | |
| 7,241,677 B2 | 7/2007 | Soininen et al. | |
| 7,323,411 B1 | 1/2008 | Blosse | |
| 7,405,143 B2 | 7/2008 | Leinikka et al. | |
| 7,425,350 B2 | 9/2008 | Todd | |
| 7,476,618 B2 | 1/2009 | Kilpela et al. | |
| 7,494,927 B2 | 2/2009 | Kostamo et al. | |
| 7,595,271 B2 | 9/2009 | White | |
| 7,611,751 B2 | 11/2009 | Elers | |
| 7,695,567 B2 | 4/2010 | Fu | |
| 7,754,621 B2 | 7/2010 | Putkonen | |
| 7,790,631 B2 | 9/2010 | Sharma et al. | |
| 7,799,135 B2 | 9/2010 | Verghese et al. | |
| 7,910,177 B2 | 3/2011 | Li | |
| 7,914,847 B2 | 3/2011 | Verghese et al. | |
| 7,927,942 B2 | 4/2011 | Raaijmakers | |
| 7,951,637 B2 | 5/2011 | Weidman et al. | |
| 7,955,979 B2 | 6/2011 | Kostamo et al. | |
| 7,964,505 B2 | 6/2011 | Khandelwal et al. | |
| 8,293,597 B2 | 10/2012 | Raaijmakers | |
| 8,293,658 B2 | 10/2012 | Shero et al. | |
| 8,425,739 B1 | 4/2013 | Wieting | |
| 8,466,052 B2 | 6/2013 | Baek et al. | |
| 8,536,058 B2 | 9/2013 | Kostamo et al. | |
| 8,623,468 B2 | 1/2014 | Lin et al. | |
| 8,778,815 B2 | 7/2014 | Yamaguchi et al. | |
| 8,890,264 B2 | 11/2014 | Dewey et al. | |
| 8,956,971 B2 | 2/2015 | Haukka et al. | |
| 8,962,482 B2 | 2/2015 | Albertson et al. | |
| 8,980,418 B2 | 3/2015 | Darling et al. | |
| 8,993,404 B2 | 3/2015 | Kobrinsky et al. | |
| 9,067,958 B2 | 6/2015 | Romero | |
| 9,112,003 B2 | 8/2015 | Haukka et al. | |
| 9,129,897 B2 | 9/2015 | Pore et al. | |
| 9,136,110 B2 | 9/2015 | Rathsack | |
| 9,159,558 B2 | 10/2015 | Cheng et al. | |
| 9,236,292 B2 | 1/2016 | Romero et al. | |
| 9,257,303 B2 | 2/2016 | Haukka et al. | |
| 9,349,687 B1 | 5/2016 | Gates et al. | |
| 9,455,138 B1 | 9/2016 | Fukazawa | |
| 9,490,145 B2 | 11/2016 | Niskanen et al. | |
| 9,502,289 B2 * | 11/2016 | Haukka | H01L 21/02068 |
| 9,552,979 B2 | 1/2017 | Knaepen et al. | |
| 9,679,808 B2 * | 6/2017 | Haukka | C23C 16/0227 |
| 9,786,491 B2 | 10/2017 | Suzuki et al. | |
| 9,786,492 B2 | 10/2017 | Suzuki et al. | |
| 9,803,277 B1 | 10/2017 | Longrie et al. | |
| 9,805,974 B1 | 10/2017 | Chen et al. | |
| 9,816,180 B2 | 11/2017 | Haukka et al. | |
| 9,895,715 B2 | 2/2018 | Haukka et al. | |
| 9,911,595 B1 | 3/2018 | Smith et al. | |
| 10,014,212 B2 * | 7/2018 | Chen | H01L 21/76868 |
| 10,041,166 B2 | 8/2018 | Longrie et al. | |
| 10,047,435 B2 | 8/2018 | Haukka et al. | |
| 10,049,924 B2 | 8/2018 | Haukka et al. | |
| 10,115,603 B2 | 10/2018 | Niskanen et al. | |
| 10,157,786 B2 | 12/2018 | Haukka et al. | |
| 10,186,420 B2 | 1/2019 | Fukazawa | |
| 10,204,782 B2 | 2/2019 | Maes et al. | |
| 10,343,186 B2 * | 7/2019 | Pore | B05D 1/36 |
| 10,373,820 B2 * | 8/2019 | Tois | H01L 21/3065 |
| 10,428,421 B2 * | 10/2019 | Haukka | C23C 16/04 |

(56) References Cited

U.S. PATENT DOCUMENTS

| | | | |
|---|---|---|---|
| 10,443,123 B2 | 10/2019 | Haukka et al. | |
| 10,453,701 B2* | 10/2019 | Tois | H01L 21/31138 |
| 10,480,064 B2 | 11/2019 | Longrie et al. | |
| 10,546,741 B2* | 1/2020 | Murakami | H01L 21/0228 |
| 10,695,794 B2* | 6/2020 | Pore | C23C 16/45525 |
| 10,814,349 B2 | 10/2020 | Pore et al. | |
| 10,847,363 B2 | 11/2020 | Tapily | |
| 10,854,460 B2 | 12/2020 | Tois et al. | |
| 10,900,120 B2* | 1/2021 | Sharma | C23C 16/042 |
| 10,923,361 B2 | 2/2021 | Tois et al. | |
| 2001/0019803 A1 | 9/2001 | Mirkanimi | |
| 2001/0021414 A1 | 9/2001 | Morishima et al. | |
| 2001/0025205 A1 | 9/2001 | Chern et al. | |
| 2002/0027261 A1 | 3/2002 | Blesser et al. | |
| 2002/0047144 A1 | 4/2002 | Nguyen et al. | |
| 2002/0068458 A1 | 6/2002 | Chiang et al. | |
| 2002/0090777 A1 | 7/2002 | Forbes et al. | |
| 2002/0107316 A1 | 8/2002 | Bice et al. | |
| 2003/0027431 A1 | 2/2003 | Sneh et al. | |
| 2003/0066487 A1 | 4/2003 | Suzuki | |
| 2003/0143839 A1 | 7/2003 | Raaijmakers et al. | |
| 2003/0176559 A1 | 9/2003 | Bice et al. | |
| 2003/0181035 A1 | 9/2003 | Yoon et al. | |
| 2003/0185997 A1 | 10/2003 | Hsieh | |
| 2003/0192090 P1 | 10/2003 | Meilland | |
| 2003/0193090 A1 | 10/2003 | Otani et al. | |
| 2004/0092073 A1 | 5/2004 | Cabral | |
| 2004/0129558 A1 | 7/2004 | Liu et al. | |
| 2004/0219746 A1 | 7/2004 | Vaartstra et al. | |
| 2005/0012975 A1 | 1/2005 | George et al. | |
| 2005/0136604 A1 | 6/2005 | Al-Bayati et al. | |
| 2005/0160575 A1* | 7/2005 | Gambino | H01L 23/3192 29/602.1 |
| 2005/0223989 A1 | 10/2005 | Lee et al. | |
| 2006/0019493 A1 | 1/2006 | Li | |
| 2006/0047132 A1 | 3/2006 | Shenai-Khatkhate et al. | |
| 2006/0121271 A1 | 6/2006 | Frey et al. | |
| 2006/0121677 A1 | 6/2006 | Parekh et al. | |
| 2006/0121733 A1 | 6/2006 | Kilpela et al. | |
| 2006/0128150 A1 | 6/2006 | Gandikota et al. | |
| 2006/0141155 A1 | 6/2006 | Gordon et al. | |
| 2006/0156979 A1 | 7/2006 | Thakur et al. | |
| 2006/0176559 A1 | 8/2006 | Takatoshi et al. | |
| 2006/0199399 A1 | 9/2006 | Muscat | |
| 2006/0226409 A1 | 10/2006 | Burr et al. | |
| 2006/0292845 A1 | 12/2006 | Chiang et al. | |
| 2007/0014919 A1 | 1/2007 | Hamalainen et al. | |
| 2007/0026654 A1 | 2/2007 | Huotari et al. | |
| 2007/0063317 A1 | 3/2007 | Kim et al. | |
| 2007/0098894 A1 | 5/2007 | Verghese et al. | |
| 2007/0099422 A1 | 5/2007 | Wijekoon et al. | |
| 2007/0232082 A1 | 10/2007 | Balseanu et al. | |
| 2007/0241390 A1 | 10/2007 | Tanaka et al. | |
| 2007/0251444 A1 | 11/2007 | Gros-Jean et al. | |
| 2007/0292604 A1 | 12/2007 | Dordi et al. | |
| 2008/0066680 A1 | 3/2008 | Sherman | |
| 2008/0072819 A1 | 3/2008 | Rahtu | |
| 2008/0124932 A1 | 5/2008 | Tateishi et al. | |
| 2008/0179741 A1 | 7/2008 | Streck et al. | |
| 2008/0241575 A1 | 10/2008 | Lavoie et al. | |
| 2008/0282970 A1 | 11/2008 | Heys et al. | |
| 2009/0035949 A1 | 2/2009 | Niinisto et al. | |
| 2009/0071505 A1 | 3/2009 | Miya et al. | |
| 2009/0081385 A1 | 3/2009 | Heys et al. | |
| 2009/0203222 A1 | 8/2009 | Dussarrat et al. | |
| 2009/0269507 A1 | 10/2009 | Yu et al. | |
| 2009/0274887 A1 | 11/2009 | Millward et al. | |
| 2009/0275163 A1 | 11/2009 | Lacey et al. | |
| 2009/0311879 A1 | 12/2009 | Blasco et al. | |
| 2010/0015756 A1 | 1/2010 | Weidman et al. | |
| 2010/0102417 A1 | 4/2010 | Ganguli et al. | |
| 2010/0147396 A1 | 6/2010 | Yamagishi et al. | |
| 2010/0178468 A1 | 7/2010 | Jiang et al. | |
| 2010/0248473 A1 | 9/2010 | Ishizaka et al. | |
| 2010/0270626 A1 | 10/2010 | Raisanen | |
| 2010/0297474 A1 | 11/2010 | Dameron | |
| 2010/0314765 A1 | 12/2010 | Liang et al. | |
| 2011/0039420 A1 | 2/2011 | Nakao | |
| 2011/0053800 A1 | 3/2011 | Jung et al. | |
| 2011/0120542 A1 | 5/2011 | Levy | |
| 2011/0124192 A1 | 5/2011 | Ganguli et al. | |
| 2011/0146568 A1 | 6/2011 | Haukka et al. | |
| 2011/0146703 A1 | 6/2011 | Chen et al. | |
| 2011/0198756 A1 | 8/2011 | Thenappan et al. | |
| 2011/0221061 A1 | 9/2011 | Prakash | |
| 2011/0244680 A1 | 10/2011 | Tohnoe et al. | |
| 2011/0311726 A1 | 12/2011 | Liu et al. | |
| 2012/0032311 A1 | 2/2012 | Gates | |
| 2012/0046421 A1 | 2/2012 | Darling et al. | |
| 2012/0052681 A1 | 3/2012 | Marsh | |
| 2012/0088369 A1 | 4/2012 | Weidman et al. | |
| 2012/0189868 A1 | 7/2012 | Borovik et al. | |
| 2012/0219824 A1 | 8/2012 | Prolier et al. | |
| 2012/0241411 A1 | 9/2012 | Darling et al. | |
| 2012/0264291 A1 | 10/2012 | Ganguli et al. | |
| 2012/0269970 A1 | 10/2012 | Ido et al. | |
| 2013/0005133 A1 | 1/2013 | Lee et al. | |
| 2013/0078793 A1 | 3/2013 | Sun et al. | |
| 2013/0089983 A1 | 4/2013 | Sugita et al. | |
| 2013/0095664 A1 | 4/2013 | Matero et al. | |
| 2013/0115763 A1 | 5/2013 | Takamure et al. | |
| 2013/0115768 A1 | 5/2013 | Pore et al. | |
| 2013/0126815 A1 | 5/2013 | Kim et al. | |
| 2013/0143401 A1 | 6/2013 | Yu et al. | |
| 2013/0146881 A1 | 6/2013 | Yamazaki et al. | |
| 2013/0157409 A1 | 6/2013 | Vaidya et al. | |
| 2013/0189837 A1* | 7/2013 | Haukka | C23C 16/0227 438/655 |
| 2013/0196502 A1 | 8/2013 | Haukka et al. | |
| 2013/0203267 A1 | 8/2013 | Pomarede et al. | |
| 2013/0280919 A1 | 10/2013 | Yuasa et al. | |
| 2013/0284094 A1 | 10/2013 | Pavol et al. | |
| 2013/0309457 A1 | 11/2013 | Rathsack et al. | |
| 2013/0316080 A1 | 11/2013 | Yamaguchi et al. | |
| 2013/0323930 A1 | 12/2013 | Chattopadhyay et al. | |
| 2014/0001572 A1 | 1/2014 | Bohr et al. | |
| 2014/0024200 A1 | 1/2014 | Kato et al. | |
| 2014/0091308 A1 | 4/2014 | Dasgupta et al. | |
| 2014/0120738 A1 | 5/2014 | Jung et al. | |
| 2014/0152383 A1 | 6/2014 | Nikonov et al. | |
| 2014/0190409 A1 | 7/2014 | Matsumoto et al. | |
| 2014/0193598 A1 | 7/2014 | Traser et al. | |
| 2014/0205766 A1 | 7/2014 | Lyon et al. | |
| 2014/0209022 A1 | 7/2014 | Inoue et al. | |
| 2014/0227461 A1 | 8/2014 | Darwish et al. | |
| 2014/0252487 A1 | 9/2014 | Stephens et al. | |
| 2014/0272194 A1 | 9/2014 | Xiao et al. | |
| 2014/0273290 A1 | 9/2014 | Somervell | |
| 2014/0273477 A1 | 9/2014 | Niskanen et al. | |
| 2014/0273514 A1 | 9/2014 | Somervell et al. | |
| 2014/0273523 A1 | 9/2014 | Rathsack | |
| 2014/0273527 A1 | 9/2014 | Niskanen et al. | |
| 2015/0004317 A1 | 1/2015 | Dussarrat et al. | |
| 2015/0004319 A1 | 1/2015 | Mizue | |
| 2015/0004806 A1 | 1/2015 | Ndiege et al. | |
| 2015/0011032 A1 | 1/2015 | Kunimatsu et al. | |
| 2015/0011093 A1 | 1/2015 | Singh et al. | |
| 2015/0037972 A1 | 2/2015 | Danek et al. | |
| 2015/0064931 A1 | 3/2015 | Kumagi et al. | |
| 2015/0083415 A1 | 3/2015 | Monroe et al. | |
| 2015/0087158 A1 | 3/2015 | Sugita et al. | |
| 2015/0093890 A1 | 4/2015 | Blackwell et al. | |
| 2015/0097292 A1 | 4/2015 | He et al. | |
| 2015/0118863 A1 | 4/2015 | Rathod et al. | |
| 2015/0162214 A1 | 6/2015 | Thompson et al. | |
| 2015/0170961 A1* | 6/2015 | Romero | H01L 21/76838 438/641 |
| 2015/0179798 A1 | 6/2015 | Clendenning et al. | |
| 2015/0184296 A1 | 7/2015 | Xu et al. | |
| 2015/0217330 A1* | 8/2015 | Haukka | C23C 16/28 427/343 |
| 2015/0240121 A1 | 8/2015 | Sugita et al. | |
| 2015/0275355 A1 | 10/2015 | Mallikarjunan et al. | |

(56) References Cited

U.S. PATENT DOCUMENTS

| | | | |
|---|---|---|---|
| 2015/0299848 A1* | 10/2015 | Haukka | C23C 16/30 |
| | | | 427/123 |
| 2015/0371866 A1 | 12/2015 | Chen et al. | |
| 2015/0372205 A1 | 12/2015 | Kimura et al. | |
| 2015/0376211 A1 | 12/2015 | Girard et al. | |
| 2016/0075884 A1 | 3/2016 | Chen | |
| 2016/0079524 A1 | 3/2016 | Do et al. | |
| 2016/0086850 A1* | 3/2016 | Romero | H01L 21/76838 |
| | | | 438/675 |
| 2016/0152640 A1 | 6/2016 | Kuchenbeiser et al. | |
| 2016/0172189 A1 | 6/2016 | Tapily | |
| 2016/0186004 A1 | 6/2016 | Hustad et al. | |
| 2016/0190060 A1 | 6/2016 | Bristol et al. | |
| 2016/0222504 A1* | 8/2016 | Haukka | C23C 16/402 |
| 2016/0247695 A1 | 8/2016 | Niskanen et al. | |
| 2016/0276208 A1* | 9/2016 | Haukka | C23C 16/0227 |
| 2016/0284568 A1* | 9/2016 | Morris | H01L 21/568 |
| 2016/0293384 A1 | 10/2016 | Yan et al. | |
| 2016/0293398 A1 | 10/2016 | Danek et al. | |
| 2016/0315191 A1 | 10/2016 | Tsai et al. | |
| 2016/0346838 A1 | 12/2016 | Fujita et al. | |
| 2016/0365280 A1 | 12/2016 | Brink et al. | |
| 2017/0037513 A1 | 2/2017 | Haukka et al. | |
| 2017/0040164 A1 | 2/2017 | Wang et al. | |
| 2017/0058401 A1 | 3/2017 | Blackwell et al. | |
| 2017/0069527 A1 | 3/2017 | Haukka et al. | |
| 2017/0100742 A1* | 4/2017 | Pore | C23C 16/45525 |
| 2017/0100743 A1 | 4/2017 | Pore et al. | |
| 2017/0107413 A1 | 4/2017 | Wang et al. | |
| 2017/0154806 A1 | 6/2017 | Wang et al. | |
| 2017/0298503 A1* | 10/2017 | Maes | C23C 16/402 |
| 2017/0301542 A1 | 10/2017 | Maes et al. | |
| 2017/0323776 A1 | 11/2017 | Farm et al. | |
| 2017/0332179 A1 | 11/2017 | Bright et al. | |
| 2017/0352533 A1* | 12/2017 | Tois | C23C 16/04 |
| 2017/0352550 A1 | 12/2017 | Tois et al. | |
| 2018/0010247 A1* | 1/2018 | Niskanen | C23C 16/45553 |
| 2018/0040708 A1 | 2/2018 | Narayanan et al. | |
| 2018/0073136 A1* | 3/2018 | Haukka | C23C 16/402 |
| 2018/0080121 A1 | 3/2018 | Longrie et al. | |
| 2018/0151345 A1* | 5/2018 | Haukka | C23C 16/45525 |
| 2018/0151355 A1 | 5/2018 | Fukazawa | |
| 2018/0182618 A1 | 6/2018 | Blanquart et al. | |
| 2018/0222933 A1* | 8/2018 | Romero | C07F 1/02 |
| 2018/0233350 A1 | 8/2018 | Tois et al. | |
| 2018/0243787 A1* | 8/2018 | Haukka | C23C 16/403 |
| 2019/0017170 A1* | 1/2019 | Sharma | H01L 21/02189 |
| 2019/0057858 A1 | 2/2019 | Hausmann et al. | |
| 2019/0074441 A1 | 3/2019 | Kikuchi et al. | |
| 2019/0100837 A1* | 4/2019 | Haukka | C23C 16/04 |
| 2019/0155159 A1 | 5/2019 | Knaepen et al. | |
| 2019/0283077 A1* | 9/2019 | Pore | C23C 16/45523 |
| 2019/0333761 A1* | 10/2019 | Tois | C23C 16/45553 |
| 2019/0341245 A1* | 11/2019 | Tois | H01L 21/02219 |
| 2020/0051829 A1* | 2/2020 | Tois | C23C 16/56 |
| 2020/0105515 A1* | 4/2020 | Maes | H01L 21/02669 |
| 2020/0324316 A1 | 10/2020 | Pore et al. | |
| 2021/0001373 A1 | 1/2021 | Pore et al. | |

FOREIGN PATENT DOCUMENTS

| | | |
|---|---|---|
| EP | 1340269 | 2/2009 |
| JP | H08/222569 | 8/1996 |
| JP | 2001127068 | 5/2001 |
| JP | 2008311603 | 12/2008 |
| JP | 4333900 | 9/2009 |
| JP | 2009/231783 | 10/2009 |
| JP | 2011-187583 | 9/2011 |
| JP | 2011/222779 | 11/2011 |
| JP | 2013/229622 | 11/2013 |
| JP | 2013/247287 | 12/2013 |
| JP | 2014-93331 | 5/2014 |
| JP | 2014/150144 | 8/2014 |
| JP | 2015/099881 | 5/2015 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0869326 | 11/2008 |
| KR | 10-0920033 | 10/2009 |
| KR | 10-2012-0120902 | 11/2012 |
| TW | 175767 | 8/2003 |
| TW | 2005/39321 A | 12/2005 |
| TW | 2010/05827 A | 2/2010 |
| TW | 2014/39365 A | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 15/047345 | 4/2015 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 17/184357 | 10/2017 |
| WO | WO 17/184358 | 10/2017 |
| WO | WO 2017/184357 | 10/2017 |
| WO | WO 2017/184358 | 10/2017 |
| WO | WO 2018/204709 | 11/2018 |
| WO | WO 2018/213018 * 11/2018 | C23C 16/30 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Bernal-Ramos, et al., "Atomic Layer Deposition of Cobalt Silicide Thin Films Studied by in Situ Infrared Spectroscopy", Chem. Mater. 2015, 27, pp. 4943-4949.

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H20". J. Phys. Chem. C, 2009, 113, 1939-1946.

Burton, B.B., et al., "Si02 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al. "Nucleation and growth during tungsten atomic layer deposition on Si02 surfaces", Thin Solid Films, vol. 386, 2001 pp. 41-52.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly(methyl methacrylate) Films as Mask Layers, J. Phys. Chem. C, 2008, 112, pp. 15791-15795. (Year: 2008).

(56) References Cited

OTHER PUBLICATIONS

Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
George, Steven M., "Atomic Layer Deposition: An Overview", Chem. Rev. 2010, 110, pp. 111-113.
Ghosal et al., Controlling Atomic Layer Deposition of Ti02 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
Lee et al., Area-Selective Atomic Layer Deposition Using Self-Assembled Monolayer and Scanning Probe Lithography, Journal of the Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for Ulsi Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Maluf et al., "Selective tungsten filling of sub-0.25pm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
File History of U.S. Appl. No. 15/177,195, filed Jun. 8, 2016.
File History of U.S. Appl. No. 13/702,992, filed Mar. 26, 2013.
File History of U.S. Appl. No. 13/708,863, filed Dec. 7, 2012.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Sundberg, et al.; Organic and Inorganic-Organic Thin Film Structures by Molecular Layer Deposition: A Review; Beilstein J. Nanotechnol; 2014, 5, pp. 1104-1136.
Toirov, et al.; Thermal Cyclodehydration of Polyamic Acid Initiated by UV-Irradiation; Iranian Polymer Journal; vol. 5, No. 1; pp. 16-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.
Vallat et al., Selective deposition of Ta2O5 by adding plasma etching super-cycles in plasma enhanced atomic layer deposition steps, Journal of Vacuum Science & Technology A, vol. 35, No. 1, pp. 01 B104-1-01 B104-7, Jan. 2017.
Vervuurt et al., "Area-selective atomic layer deposition of platinum using photosensitive polyimide", Nanotechnology 27, 2016, in 6 pages.
Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.
Aaltonen et al., "Atomic Layer Deposition of Iridium Thin Films", Journal of the Electrochemical Society, 151 (8) G489-G492 (2004).
Benzotriazole, Wikipedia via https://en.wikipedia.org/wiki/Benzotriazole; pp. 1-5, no date available.
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
File History of U.S. Appl. No. 15/877,632, filed Jan. 23, 2018.
File History of U.S. Appl. No. 14/687,833, filed Apr. 15, 2015.
File History of U.S. Appl. No. 16/100,855, filed Aug. 10, 2018.
File History of U.S. Appl. No. 14/628,799, filed Feb. 23, 2015.
File History of U.S. Appl. No. 15/331,366, filed Oct. 21, 2016.

(56) References Cited

OTHER PUBLICATIONS

File History of U.S. Appl. No. 16/143,888, filed Sep. 27, 2018.
File History of U.S. Appl. No. 14/817,161, filed Aug. 3, 2015.
File History of U.S. Appl. No. 14/819,274, filed Aug. 5, 2015.
File History of U.S. Appl. No. 15/432,263, filed Feb. 14, 2017.
File History of U.S. Appl. No. 16/158,780, filed Oct. 12, 2018.
File History of U.S. Appl. No. 15/221,453, filed Jul. 27, 2016.
File History of U.S. Appl. No. 15/795,768, filed Oct. 27, 2017.
File History of U.S. Appl. No. 16/040,844, filed Jul. 20, 2018.
File History of U.S. Appl. No. 15/581,726, filed Apr. 28, 2017.
File History of U.S. Appl. No. 15/364,024, filed Nov. 29, 2016.
File History of U.S. Appl. No. 15/356,306, filed Nov. 18, 2016.
File History of U.S. Appl. No. 16/213,479, filed Dec. 7, 2018.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dielectrics: Limits and Advantages of Alkanethiol Blocking Agents on Metal-Dielectric Patterns", ACS Appl. Mater. Interfaces 2016, 8, pp. 33264-33272.
Kukli et al., "Properties of hafnium oxide films grown by atomic layer deposition from hafnium tetraiodide and oxygen", J. Appl. Phys., vol. 92, No. 10, 15 Nov. 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Ting, et al., "Selective Electroless Metal Deposition for Integrated Circuit Fabrication", J. Electrochem. Soc., vol. 136, No. 2, Feb. 1989, pp. 456-462.
Ellinger et al., "Selective Area Spatial Atomic Layer Deposition of ZnO, $Al_2O_3$, and Aluminum-Doped ZnO Using Poly(vinyl pyrolidone)", Chem. Mater. 2014, 26, pp. 1514-1522.
Mackus, et al., The use of atomic layer deposition in advanced nanopatterning; Nanoscale (2014) 6:10941-10960.
Norrman, et al.; 6 Studies of Spin/Coated Polymer Films; Annu. Rep. Prog. Chem.; Sect. C; 2005; 101; pp. 174-201.
Schuisky, et al., Atomic Layer Deposition of Thin Films Using O2 as Oxygen Source; Langmuir (2001) 17:5508-5512.
File History of U.S. Appl. No. 16/787,672, filed Feb. 11, 2020.
File History of U.S. Appl. No. 16/773,064, filed Jan. 27, 2020.
File History of U.S. Appl. No. 16/657,307, filed Oct. 18, 2019.
File History of U.S. Appl. No. 16/594,365, filed Oct. 7, 2019.
File History of U.S. Appl. No. 16/575,112, filed Sep. 18, 2019.
File History of U.S. Appl. No. 16/676,017, filed Nov. 6, 2019.
File History of U.S. Appl. No. 16/605,475, filed Oct. 15, 2019.
File History of U.S. Appl. No. 15/971,601, filed May 4, 2018.
File History of U.S. Appl. No. 14/612,784, filed Feb. 3, 2015.
File History of U.S. Appl. No. 16/033,952, filed Jul. 12, 2018.
File History of U.S. Appl. No. 16/399,328, filed Apr. 30, 2019.
File History of U.S. Appl. No. 14/737,293, filed Jun. 11, 2015.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Cho et al., "Atomic layer deposition of Al2O3 thin films using dimethylaluminum isopropoxide and water", Journal of Vacuum Science & Technology A 21, (2003), doi: 10.1116/1.1562184, pp. 1366-1370.
File History of U.S. Appl. No. 16/588,600, filed Sep. 30, 2019.
File History of U.S. Appl. No. 16/836,151, filed Mar. 31, 2020.
Office Action dated Apr. 8, 2020 in Taiwan Application No. 105132286.
George, S.M. et al., "Surface chemistry for molecular layer deposition of organic and hybrid organic—inorganic polymers," Accounts of Chemical Research, Apr. 2009, vol. 42, No. 4, pp. 498-508.
King, Dielectric Barrier, Etch Stop, and Metal Capping Materials for State of the Art and beyond Metal Interconnects, ECS Journal of Solid State Science and Technology, vol. 4, Issue 1, pp. N3029-N3047, 2015.

\* cited by examiner

|            | Y |
|------------|---|
| PASSIVATION | X |
| DIELECTRIC | METALLIC |

FIG.3A

|            | Y |
|------------|---|
|            | X |
| DIELECTRIC | METALLIC |

FIG.3B

CA left: 112.0°
CA right: 111.9°

CA left: 116.9°
CA right: 116.9°

| ELEMENT | 100 CYCLES PI ON SAM | 100 CYCLES PI ON REFERENCE Cu | 100 CYCLES PI ON NATIVE ox | 250 CYCLES PI ON SAM | 250 CYCLES PI ON REFERENCE Cu | 250 CYCLES PI ON NATIVE ox |
|---|---|---|---|---|---|---|
| Si | 0.61 | 0.25 | 16.58 | 0.70 | 0.3 | 7.34 |
| S | 5.83 | 0.46 | 4.34 | 6.16 | 0.12 | 1.91 |
| C | 58.62 | 69.76 | 53.75 | 54.82 | 70.04 | 64.92 |
| N | 0.74 | 8.68 | 7.06 | 2.62 | 9.10 | 8.41 |
| O | 24.91 | 18.44 | 18.21 | 24.43 | 18.24 | 17.38 |
| Cu | 9.29 | 2.41 | 0.06 | 11.28 | 2.20 | 0.04 |
| COMMENTS | 5.8at-%S DETECTED, LOW N | PI GROWS ON Cu | PI GROWS ON NATIVE OXIDE | 6.2at-%S DETECTED, LOW N | PI GROWS ON Cu | PI GROWS ON NATIVE OXIDE |

*FIG.13*

RECESSED STRUCTURE

OVERLAP
DIELECTRIC-METAL

SELECTIVE PASSIVATION AND SELECTIVE DEPOSITION

PRIORITY APPLICATIONS

The present application claims priority to U.S. Provisional Application Nos. 62/458,952, filed Feb. 14, 2017; 62/481,524, filed Apr. 4, 2017; and 62/591,724, filed Nov. 28, 2017.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure relates generally to selective deposition of materials on a first surface of a substrate relative to a second surface of a different material composition.

Description of the Related Art

The shrinking device dimensions in semiconductor manufacturing call for new innovative processing approaches. Conventionally, patterning in semiconductor processing involves subtractive processes, in which blanket layers are deposited, masked by photolithographic techniques, and etched through openings in the mask. Additive patterning is also known, in which masking steps precede deposition of the materials of interest, such as patterning using lift-off techniques or damascene processing. In most cases, expensive multi-step lithographic techniques are applied for patterning.

Patterning could be simplified by selective deposition, which has gained increasing interest among semiconductor manufacturers. Selective deposition would be highly beneficial in various ways. Significantly, it could allow a decrease in lithography steps, reducing the cost of processing. Selective deposition could also enable enhanced scaling in narrow structures, such as by making bottom up fill possible. Electrochemical deposition is one form of selective deposition, as metals can be formed selectively on conductive elements. Chemical vapor deposition (CVD) and atomic layer deposition (ALD) are surface-sensitive techniques vapor deposition techniques and therefore have been investigated as good candidates for selective deposition. Selective ALD was suggested, for example, in U.S. Pat. No. 6,391,785.

One of the challenges with selective deposition is selectivity for deposition processes are often not high enough to accomplish the goals of selectivity. Surface pre-treatment is sometimes available to either inhibit or encourage deposition on one or both of the surfaces, but often such treatments themselves call for lithography to have the treatments applied or remain only on the surface to be treated.

Accordingly, a need exists for more practical processes for accomplishing selective deposition.

SUMMARY OF THE INVENTION

In one aspect a method is provided for selective deposition on a second surface of a part relative to a first surface of the part, where the first and second surfaces have different compositions. The method includes selectively forming a passivation layer from vapor phase reactants on the first surface while leaving the second surface without the passivation layer. The method further includes selectively depositing a layer of interest from vapor phase reactants on the second surface relative to the passivation layer.

In some embodiments, the method of selectively forming the passivation layer further includes etching any polymer from the second surface while leaving some polymer on the first surface. In some embodiments, the method includes an edge of the layer of interest aligned with a boundary between the first and second surfaces. In some embodiments, the method includes the layer of interest overlapping with the first surface. In some embodiments, the method includes the first surface elevated above the second surface. In some embodiments, after removing the passivation layer, the method includes a gap exposing the second surface exists between an edge of the layer of interest and a boundary between the first and second surfaces. In some embodiments, the method further includes selectively etching the second surface in the gap to form a cavity. In some embodiments, the method further includes depositing a cavity filling material in a manner that leaves an air-gap within the cavity.

In another aspect an apparatus is provided for organic layer deposition. The apparatus includes a first vessel configured for vaporizing a first organic reactant to form a reactant vapor and a second vessel configured for vaporizing a second organic reactant to form a reactant vapor. The apparatus further includes a plasma source communicating with hydrogen and inert gas sources and a reaction space configured to accommodate a substrate and in selective fluid communication with the first and second vessels. A control system is configured to deposit an organic layer on the substrate by communicating vapors from the first and second vessels, and to etch back the organic layer by operating the plasma source.

In another aspect an integrated circuit metallization structure is provided. The structure includes a metallic feature at least partially embedded within the low k material, a low k material, and a dielectric etch stop material. The structure further includes an air-gap positioned within the low k material and positioned adjacent to a lateral side of the metallic feature.

In another aspect an integrated circuit metallization structure is provided. The structure includes a low k material and a metallic feature at least partially embedded within the low k material. The structure further includes a dielectric etch stop material overlying the low k material, wherein the dielectric etch stop material comprises an edge profile characteristic of a selectively deposited material.

BRIEF DESCRIPTION OF THE DRAWINGS

FIG. 3A is a schematic cross section of the substrate of FIG. 2D after selective deposition of a further material over the second surface, in accordance with a third embodiment.

FIG. 3B is a schematic cross section of the substrate of FIG. 3A after removal of the passivation material from the first surface.

FIG. 13 is a table illustrating material composition for various material surfaces after exposure to 100 or 250 cycles of a polymer ALD process.

DETAILED DESCRIPTION OF EMBODIMENTS

Figure 1A:
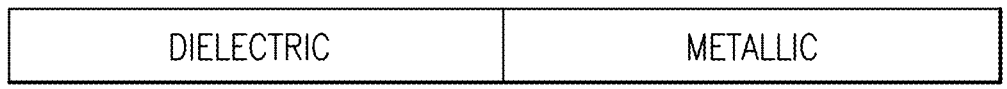
FIG. 1A is a schematic cross section of a portion of a substrate having first and second surfaces of different compositions, in accordance with a first embodiment.

Methods and apparatus are disclosed for selectively depositing material over a second surface relative to a first surface, where the first and second surfaces have material differences. For example, one of the surfaces can include a metallic material and the other surface can include an inorganic dielectric material. In embodiments described herein, an organic passivation layer is deposited selectively on the first surface relative to the second surface. In some embodiments, the first surface is metallic and the second surface is dielectric; in other embodiments the first surface is dielectric and second surface is metallic. Subsequently, a layer of interest is selectively deposited on the second surface relative to the organic passivation layer. Further layers can be selectively deposited on the layer of interest, over second surface, relative to the organic passivation layer.

In one embodiment, the first surface comprises a metallic surface, such as an elemental metal or metal alloy, while the second surface comprises an inorganic dielectric surface, such as low-k material. Examples of low-k material include silicon oxide based materials, including grown or deposited silicon dioxide, doped and/or porous oxides, native oxide on silicon, etc. A polymer passivation layer is selectively deposited on the metallic surface relative to the inorganic dielectric surface. Subsequently, a layer of interest is selectively deposited on the inorganic dielectric surface. The layer of interest may include a metal element. Examples of the layer of interest include dielectrics, such as zirconium oxide (e.g., $ZrO_2$), hafnium oxide (e.g., $HfO_2$) and titanium oxide (e.g., $TiO_2$). Processes are provided for selectively depositing such materials on silicon-oxide based surfaces relative to polymer surfaces.

In a second embodiment, the first surface comprises an inorganic dielectric surface, such as low-k material, while the second surface comprises a metallic surface, such as an elemental metal or metal alloy. Examples of low-k material include silicon oxide based materials, including grown or deposited silicon dioxide, doped and/or porous oxides, native oxide on silicon, etc. A polymer passivation layer is selectively deposited on the inorganic dielectric surface relative to metallic surface. Prior to depositing the polymer passivation layer, the metallic surface can be provided with a passivation blocking layer, such as a self-assembled monolayer (SAM). The passivation blocking layer facilitates selectivity for the polymer deposition on inorganic dielectric surface, and can be removed thereafter to permit selective deposition of a layer of interest on the metallic surface relative to the polymer passivation layer. The layer of interest may include a metal element. Examples of the layer of interest include metal layers (e.g., see U.S. Pat. No. 8,956,971, issued Feb. 17, 2015 and U.S. Pat. No. 9,112,003, issued Aug. 18, 2015) and metal oxide layers (e.g., zirconium oxide, hafnium oxide, titanium oxide). Processes are provided for selectively depositing such materials on metallic surfaces relative to polymer surfaces.

In a third embodiment, the process of the second embodiment is conducted to provide a layer of interest selectively over a metallic surface relative to a polymer-passivated inorganic dielectric surface. Thereafter, a further layer of interest is selectively deposited over the layer of interest while the polymer remains passivating the inorganic dielectric surface. For example, the layer of interest may comprise a metal layer while the further layer of interest comprises a metal oxide layer (e.g., zirconium oxide, hafnium oxide, titanium oxide). Processes are provided for selectively depositing such materials on metallic surfaces relative to polymer surfaces.

The polymer passivation layer may be removed from the first surface following selective deposition of the layer(s) of interest over the second surface. For example, oxidation processes may selectively remove polymer materials. Conditions are chosen to avoid damage to surrounding materials on the substrate.

Embodiments are also provided for controlling the edge profiles and edge positions for selectively deposited layers relative to other features on the substrate, such as the boundaries between underlying metallic and dielectric surfaces. Accordingly, control is provided over relative positioning of selective layer edges without the need for expensive lithographic patterning. Examples illustrate applications for such control, including examples in which the selective layer overlaps the material on which deposition is minimized; examples in which the selective layer is formed with a gap spacing the layer from the material on which deposition is minimized; and examples in which the edge of the selective layer aligns with the boundary between the two disparate underlying materials.

Substrate Surfaces

According to some aspects of the present disclosure, selective deposition can be used to deposit films of interest on a second surface preferentially relative to a first surface. The two surfaces can have different material properties that permit selective formation of an organic material thereon, such as selective deposition of a polymer layer on the first surface relative to the second surface, which in turn permits subsequent selective deposition of a layer of interest on the second surface relative to the organic-passivated first layer.

For example, in embodiments described herein, one of the surfaces can be a conductive (e.g., metal or metallic) surface of a substrate, while the other surface can be a non-conductive (e.g., inorganic dielectric) surface of the substrate. In some embodiments, the non-conductive surface comprises —OH groups, such as a silicon oxide-based surface (e.g., low-k materials, including grown and deposited silicon-oxide materials and native oxide over silicon). In some embodiments the non-conductive surface may additionally comprise —H terminations, such as an HF dipped Si or HF dipped Ge surface. In such embodiments, the surface of interest will be considered to comprise both the —H terminations and the material beneath the —H terminations For any of the examples noted above, the material differences between the two surfaces are such that vapor deposition methods can selectively deposit the organic passivation layer on the first surface relative to the second surface. In some embodiments, cyclical vapor deposition is used, for example, cyclical CVD or atomic layer deposition (ALD) processes are used. In some embodiments, selectivity for the organic passivation layer can be achieved without passivation/blocking agents on the surface to receive less of the organic layer; and/or without catalytic agents on the surface to receive more of the organic layer. For example, in embodiments where the first surface is metallic and the second surface is dielectric, polymers can be selectively deposited directly on metallic surfaces relative to inorganic dielectric surfaces. In other embodiments, where the first surface is dielectric and the second surface is metallic, the second surface is first treated to inhibit polymer deposition thereover. For example, a passivation blocking self-assembled monolayer (SAM) can be first formed over a metallic surface relative, facilitating selective deposition of a polymer passivation layer on a dielectric surface, such as an inorganic dielectric surface, relative to a SAM-covered second metallic surface. After selective deposition of the organic passivation is completed, further selective deposition of materials of interest, such as metal oxide or metal layers, can be conducted on the non-passivated second surface relative to the passivated first surface.

For embodiments in which one surface comprises a metal whereas the other surface does not, unless otherwise indicated, if a surface is referred to as a metal surface herein, it may be a metal surface or a metallic surface. In some embodiments, the metal or metallic surface may comprise metal, metal oxides, and/or mixtures thereof. In some embodiments, the metal or metallic surface may comprise surface oxidation. In some embodiments, the metal or metallic material of the metal or metallic surface is electrically conductive with or without surface oxidation. In some embodiments, metal or a metallic surface comprises one or more transition metals. In some embodiments, the metal or metallic surface comprises one or more of Al, Cu, Co, Ni, W, Nb, Fe, or Mo. In some embodiments, a metallic surface comprises titanium nitride. In some embodiments, the metal or metallic surface comprises one or more noble metals, such as Ru. In some embodiments, the metal or metallic surface comprises a conductive metal oxide, nitride, carbide, boride, or combination thereof. For example, the metal or metallic surface may comprise one or more of $RuO_x$, $NbC_x$, $NbB_x$, $NiO_x$, $CoO_x$, $NbO_x$, $MoO_x$, $WO_x$, $WNC_x$, TaN, or TiN.

In some embodiments, a metal or metallic surface comprises cobalt (Co), copper (Cu), tungsten (W) or molybdenum (Mo). In some embodiments, the metal or metallic surface may be any surface that can accept or coordinate with the first or second precursor utilized in a selective deposition process of either the organic passivation layer or the layer of interest, as described herein, depending upon the embodiment.

In some embodiments, an organic passivation material is selectively deposited on a metal oxide surface relative to other surfaces. A metal oxide surface may be, for example a $WO_x$, $TiO_x$, surface. In some embodiments, a metal oxide surface is an oxidized surface of a metallic material. In some embodiments, a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments, a metal oxide surface is a native oxide formed on a metallic material.

In some embodiments, the second surface may comprise a metal surface including a passivation block layer thereover. That is, in some embodiments, the second surface may comprise a metal surface comprising a material that inhibits deposition of the passivation layer thereover, for example a self-assembled monolayer (SAM).

In some embodiments, an organic passivation material is selectively deposited on a first metal oxide surface, which is an oxidized surface of metallic material, relative to a second dielectric surface In some embodiments, one of the first and second surfaces is a metal or metallic surface of a substrate and the other surface is a dielectric surface of the substrate. The term dielectric is used in the description herein for the sake of simplicity in distinguishing from the other surface, namely the metal or metallic surface. It will be understood by the skilled artisan that not all non-conducting surfaces are dielectric surfaces, and conversely not all metallic surfaces are conducting. For example, the metal or metallic surface may comprise an oxidized metal surface that is electrically non-conducting or has a very high resistivity. Selective deposition processes taught herein can deposit on such non-conductive metallic surfaces with minimal deposition on passivated dielectric surfaces and similarly selective deposition processes can deposit on dielectric surfaces with minimal deposition on passivated non-conductive metallic surfaces.

In some embodiments, the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments the substrate surfaces may be exposed to plasma, radicals, excited species, and/or atomic species prior to or at the beginning of the selective passivation layer deposition process. In some embodiments, the substrate surface may be exposed to hydrogen plasma, radicals, or atomic species prior to or at the beginning of the selective passivation layer deposition process. In some embodiments, a pretreatment or cleaning process may be carried out in the same reaction chamber as a selective deposition process, however in some embodiments a pretreatment or cleaning process may be carried out in a separate reaction chamber.

Selectivity

The skilled artisan will appreciate that selective deposition can be fully selective or partially selective. A partially selective process can result in fully selective layer by a post-deposition etch that removes all of the deposited material from over surface B without removing all of the deposited material from over surface A. Because a simple etch back process can leave a fully selective structure without the need for expensive masking processes, the selective deposition need not be fully selective in order to obtain the desired benefits.

Selectivity of deposition on surface A relative to surface B can be given as a percentage calculated by [(deposition on surface A)–(deposition on surface B)]/(deposition on the surface A). Deposition can be measured in any of a variety of ways. For example, deposition may be given as the measured thickness of the deposited material, or may be given as the measured amount of material deposited. In embodiments described herein, selective deposition of an organic passivation layer can be conducted on a first surface (A) relative to a second surface (B). Subsequently, a layer of interest is selectively deposited on the second surface (A) relative to the organic passivation layer (B) over the first surface.

In some embodiments, selectivity for the selective deposition of the passivation layer on the first surface (relative to the second surface) and/or selectivity of the layer of interest on the second surface (relative to the passivation layer on the first surface) is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity for the organic passivation layer deposition can change over the duration or thickness of a deposition. Surprisingly, selectivity has been found to increase with the duration of the deposition for the vapor phase polymer layer depositions described herein. In contrast, typical selective deposition based on differential nucleation on different surfaces tends to become less selective with greater duration or thickness of a deposition.

In some embodiments, deposition only occurs on the first surface and does not occur on the second surface. In some embodiments, deposition on surface A of the substrate relative to surface B of the substrate is at least about 80% selective, which may be selective enough for some particular applications. In some embodiments, the deposition on the surface A of the substrate relative to surface B of the substrate is at least about 50% selective, which may be selective enough for some particular applications. In some embodiments the deposition on surface A of the substrate relative to the surface B of the substrate is at least about 10% selective, which may be selective enough for some particular applications. The skilled artisan will appreciate that a partially selective process can result in fully selective structure layer by a post-deposition etch that removes all of the deposited material from over surface B without removing all of the deposited material from over surface A. Furthermore, the post-deposition etch can also aid in tailoring the position and/or profile of the selectively deposited layer, as will be better understood from the description of FIGS. 17-23B below.

In some embodiments, the organic layer deposited on the first surface of the substrate may have a thickness less than about 50 nm, less than about 20 nm, less than about 10 nm, less than about 5 nm, less than about 3 nm, less than about 2 nm, or less than about 1 nm, while a ratio of material deposited on the first surface of the substrate relative to the second surface of the substrate may be greater than or equal to about 200:1, greater than or equal to about 100:1, greater than or equal to about 50:1, greater than or equal to about 25:1, greater than or equal to about 20:1, greater than or equal to about 15:1, greater than or equal to about 10:1, greater than or equal to about 5:1, greater than or equal to about 3:1, or greater than or equal to about 2:1.

In some embodiments the selectivity of the selective deposition processes described herein may depend on the material compositions of the materials which define the first and/or second surface of the substrate. For example, in some embodiments where the first surface comprises a BTA passivated Cu surface and the second surface comprises a natural or chemical silicon dioxide surface the selectivity may be greater than about 8:1 or greater than about 15:1. In some embodiments, where the first surface comprises a metal or metal oxide and the second surface comprises a natural or chemical silicon dioxide surface the selectivity may be greater than about 5:1 or greater than about 10:1.
Selective Deposition on Dielectric FIGS. 1A-1D schematically illustrate a first embodiment for selective passivation of a first surface relative to a second surface, followed by selective deposition on the second surface relative to the passivated first surface. In the illustrated embodiment, the first surface comprises a metallic material; the second surface comprises an inorganic dielectric material; and the material of interest deposited on the second surface comprises a dielectric material.

FIG. 1A illustrates a substrate having materially different surfaces exposed. For example, the first surface can comprise or be defined by a metal, such as cobalt (Co), copper (Cu), tungsten (W) or molybdenum (Mo). The second surface can comprise or be defined by an inorganic dielectric, such as a low-k layer (typically a silicon oxide-based layer) or a silicon surface having native oxide (also a form of silicon oxide) formed thereover.

Figure 1B:
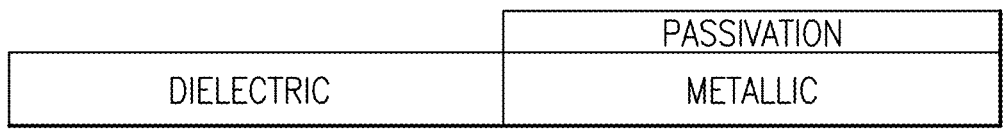
FIG. 1B is a schematic cross section of the substrate of FIG. 1A after a selective passivation of the first surface.

FIG. 1B shows the substrate of FIG. 1A after selective deposition of a passivation layer over the first surface. For example, the passivation layer may be a polymer layer deposited selectively on the metallic surface of the first layer. Methods for selectively depositing polymer layers by vapor deposition techniques are disclosed in U.S. patent application Ser. No. 15/170,769, filed Jun. 1, 2016, the entire disclosure of which is incorporated herein by references for all purposes. Further information and examples of selective deposition of polymer layers to serve as the passivation layer are provided below.

In some embodiments, the selectively deposited polymer is a polyimide. In some embodiments, the polymer deposited is a polyamide. Other examples of deposited polymers include dimers, trimers, polyurea layers, polythiophene polyurethanes, polythioureas, polyesters, polyimines, other polymeric forms or mixtures of the above materials. Vapor deposited organic materials include polyamic acid, which may be a precursor to polymer formation. The selectively deposited layer can be a mixture including polymer and polyamic acid, which for purposes of the present disclosure will be considered to be a polymer.

As noted above, any organic material deposited on the second surface (an inorganic dielectric surface in this example) can be removed by an etch back process. In some embodiments, an etch process subsequent to selective deposition of the organic layer may remove deposited organic material from both the first surface and the second surface of the substrate. In some embodiments the etch process may be isotropic.

In some embodiments, the etch process may remove the same amount, or thickness, of material from the first and second surfaces. That is, in some embodiments the etch rate of the organic material deposited on the first surface may be substantially similar to the etch rate of the organic material deposited on the second surface. Due to the selective nature of the deposition processes described herein, the amount of organic material deposited on the second surface of the substrate is substantially less than the amount of material deposited on the first surface of the substrate. Therefore, an etch process may completely remove deposited organic material from the second surface of the substrate while deposited organic material may remain on the first surface of the substrate. Suitable processes for etching polymers are described below with respect to FIG. 1D.

Figure 1C:
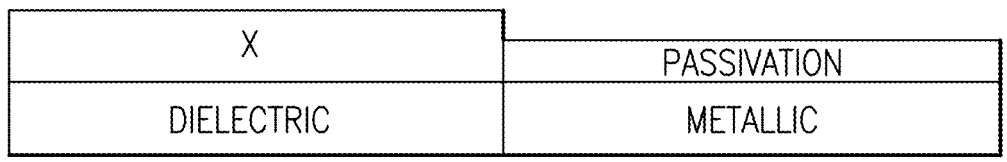
FIG. 1C is a schematic cross section of the substrate of FIG. 1B after selective deposition on the second surface.

FIG. 1C shows the substrate of FIG. 1B following selective deposition of a layer of interest X on the second surface (an inorganic dielectric surface in this example) relative to the passivation layer on the first surface (a metallic surface in this example). The layer of interest X can be a dielectric material, particularly a metal oxide such as zirconium oxide, hafnium oxide or titanium oxide. Methods for selectively depositing such metal oxide layers by vapor deposition techniques, employing hydrophobic precursors to aid selectivity relative to organic passivation layers, are disclosed in U.S. provisional patent application No. 62/332,396, filed May 5, 2016, the entire disclosure of which is incorporated herein by references for all purposes. Further information and examples of selective deposition of metal oxide and other layers of interest are provided below.

As noted above, any X material deposited on the passivation layer over the first surface can be removed by an etch back process. Because the layer of interest is deposited selectively on the second surface, any X material left on the passivation surface will be thinner than the passivation layer formed on the metallic surface. Accordingly, the etch back process can be controlled to remove all of the X material over the passivation layer without removing all of the layer of interest from over the dielectric surface. Repeatedly depositing selectively and etching back in this manner can result in an increasing thickness of the X material on the dielectric with each cycle of deposition and etch. Repeatedly depositing selectively and etching back in this manner can also result in increased overall selectivity of the X material on the dielectric, as each cycle of deposition and etch leaves a clean passivation layer over which the selective X deposition nucleates poorly. Alternatively, any X material can be removed during subsequent removal of the passivation layer, example conditions for which are described with respect to FIG. 1D below, in a lift-off process. As is known in the art, a lift-off process removes an overlying material by undercutting with removal of an underlying material. Any X material formed on the passivation layer in a short selective deposition process tends to be noncontinuous, allowing access of the etchant to the underlying material to be removed. The lift-off etch need not fully remove the passivation layer in order to remove all of the undesired X material from the passivation layer surface, such that either a direct etch or the lift-off method can be used to remove the X material from the passivation layer surface in a cyclical selective deposition and removal.

Figure 1D:
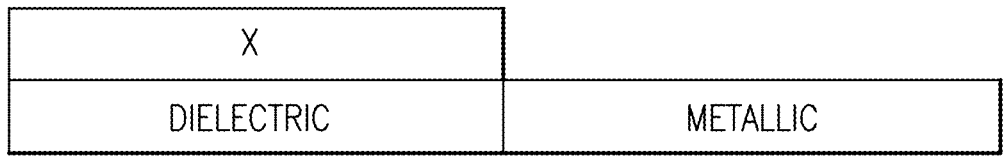
FIG. 1D is a schematic cross section of the substrate of FIG. 1C after removal of the passivation material from the first surface.

FIG. 1D shows the substrate of FIG. 1C after removal of the passivation layer from the first surface. In some embodiments, the etch process may comprise exposing the substrate to a plasma. In some embodiments, the plasma may comprise oxygen atoms, oxygen radicals, oxygen plasma, or combinations thereof. In some embodiments, the plasma may comprise hydrogen atoms, hydrogen radicals, hydrogen plasma, or combinations thereof (see, e.g., Example 2 for selective deposition of passivation layer below). In some embodiments, the plasma may also comprise noble gas species, for example Ar or He species. In some embodiments the plasma may consist essentially of noble gas species. In some instances, the plasma may comprise other species, for example nitrogen atoms, nitrogen radicals, nitrogen plasma, or combinations thereof. In some embodiments, the etch process may comprise exposing the substrate to an etchant comprising oxygen, for example $O_3$. In some embodiments, the substrate may be exposed to an etchant at a temperature of between about 30° C. and about 500° C., preferably between about 100° C. and about 400° C. In some embodiments, the etchant may be supplied in one continuous pulse or may be supplied in multiple shorter pulses. As noted above, the passivation layer removal can be used to lift-off any remaining X material from over the passivation layer, either in a complete removal of the passivation layer or in a partial removal of the passivation layer in a cyclical selective deposition and removal.

As noted above, in some embodiments, $O_3$ (e.g. $O_3/N_2$) can be used in the etch process for removal of the organic passivation layer. In some embodiments, the etch process may be performed at a substrate temperature of about 20° C. to about 500° C. In some embodiments, the etch process may be performed at a substrate temperature of about 50° C. to about 300° C. In some embodiments, the etch process may be performed at a substrate temperature of about 100° C. to about 250° C. In some embodiments, the etch process may be performed at a substrate temperature of about 125° C. to about 200 C. In some embodiments, the etch process may be performed at a rate of about 0.05 nm/min to about 50.0 nm/min. In some embodiments, the etch process may be performed at a rate of about 0.1 nm/min to about 5.0 nm/min. In some embodiments, the etch process may be performed at a rate of about 0.2 nm/min to about 2.5 nm/min. In some embodiments for single wafer or small batch (e.g., 5 wafers or less) processing, a low $O_3$ concentration etch process may be used, wherein the low $O_3$ concentration etch process is performed at 0.01 Torr to 200 Torr, more particularly about 0.1 Torr to 100 Torr (e.g., 2 Torr). Etchant pulsing can be between 0.01 sec and 20 seconds, particularly between 0.05 sec and 10 sec, even more particularly between 0.1 sec and 2 seconds (e.g., 0.5 sec pulse/0.5 sec purge of $O_3$). $O_3$ flow can range from 0.01 slm to 1 slm, more particularly from 0.01 slm to 0.250 slm. Inert (e.g., $N_2$) carrier gas flow of can range from 0.1 slm to 20 slm, more particularly from 0.5 slm to 5 slm (e.g., 1.2 slm). In some embodiments, a high $O_3$ concentration etch process may be used, wherein the high $O_3$ concentration etch process is performed at 1-100 Torr, more particularly 5-20 Torr (e.g., 9 Torr), with longer exposures per cycle. For example, $O_3$ exposure times can be between 0.1 sec and 20 s, more particularly between 0.5 sec and 5 seconds (e.g., 1 sec pulse/1 sec purge of $O_3$). $O_3$ flow for such high $O_3$ concentration processes can be between 0.1 slm and 2.0 slm, more particularly between 0.5 slm and 1.5 slm (e.g, 750 sccm), with an inert (e.g., $N_2$) dilution flow of 0.1 slm to 20 slm, more particularly 0.5 slm to 5 slm (e.g., 1.2 slm). Further description of $O_3$ etch processes are provided below with reference to FIGS. 24 and 25.

Additional treatments, such as heat or chemical treatment, can be conducted prior to, after or between the foregoing processes. For example, treatments may modify the surfaces or remove portions of the metal, silicon oxide, polymer passivation and metal oxide surfaces exposed at various stages of the process. In some embodiments the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments the substrate surface may be exposed to plasma, radicals, excited species, and/or atomic species prior to or at the beginning of the selective deposition process. In some embodiments, the substrate surface may be exposed to hydrogen plasma, radicals, or atomic species prior to or at the beginning of the selective deposition process. In some embodiments, a pretreatment or cleaning process may be carried out in the same reaction chamber as a selective deposition process, however in some embodiments a pretreatment or cleaning process may be carried out in a separate reaction chamber.

Selective Deposition on Metal

FIGS. 2A-2E illustrate schematically illustrate a second embodiment for selective passivation of a first surface relative to a second surface, followed by selective deposition on the second surface relative to the passivated first surface. In the illustrated embodiment, the first surface comprises an inorganic dielectric material; the second surface comprises a metallic surface; and the material of interest deposited on the second surface comprises a dielectric material or a metal.

Figure 2A:
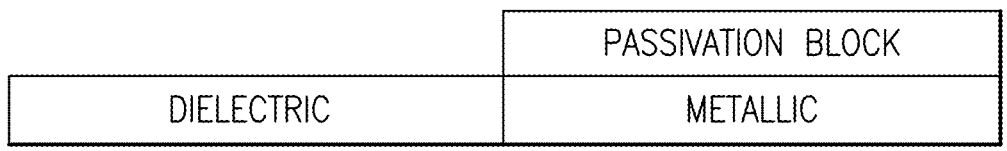
FIG. 2A is a schematic cross section of a portion of a substrate having first and second surfaces of different compositions, with a passivation blocking material formed on the second surface, in accordance with a second embodiment.

FIG. 2A illustrates a substrate similar to that of FIG. 1A, having materially different surfaces. For this embodiment, however, the surfaces are described with reversed terminology. In particular, the second surface can comprise or be defined by a metallic material, such as cobalt (Co), copper (Cu), tungsten (W) or molybdenum (Mo). The first surface can comprise an inorganic dielectric, such as a low-k layer (typically a silicon oxide-based layer) or a silicon surface having native oxide (also a form of silicon oxide) formed thereover. A passivation blocking layer is formed over the second surface. Note that the term "blocking" is not meant to imply that the subsequent selective deposition of a passivation layer is completely blocked by the passivation blocking layer. Rather, the passivation blocking layer over the second surface need only inhibit the deposition of the passivation layer to have a lower growth rate relative to the growth rate over the first surface.

In one embodiment, the passivation blocking layer comprises a self-assembled monolayer (SAM). Preferably SAM can be selectively formed over the second (metallic) surface without forming on the first (dielectric) surface. Advantageously, sulfur-containing SAM has been found particularly effective to minimize deposition of the passivation layer thereover, as discussed with respect to FIGS. 11-13 below. Further details on the formation of sulfur-containing SAM, employing vapor-delivered 1-dodecanaethiol ($CH_3(CH_2)_{11}SH$), are discussed with respect to FIGS. 8-10 and 14-15 below.

Figure 2B:
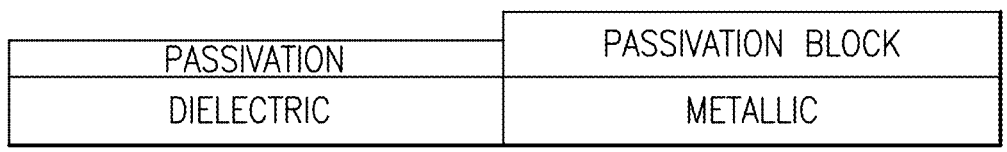
FIG. 2B is a schematic cross section of the substrate of FIG. 2A after a selective passivation of the first surface.

FIG. 2B shows the selective formation of a passivation layer (e.g., organic passivation layer) over the first surface, in this case the inorganic dielectric layer, relative to the passivation blocking layer over the second surface. As noted in the above incorporated patent application Ser. No. 15/170,769, filed Jun. 1, 2016, vapor deposition processes described therein are capable of depositing polymer on inorganic dielectrics, and can even deposit selectively (i.e., at differential deposition rates) over different types of silicon oxide. In the present embodiment, sulfur-containing SAM inhibits the polymer deposition thereover, such that polymer can selectively form over the first surface, and can serve as a passivation layer against a subsequent deposition.

Figure 2C:
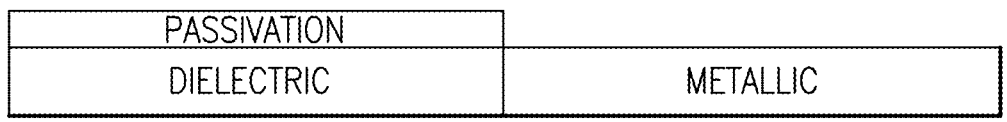
FIG. 2C is a schematic cross section of the substrate of FIG. 2B after removal of the passivation blocking material from the second surface.

FIG. 2C shows the substrate of FIG. 2B after removal of the passivation blocking layer from over the second surface. For example, sulfur-containing SAM material can be removed by heat treatment at temperatures lower than those that would remove a polymer layer like polyimide. Accordingly, a passivation layer is left selectively over the first surface, while the second surface is exposed. The structure is similar to that of FIG. 1B except that the first passivated surface is an inorganic dielectric in this embodiment, and the second surface is a metallic surface.

Figure 2D:
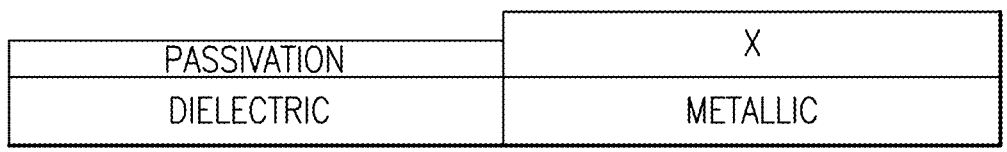
FIG. 2D is a schematic cross section of the substrate of FIG. 2C after selective deposition on the second surface.

FIG. 2D shows the substrate of FIG. 2C after selective deposition of a layer of interest X on the second surface relative to the passivation layer over the first surface. As noted with respect to the first embodiment, and described in the above-incorporated provisional patent application No. 62/332,396, filed May 5, 2016, metal oxides can be selectively deposited using vapor deposition techniques and hydrophobic precursors to aid selectivity relative to organic passivation layers, on a number of different surfaces. Further information and examples of selective deposition of metal oxide and other layers of interest are provided below.

Alternatively, the layer of interest X is a metal layer. U.S. Pat. No. 8,956,971, issued Feb. 17, 2015 and U.S. Pat. No. 9,112,003, issued Aug. 18, 2015, the entire disclosures of which are incorporated herein by reference for all purposes, teach processes for selective deposition of metallic materials on metallic surfaces, relative to other material surfaces, including organic surfaces.

Figure 2E:
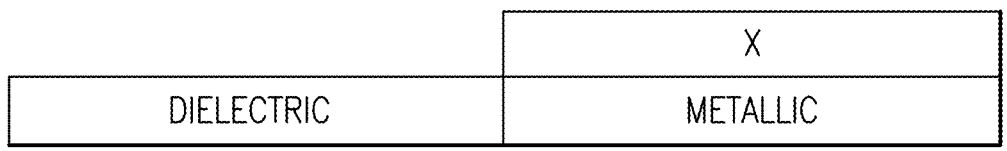
FIG. 2E is a schematic cross section of the substrate of FIG. 2D after removal of the passivation material from the first surface.

FIG. 2E shows the substrate of FIG. 2D after removal of the passivation layer from the first surface, leaving a selectively formed dielectric on metal or metal on metal. The passivation layer can be removed as described above with respect to the first embodiment, such as by $O_3$ etching.

FIGS. 3A-3B illustrate a third embodiment for selective passivation of a first surface relative to a second surface, followed by selective deposition on the second surface relative to the passivated first surface. In the illustrated embodiment, the process of FIGS. 2A-2D is first conducted.

FIG. 3A shows the substrate of FIG. 2D after a further selective deposition. In the event the layer of interest X is a metallic material, the further selective deposition can form a dielectric material as a second layer of interest Y over the first layer of interest, selectively relative to the organic passivation layer. As noted above with respect to the first and second embodiments, and described in the above-incorporated provisional patent application No. 62/332,396, filed May 5, 2016, metal oxides can be selectively deposited using vapor deposition techniques and hydrophobic precursors to aid selectivity relative to organic passivation layers, on a number of different surfaces. Further information and examples of selective deposition of metal oxide and other layers of interest are provided below.

FIG. 3B shows the substrate of FIG. 3A after removal of the passivation layer from the first surface, leaving a selectively formed dielectric on metal. The passivation layer can be removed as described above with respect to the first embodiment, such as by $O_3$ etching.

The second and third embodiments, like the first embodiment, can involve additional treatments, such as heat or chemical treatment, conducted prior to, after or between the foregoing processes.

Selective Deposition of Passivation Layer

As disclosed in the incorporated U.S. patent application Ser. No. 15/170,769, filed Jun. 1, 2016, vapor phase deposition techniques can be applied to organic passivation layers and polymers such as polyimide layers, polyamide layers, polyuria layers, polyurethane layers, polythiophene layers, and more. CVD of polymer layers can produce greater thickness control, mechanical flexibility, conformal coverage, and biocompatibility as compared to the application of liquid precursor. Sequential deposition processing of polymers can produce high growth rates in small research scale reactors. Similar to CVD, sequential deposition processes can produce greater thickness control, mechanical flexibility, and conformality. The terms "sequential deposition" and "cyclical deposition" are employed herein to apply to processes in which the substrate is alternately or sequentially exposed to different precursors, regardless of whether the reaction mechanisms resemble ALD, CVD, MLD or hybrids thereof.

Figure 4A:
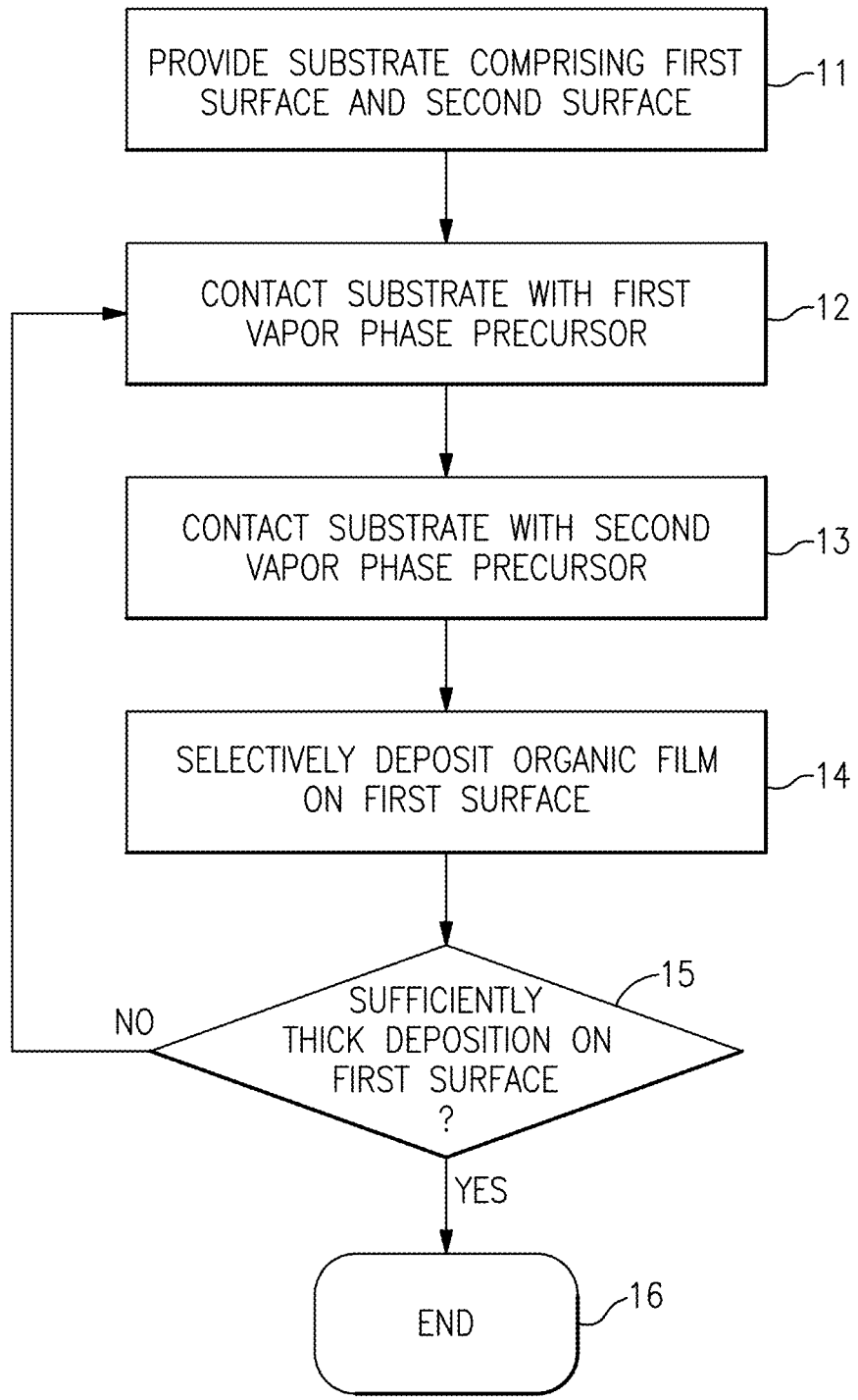
FIG. 4A is a flow diagram generally illustrating processes for selectively depositing an organic passivation layer.

Referring to FIG. 4A and in some embodiments, a substrate comprising a first surface and a second surface is provided at block 11. The first and second surfaces may have different material properties as discussed herein. In some embodiments, the first surface may be a conductive surface, for example a metal or metallic surface, and the second surface may be a dielectric surface (see, e.g., FIGS. 1A-1D). In some embodiments, the first surface may be a dielectric surface and the second surface may be a second, different dielectric surface. In some embodiments, the first surface may be a dielectric surface, for example a silicon oxide-based material, and the second surface may be a passivation blocking material such as an SAM (see, e.g., FIGS. 2A-3B).

In some embodiments, the first precursor may be vaporized at a first temperature to form the first vapor phase precursor. In some embodiments, the first precursor vapor is transported to the substrate through a gas line at a second temperature. In some embodiments, the second transportation temperature is higher than the first vaporization temperature. In some embodiments, the substrate is contacted with a first vapor phase precursor, or reactant, at block 12 for a first exposure period. In some embodiments, the substrate may be contacted with the first vapor phase precursor at a third temperature that is higher than the first temperature.

In some embodiments, the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

In some embodiments, the substrate is contacted with a second vapor phase precursor, or reactant, at block 13 for a second exposure period. In some embodiments, the second precursor may be vaporized at a fourth temperature to form the second vapor phase precursor. In some embodiments, the second reactant vapor is transported to the substrate through a gas line at a second temperature. In some embodiments, the fifth transportation temperature is higher than the first vaporization temperature. In some embodiments, the substrate may be contacted with the second vapor phase precursor at a sixth temperature that is higher than the fourth temperature. In some embodiments, the sixth temperature may be substantially the same as the third temperature at which the first vapor phase precursor contacts the substrate.

In some embodiments, the second precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments, where batch reactors may be used, exposure periods of greater than 60 seconds may be employed.

Figure 4B:
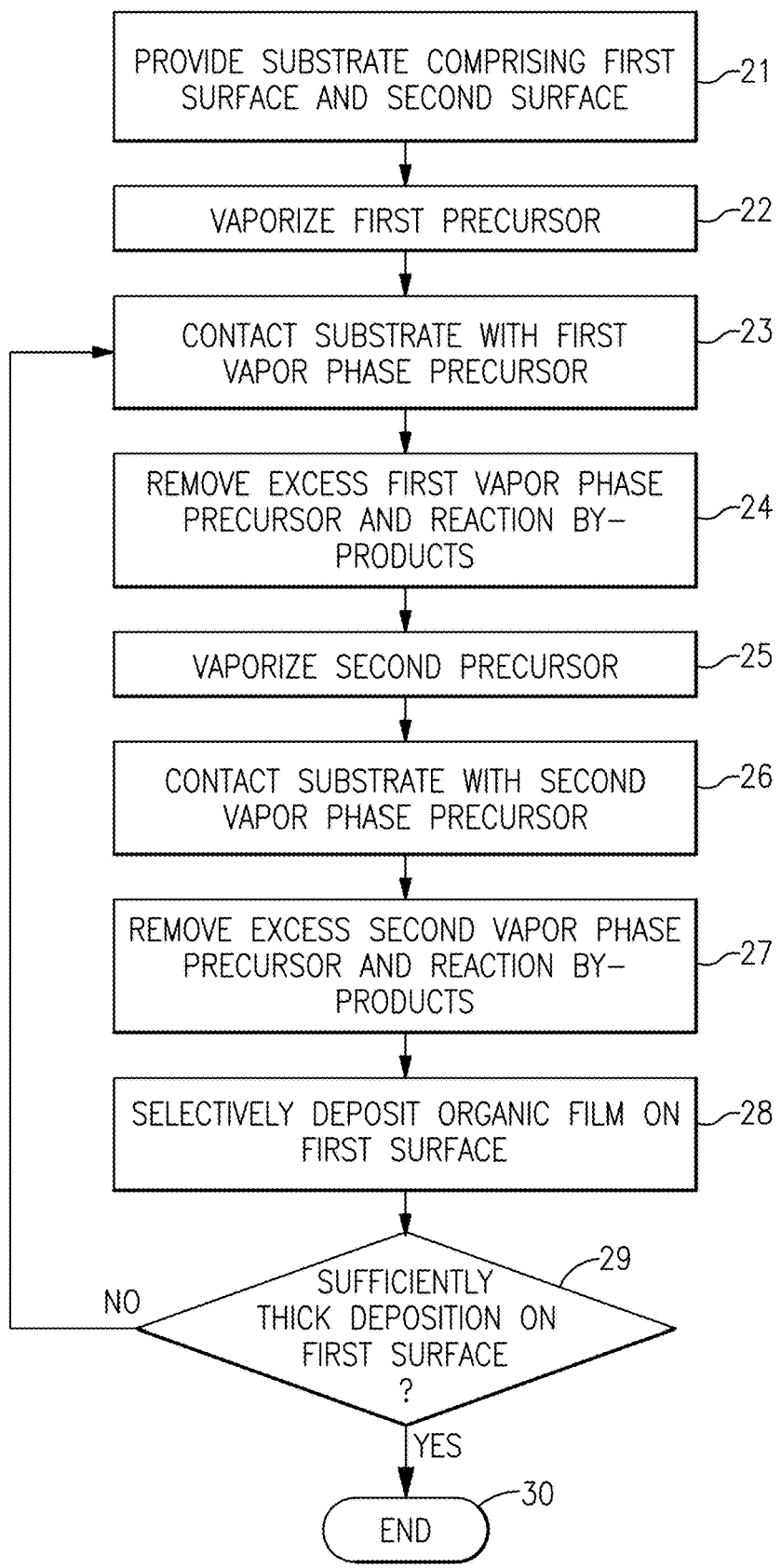
FIG. 4B is a flow diagram generally illustrating atomic layer deposition (ALD) processes for selectively depositing an organic layer.

In block 14 an organic layer is selectively deposited on the first surface relative to the second surface. The skilled artisan will appreciate that selective deposition of an organic layer is the result of the above-described contacting actions, 12-13, rather than a separate action. In some embodiments, the above-described contacting actions, blocks 12-13, may be considered a deposition cycle. Such a selective deposition cycle can be repeated until a layer of sufficient thickness is left on the substrate (block 15) and the deposition is ended (block 16). The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal (relative to the substrate) of additional reactants in each cycle or in selected cycles. Though not shown, the process may additionally comprise treating the deposited layer to form a polymer (for example, UV treatment, annealing, etc.). The selectively formed organic layer can serve as a passivation layer to inhibit deposition thereover and increase selectivity in a subsequent selective deposition of a layer of interest, as noted above Referring to FIG. 4B, the vapor deposition process of FIG. 4A may in some embodiments comprise an atomic layer deposition process. A substrate comprising a first surface and a second surface is provided at block 21. The first and second surfaces may have different material properties. In some embodiments, the first surface may be a conductive surface, for example a metal or metallic surface, and the second surface may be a dielectric surface (see, e.g., FIGS. 1A-1D). In some embodiments, the first surface may be a dielectric surface and the second surface may be a second, different dielectric surface. In some embodiments, the first surface may be a dielectric surface, for example a silicon oxide-based material, and the second surface may be a passivation blocking material such as an SAM (see, e.g., FIGS. 2A-3B).

In some embodiments a sequential deposition method for selective vapor deposition of an organic passivation layer comprises vaporizing a first organic precursor is at a first temperature to form a first precursor vapor at block 22. In some embodiments, the first precursor vapor is transported to the substrate through a gas line at a second temperature. In some embodiments the second transportation temperature is higher than the first vaporization temperature. In some embodiments, the substrate is contacted with the vapor phase first precursor for a first exposure period at block 23. In some embodiments, the first precursor, or species thereof, chemically adsorbs on the substrate in a self-saturating or self-limiting fashion. The gas line can be any conduit that transports the first precursor vapor from the source to the substrate. In some embodiments, the substrate may be exposed to the first precursor vapor at a third temperature that is higher than the first temperature.

In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments, where batch reactors may be used, exposure periods of greater than 60 seconds may be employed.

Excess of the first precursor vapor (and any volatile reaction by-products) may then be removed from contact with the substrate at block 24. Such removal can be accomplished by, for example, purging, pump down, moving the substrate away from a chamber or zone in which it is exposed to the first reactant, or combinations thereof. In some embodiments, a first precursor removal period, for example a purge period, is from about 0.01 seconds to about 60 seconds, about 0.05 seconds to about 30 seconds, about 0.1 seconds to about 10 seconds or about 0.2 seconds to about 5 seconds. The optimum removal period can be readily determined by the skilled artisan based on the particular circumstances. In some embodiments, where batch reactors may be used, removal periods of greater than 60 seconds may be employed.

In some embodiments, the second precursor may be vaporized at a fourth temperature to form the second vapor phase precursor at block 25. In some embodiments, the second reactant vapor is transported to the substrate through a gas line at a second temperature. In some embodiments, the fifth transportation temperature is higher than the first vaporization temperature. In some embodiments, the substrate may be contacted with the second vapor phase precursor at a sixth temperature that is higher than the fourth temperature. In some embodiments, the sixth temperature may be substantially the same as the third temperature at which the first vapor phase precursor contacts the substrate. In some embodiments, the substrate may be exposed to a second precursor vapor for a second exposure period at block 26. In some embodiments, the second reactant may react with the adsorbed species of the first reactant on the substrate.

In some embodiments, the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments, where batch reactors may be used, exposure periods of greater than 60 seconds may be employed.

In some embodiments, excess of the second precursor vapor (and any volatile reaction by-product) is removed from contact with the substrate at block 27, such that the first reactant vapor and the second reactant vapor do not mix. In some embodiments, the vapor deposition process of the organic layer does not employ plasma and/or radicals, and can be considered a thermal vapor deposition process. In some embodiments, a second precursor removal period, for example a purge period, is from about 0.01 seconds to about 60 seconds, about 0.05 seconds to about 30 seconds, about 0.1 seconds to about 10 seconds or about 0.2 seconds to about 5 seconds. The optimum removal period can be readily determined by the skilled artisan based on the particular circumstances. In some embodiments, where batch reactors may be used, removal periods of greater than 60 seconds may be employed.

In block 28 an organic layer is selectively deposited on the first surface relative to the second surface. The skilled artisan will appreciate that selective deposition of an organic layer is the result of the above-described contacting actions rather than a separate action. In some embodiments, the above-described contacting and removing (and/or halting supply) actions, blocks 23-27, may be considered a deposition cycle. In some embodiments, a deposition cycle may be repeated until an organic layer of a desired thickness is selectively deposited. Such a selective deposition cycle can be repeated (block 29) until a layer of sufficient thickness is left on the substrate and the deposition is ended (block 30). The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal of additional reactants in each cycle or in selected cycles. Though not shown, the process may additionally comprise treating the deposited layer to form a polymer (for example, UV treatment, annealing, etc.).

Various reactants can be used for the above described processes. For example, in some embodiments, the first precursor or reactant is an organic reactant such as a diamine, e.g., 1,6-diaminohexane (DAH), or any other monomer with two reactive groups. In some embodiments, the second reactant or precursor is also an organic reactant capable of reacting with adsorbed species of the first reactant under the deposition conditions. For example, the second reactant can be an anhydride, such as furan-2,5-dione (maleic acid anhydride). The anhydride can comprise a dianhydride, e.g., pyromellitic dianhydride (PMDA), or any other monomer with two reactive groups which will react with the first reactant.

In some embodiments the substrate is contacted with the first precursor prior to being contacted with the second precursor. Thus, in some embodiments the substrate is contacted with an amine, such as a diamine, for example 1,6-diaminohexane (DAH) prior to being contacted with another precursor. However, in some embodiments the substrate may be contacted with the second precursor prior to being contacted with the first precursor. Thus, in some embodiments the substrate is contacted with an anhydride, such as furan-2,5-dione (maleic acid anhydride), or more particularly a dianhydride, e.g., pyromellitic dianhydride (PMDA) prior to being contacted with another precursor.

In some embodiments, different reactants can be used to tune the layer properties. For example, a polyimide layer could be deposited using 4,4'-oxydianiline or 1,4-diaminobenzene instead of 1,6-diaminohexane to get a more rigid structure with more aromaticity and increased dry etch resistance.

In some embodiments, the reactants do not contain metal atoms. In some embodiments, the reactants do not contain semimetal atoms. In some embodiments, one of the reactants comprises metal or semimetal atoms. In some embodiments, the reactants contain carbon and hydrogen and one or more of the following elements: N, O, S, P or a halide, such as Cl or F. In some embodiments, the first reactant may comprise, for example, adipoyl chloride (AC).

Deposition conditions can differ depending upon the selected reactants and can be optimized upon selection. In some embodiments, the reaction temperature can be selected from the range of about 80° C. to about 250° C. In some embodiments, the reaction chamber pressure may be from about 1 mTorr to about 1000 Torr. In some embodiments, for example where the selectively deposited organic layer comprises polyamide, the reaction temperature can be selected from a range of about 80° C. to about 150° C. In some embodiments where the selectively deposited organic layer comprises polyamide, the reaction temperature may be greater than about 80° C., 90° C., 100° C., 110° C., 120° C., 130° C., 140° C., or 150° C. In some embodiments where the selectively deposited organic layer comprises polyimide, the reaction temperature may be greater than about 160° C., 180° C., 190° C., 200° C., or 210° C.

For example, for sequential deposition of polyimide using PMDA and DAH in a single wafer deposition tool, substrate temperatures can be selected from the range of about 150° C. to about 250° C., or from about 170° C. to about 210° C., and pressures can be selected from the range of about 1 mTorr to about 760 Torr, more particularly between about 100 mTorr to about 100 Torr.

In some embodiments reactants for use in the selective deposition processes described herein may have the general formula:

$$R^1(NH_2)_2 \qquad (1)$$

wherein $R^1$ may be an aliphatic carbon chain comprising 1-5 carbon atoms, 2-5 carbon atoms, 2-4 carbon atoms, 5 or fewer carbon atoms, 4 or fewer carbon atoms, 3 or fewer carbon atoms, or 2 carbon atoms. In some embodiments, the bonds between carbon atoms in the reactant or precursor may be single bonds, double bonds, triple bonds, or some combination thereof. Thus, in some embodiments a reactant may comprise two amino groups. In some embodiments, the amino groups of a reactant may occupy one or both terminal positions on an aliphatic carbon chain. However, in some embodiments the amino groups of a reactant may not occupy either terminal position on an aliphatic carbon chain. In some embodiments, a reactant may comprise a diamine. In some embodiments, a reactant may comprise an organic precursor selected from the group of 1,2-diaminoethane (1), 1,3-diaminopropane (1), 1,4-diaminobutane(1), 1,5-diaminopentane (1), 1,2-diaminopropane (1), 2,3-butanediamine, 2,2-dimethyl-1,3-propanediamine (1).

In some embodiments, reactants for use in the selective deposition processes described herein may have the general formula:

$$R^2(COCl)_2 \qquad (2)$$

wherein $R^2$ may be an aliphatic carbon chain comprising 1-3 carbon atoms, 2-3 carbon atoms, or 3 or fewer carbon atoms. In some embodiments, the bonds between carbon atoms in the reactant or precursor may be single bonds, double bonds, triple bonds, or some combination thereof. In some embodiments, a reactant may comprise a chloride. In some embodiments, a reactant may comprise a diacyl chloride. In some embodiments, a reactant may comprise an organic precursor selected from the group of oxalyl chloride (I), malonyl chloride, and fumaryl chloride.

In some embodiments, a reactant comprises an organic precursor selected from the group of 1,4-diisocyanatobutane or 1,4-diisocyanatobenzene. In some embodiments, a reactant comprises an organic precursor selected from the group of terephthaloyl dichloride, alkyldioyl dichlorides, such as hexanedioyl dichloride, octanedioyl dichloride, nonanedioyl dichloride, decanedioyl dichloride, or terephthaloyl dichloride. In some embodiments, a reactant comprises an organic precursor selected from the group of 1,4-diisothiocyanatobenzene or terephthalaldehyde. In some embodiments, a reactant being vaporized can be also a diamine, such as 1,4-diaminobenzene, decane-1,10-diamine, 4-nitrobenzene-1,3-diamine, 4,4'-oxydianiline, or ethylene diamine. In some embodiments, a reactant can be a terephthalic acid bis(2-hydroxyethyl) ester. In some embodiments, a reactant can be a carboxylic acid, for example alkyl-, alkenyl-, alkadienyl-dicarboxylic or tricarboxylic acid, such as ethanedioic acid, propanedioic acid, butanedioic acid, pentanedioic acid or propane-1,2,3-tricarboxylic acid. In some embodiments, a reactant can be an aromatic carboxylic or dicarboxylic acid, such as benzoic acid, benzene-1,2-dicarboxylic acid, benzene-1,4-dicarboxylic acid or benzene-1,3-dicarboxylic acid. In some embodiments, a reactant may comprise one or more OH-groups bonded to a hydrocarbon. In some embodiments, a reactant can be selected from the group of diols, triols, aminophenols such as 4-aminophenol, benzene-1,4-diol or benzene-1,3,5-triol. In some embodiments, a reactant can be 8-quinolinol. In some embodiments, the reactant can comprise alkenylchlorosilanes, like alkenyltrichlorosilanes, such as 7-octenyltrichlorosilane.

In some embodiments, a reactant may have a vapor pressure greater than about 0.5 Torr, 0.1 Torr, 0.2 Torr, 0.5 Torr, 1 Torr or greater at a temperature of about 20° C. or room temperature. In some embodiments, a reactant may have a boiling point less than about 400° C., less than 300° C., less than about 250° C., less than about 200° C., less than about 175° C., less than about 150° C., or less than about 100° C.

Example 1: Selective Deposition of Passivation Layer

Sample polyimide thin layers were deposited on a number of substrates according to selective deposition processes described herein. 200 mm silicon wafers having tungsten (W) features alternated with silicon oxide surfaces were used as substrates. The width of the tungsten features was 250 nm with a pitch of approximately 600 nm. The polyimide deposition processes were performed in a Pulsar 3000® cross-flow ALD reactor connected with PRI cluster tool.

A first batch of sample polyimide layers were deposited according to the processes described herein using DAH as a first vapor phase reactant and PMDA as a second vapor phase reactant. The DAH first reactant was supplied at 45° C. by an $N_2$ carrier gas having a flow rate of 450 sccm. The DAH pulse time was 5 seconds and the DAH pure time was 4 seconds. The PMDA second reactant was supplied to the reaction chamber at 180° C. by an $N_2$ carrier gas having a flow rate of 450 sccm. The PMDA pulse time was 11 seconds and the PMDA purge time was 4 seconds. The reaction or substrate temperature was 160° C. Polyimide layers were deposited using between 25 and 100 deposition cycles.

A second batch of sample polyimide layers were deposited according to the processes described herein using substantially similar conditions as the first batch, but having a reaction temperature of 190° C. Polyimide layers were deposited using between 250 and 1000 deposition cycles.

The thicknesses of the polyimide layer samples were measured using scanning transmission electron microscopy. The first batch of polyimide layers were found to have thicknesses between 5 nm for a process having 25 deposition cycles and 40 nm for a process having 100 deposition cycles with a growth rate of about 4-6 Å/cycle. The amount of polyimide deposited on the W surfaces of the substrate was substantially the same as the amount of polyimide deposited on the silicon oxide surface. Therefore, the deposition was not selective at a reaction temperature of 160° C. for this recipe.

The second bath of polyimide layers were found to have thicknesses ranging from about 7 nm for a process having 250 cycles to about 28 nm for a process having 1000 cycles on the W surfaces. Polyimide layer thicknesses on the silicon oxide surfaces ranged from about 4 nm for a process having 250 cycles to about 6 nm for a process having 1000 cycles. Therefore, the polyimide deposition was selective at a reaction temperature of 190° C. The growth rate on the W surfaces was about 0.2-1 Å/cycle.

Example 2: Selective Deposition of Passivation Layer

A sample polyimide layer was selectively deposited on a 200 mm silicon wafer having patterned tungsten (W) features alternated with silicon oxide surfaces according to the processes described herein using DAH as a first vapor phase reactant and PMDA as a second vapor phase reactant. The DAH first reactant was supplied at 45° C. by an $N_2$ carrier gas having a flow rate of 450 sccm. The DAH pulse time was 5 seconds and the DAH pure time was 4 seconds. The PMDA second reactant was supplied to the reaction chamber at 180° C. by an $N_2$ carrier gas having a flow rate of 450 sccm. The PMDA pulse time was 11 seconds and the PMDA purge time was 4 seconds. The reaction temperature was 190° C. The polyimide sample layer was deposited using 1000 deposition cycles. The polyimide was deposited on the W surface, with a layer thickness of about 30 nm. A substantially lesser amount of polyimide was deposited on the silicon oxide surface, about 4 nm.

The sample polyimide layer was then etched with $H_2$ plasma generated using 100 W at a temperature of 300° C. for 40 seconds. The flow rate of the $H_2$ gas was 100 sccm. Polyimide was completely removed from the silicon oxide surface while a polyimide layer having a thickness of about 9 nm was left on the W surface.

Selective Deposition of Layers of Interest Relative to Organic Surfaces

As disclosed in the incorporated U.S. provisional patent application No. 62/332,396, filed May 5, 2016, selective deposition of metallic materials, and particularly metal oxides, relative to organic materials such as the passivation layers disclosed herein, can be facilitated by employing hydrophobic reactants. After selectively forming a passivation layer on the first surface, in some embodiments a metal oxide is selectively deposited on the second surface by contacting the substrate alternately and sequentially with a first hydrophobic reactant comprising a metal of the metal oxide and a second reactant comprising oxygen. In some embodiments, the second reactant is water. In some embodiments the substrate is contacted sequentially with the first and second reactants, similar to the sequence of FIG. 4A, except that a non-organic layer is selectively deposited on or over the second surface (see, e.g., FIGS. 1A-3B).

The hydrophobic reactant comprises one or more hydrophobic ligands. In some embodiments, the hydrophobic reactant comprises two to four hydrophobic ligands. In the case of hydrophobic reactants comprising a metal with a valence/oxidation state of n, in some embodiments, the hydrophobic precursor comprises n−1 or n−2 hydrophobic ligands.

In some embodiments, at least one hydrophobic ligand comprises only C and H. In some embodiments, at least one hydrophobic ligand comprises C, H and Si or Ge, but no additional elements.

In some embodiments, a hydrocarbon ligand comprises one or more of the following:
C1-C10 hydrocarbon (single, double or triple bonded)
  Alkyls
    C1-C5 alkyls
      Me, Et, Pr, $^i$Pr, Bu, $^t$Bu
  Alkenyls
    C1-C6 alkenyls
  Cyclic hydrocarbons
    C3-C8
      Cyclopentadienyl
      Cycloheptadienyl
      Cycloheptatrienyl
      Cyclohexyl
      Derivatives of those
  Aromatic
    C6 aromatic ring and derivatives of those In some embodiments, the hydrophobic reactant comprises no hydrophilic ligands. However, in some embodiments the hydrophobic reactant may comprise one or two hydrophilic ligands. In some embodiments, a hydrophilic ligand comprises nitrogen, oxygen and/or a halogen group.

In some embodiments, a hydrophilic ligand is an alkylamine (—NR$_2$, where each R can be alkyl, hydrogen). In some embodiments, the hydrophilic ligand can be—NMe$_2$, —NEtMe, or—NEt$_2$.

In some embodiments, a hydrophilic ligand is an alkoxide, for example—OMe, —OEt, —O$^i$Pr, —O$^t$Bu.

In some embodiments, a hydrophilic ligand comprises a halide, such as a chloride, fluoride or other halide.

In some embodiments, the hydrophobic precursor comprises the formula:
L$_n$MX$_y$, in which
  In some embodiments n is from 1-6;
    In some embodiments n is from 1-4 or 3-4.
  In some embodiments y is from 0-2;
    In some embodiments y is from 0-1.
  L is a hydrophobic ligand;
    In some embodiments L is Cp or a C1-C4 alkyl ligand.
  X is hydrophilic ligand;
    In some embodiments X is an alkylamine, alkoxide or halide ligand.
  M is metal (including group 13 elements, B, Ga);
    In some embodiments M has an oxidation state of +I up to +VI.
    In some embodiments M has an oxidation state of +IV to +V.
    In some embodiments M can be a transition metal.
      In some embodiments M is Ti, Ta, Nb, W, Mo, Hf, Zr, V, or Cr.
        In some embodiments M is Hf, Zr, Ta or Nb.
        In some embodiments M is Zr.
      In some embodiments M is Co, Fe, Ni, Cu, or Zn.
      In some embodiments the metal is not W or Mo.
    In some embodiments M can be a rare earth metal.
      In some embodiments M is La, Ce, or Y.
    In some embodiments M can be a metal from groups of 2-13.
      In some embodiments M is Ba, Sr, Mg, Ca, or Sc.
    In some embodiments M is not a noble metal.

More generally, in some embodiments, the selective ALD process employs a metal precursor. In some embodiments, the metal of the metal precursor may be selected from the group comprising Al, Ti, Ta, Nb, W, Mo, Hf, Zr, V, Cr, Co, Fe, Ni, Cu, Zn, La, Ce, Y, Ba, Sr, Mg, Ca, or Sc, or mixtures thereof. In some embodiments, the metal may be Al.

In some embodiments, the hydrophobic reactant is Bis (methylcyclopentadienyl) methoxymethyl Zirconium(IV) ((CpMe)$_2$—Zr—(OMe)Me).

In some embodiments, the hydrophobic reactant is bis (methylcyclopentadienyl) methoxymethyl Hafnium(IV) ((CpMe)$_2$—Hf—(OMe)Me).

In other embodiments, the selective ALD process employs an Al precursor. Examples of Al precursors include trimethyl aluminum (TMA), aluminum trichloride (AlCl$_3$) and triethyl aluminum (TEA).

In some embodiments, the second reactant contributes one or more elements to the material that is selectively deposited. For example, the second reactant can be an oxygen precursor used to deposit a metal oxide or a nitrogen precursor used to deposit a metal nitride.

In some embodiments, the second reactant comprises an oxygen precursor.

In some embodiments, the second reactant comprises H$_2$O.

In some embodiments, the second reactant comprises O$_3$.

In some embodiments, the second reactant comprises H$_2$O$_2$.

In some embodiments, the second reactant comprises oxygen plasma, ions, radicals, atomic O or excited species of oxygen.

In some embodiments, the second reactant comprises a nitrogen precursor.

In some embodiments, the second reactant comprises NH$_3$.

In some embodiments, the second reactant comprises N$_2$H$_4$.

In some embodiments, the second reactant comprises nitrogen containing plasma, ions, radicals, atomic N or excited species comprising N. In some embodiments, the nitrogen reactant can comprise a mixture with corresponding hydrogen species.

In some embodiments, other reactants can be utilize that contribute elements other than N or O to the deposited material. These reactants may be used in addition to a N or O second reactant, or may themselves serve as a second reactant. For example, in some embodiments a sulfur reactant may be used to deposit a sulphide, a carbon reactant may be used to deposit carbon or a silicon reactant may be used to deposit a silicide.

In some embodiments, a second (or additional) reactant may be used that aid in depositing a metal or metallic film, such as an elemental metal film. For example, in some embodiments a hydrogen reactant may be used.

Alternatively, as described with respect to FIG. 2D, a metallic conductive film of interest can be selectively deposited on the second surface, particularly a metallic surface, relative to the organic passivation layer. For example, U.S. Pat. No. 8,956,971, issued Feb. 17, 2015 and U.S. Pat. No. 9,112,003, issued Aug. 18, 2015, the entire disclosures of which are incorporated herein by reference for all purposes, teach processes for selective deposition of metallic materials on metallic surfaces relative to non-metallic surfaces, including organic materials. As also noted above with respect to FIG. 3A, a further dielectric layer, particularly a metal oxide material, can be selectively formed over the selectively formed metallic material layer prior to removal of the organic passivation layer.

Examples: Selective Metal Oxide Deposition

Figure 5:
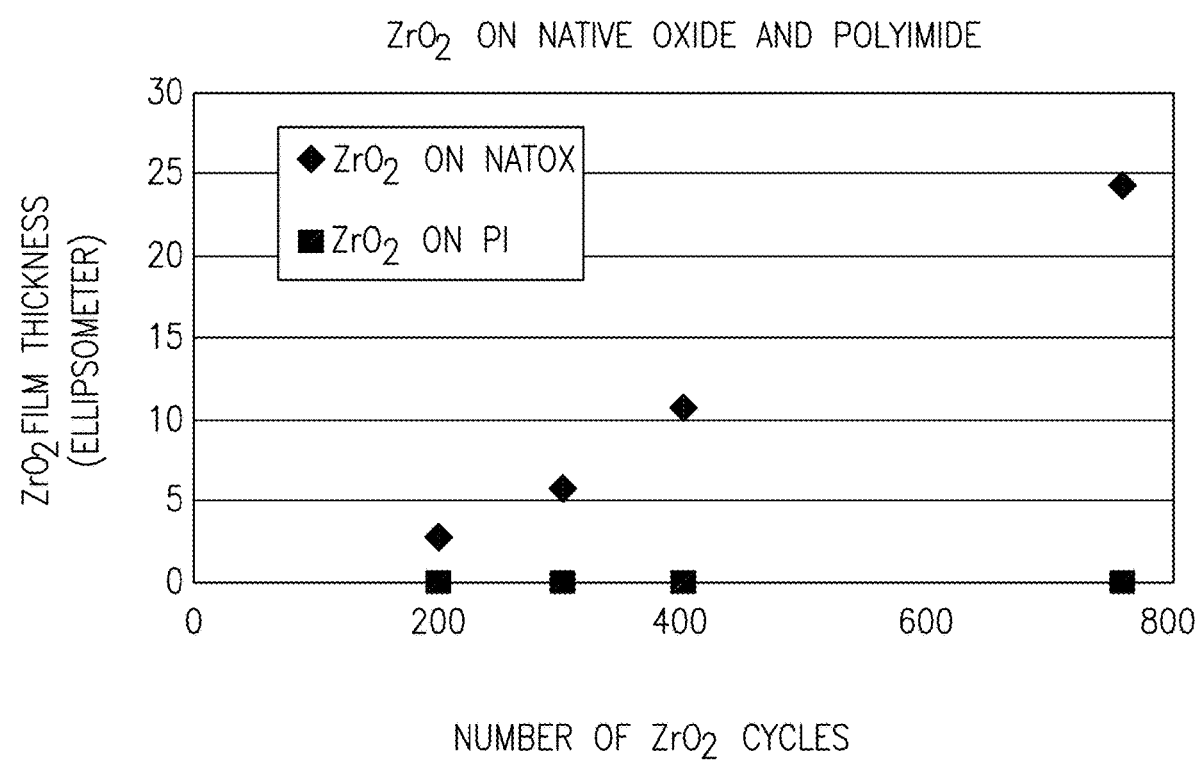
FIG. 5 is a graph illustrating selectivity of a zirconium oxide atomic layer deposition (ALD) process on a native oxide surface relative to a polymer surface.
Figure 6:
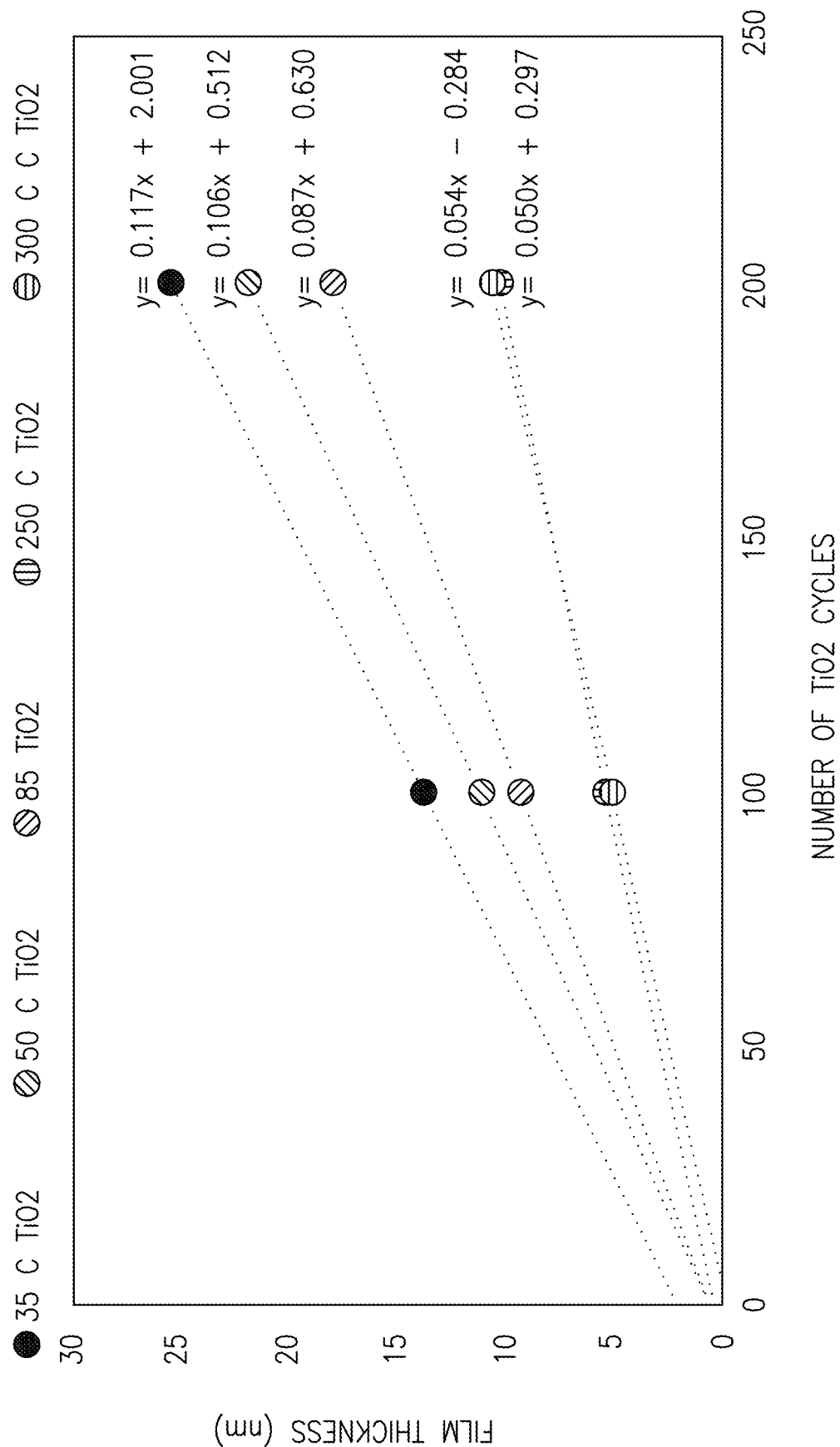
FIG. 6 is graph illustrating titanium oxide thickness over native oxide as a function of cycle numbers and deposition temperatures for a titanium oxide ALD process.
Figure 7:
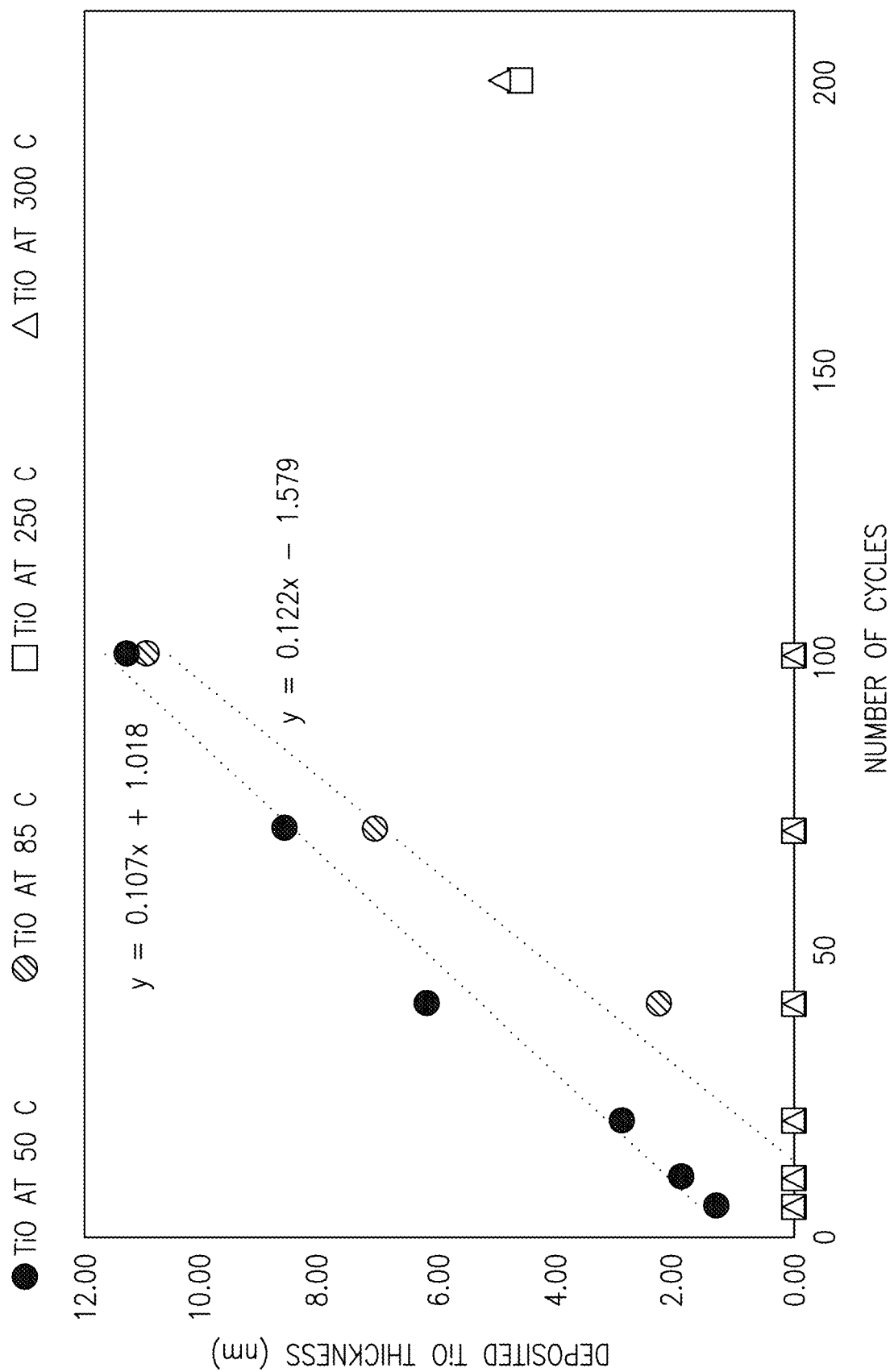
FIG. 7 is a graph illustrating titanium oxide thickness over polymer as a function of cycle numbers and deposition temperatures for a titanium oxide ALD process.

FIGS. 5-7 illustrate that metal oxides can be deposited selectively on inorganic dielectrics relative to organic passivation layers. In experiments, the inorganic passivation layer comprises a deposited polymer, particularly polyimide, which can be selectively formed as described above.

Deposition of $ZrO_2$ by ALD on various substrates and under various reaction conditions was carried out in a Pulsar® 2000 reactor. Bis(methylcyclopentadienyl) methoxymethyl Zirconium(IV) ((CpMe)$_2$—Zr—(OMe)Me) and $H_2O$ were used in an ALD process for depositing a $ZrO_2$ film. Deposition of $ZrO_2$ was not observed on substrates comprising a surface with a SAM layer (Trichloro(octadecyl)silane) or a polyimide surface. See FIGS. 4-5.

In FIG. 5 it can be seen shown that the $ZrO_2$ grows on native oxide (silicon oxide) but not significantly on polyimide. Even after almost 25 nm of $ZrO_2$ was deposited on the native oxide ($SiO_2$) surface there was no significant $ZrO_2$ on the polyimide surface, even though on the surface of polyimide there are hydrophilic surface groups present like $C-NH_2$.

Polyimide samples after 100 to 760 $ZrO_2$ cycles on native oxide, polyimide surfaces, as well as on H-plasma damaged polyimide surface and O-plasma damaged polyimide surface, were analyzed by XPS. Bis(methylcyclopentadienyl) methoxymethyl Zirconium(IV) ((CpMe)$_2$—Zr—(OMe)Me) was alternated with water ($H_2O$) in an ALD sequence at 300° C. Only a very small amount of Zr or $ZrO_2$ was detected on polyimide surfaces even after 760 cycles. The H plasma damaged surface also inhibited $ZrO_2$ growth, but the O-plasma damaged the polyimide sufficiently to allow significant deposition, albeit less than the deposition on native oxide.

$HfO_2$ deposited in an ALD sequence from Bis(methylcyclopentadienyl) methoxymethyl Hafnium(IV) ((CpMe)$_2$—Hf—(OMe)Me) alternated with water ($H_2O$) similarly exhibits high selectivity on native oxide relative to polyimides deposited with two different types of cyclical deposition sequences (PMDA-LAST and DAH-LAST). No $HfO_2$ was detected on the polyimide surfaces with either cyclical deposition sequences even after 750 cycles of $HfO_2$ deposition, while the native oxide showed measurable deposition even after fewer cycles.

XPS data also detected negligible Hf on polyimide after 150-750 ALD cycles of Bis(methylcyclopentadienyl) methoxymethyl Hafnium(IV) ((CpMe)$_2$—Hf—(OMe)Me) alternated with water ($H_2O$).

FIG. 6 shows that titanium oxide ($TiO_2$) films readily grow at very low temperatures on native oxide, and in fact grow at higher rates at low temperatures compared to high temperatures. The films were deposited using an ALD sequence alternating $TiCl_4$ with water.

FIG. 7, in contrast, shows that the same ALD sequence for depositing $TiO_2$ on polyimide surfaces, while exhibiting a similar tendency to higher growth rates at lower temperatures, demonstrated significantly lower rates of deposition at any given temperature, such that the process is relatively selective on native oxide relative to polyimide, even at lower temperatures. Moreover, at temperatures of 250° C. or above, negligible deposition was found on polyimide, such that the deposition appears to be fully selective.

In summary, data from experiments indicated high degrees of selectivity for ALD of metal oxides on native oxide relative to polyimide under a variety of temperature conditions for:

$ZrO_2$ deposited from Bis(methylcyclopentadienyl) methoxymethyl Zirconium(IV) alternated with water ($H_2O$), at temperatures of 275-325° C., selectivity relative to polyimide was maintained for more than 25 nm over native oxide $TiO_2$ deposited from $TiCl_4$ alternated with water, selectivity relative to polyimide was maintained for about 100 cycles at 250° C., and for much greater than 100 cycles at 300° C.

$HfO_2$ deposited from deposited from Bis(methylcyclopentadienyl) methoxymethyl Hafnium(IV) alternated with water ($H_2O$), at temperatures of 280° C., selectivity relative to polyimide was maintained for more than 25 nm over native oxide The skilled artisan will appreciate that the foregoing represent non-limiting conditions under which selectivity was demonstrated, and that selectivity may be maintained under a variety of other conditions not tested. However, aluminum oxide deposited by alternating TMA and water at temperatures from 50-230° C., and $ZrO_2$ from alternating Bis(methylcyclopentadienyl) methoxymethyl Zirconium (IV) alternated with ozone ($O_3$) did not demonstrate good selectivity on native oxide relative to polyimide.

Passivation Blocking Layer

As noted above, a self-assembled monolayer (SAM) can serve to inhibit deposition of an organic passivation layer, thus facilitating selective deposition of the organic passivation layer on other surfaces. The term "blocking" is thus merely a label and need not imply 100% deactivation of the organic passivation layer deposition. As noted elsewhere herein, even imperfect selectivity can suffice to obtain a fully selective structure after an etch back process.

In one embodiment, a passivation blocking layer is formed on the second surface to inhibit deposition of for comprises an SAM containing sulfur. In one embodiment, the second surface is a metallic surface. In one embodiment, the metallic surface is pretreated with acid treatments prior to SAM formation.

Experiments were conducted on vapor phase deposition of a sulfur-containing SAM in a small research and development tool (F-120® reactor). Substrates with exposed metallic surfaces, comprising electrochemically-deposited copper in the experiments, were exposed to liquid acid pretreatment of 30 seconds, using 3.5% aqueous formic acid and 3.5% aqueous HCl in various experiments; or gaps phase formic acid in 10 ten-second pulses. A sulfur-containing monomer, namely 1-dodecananethiol ($CH_3(CH_2)_{11}SH$), which can be referred to as a Thiol SAM precursor or monomer, was provided to the substrate at different temperatures ranging from 75° C. to 150° C. for various exposure times. The exposures were conducted by way of alternating vapor phase contacting phases and removal phases of 5 s each. For example, the 15 minute exposure was provided in the form of 180 five-second pulses alternated with five-second purges.

Figure 8:
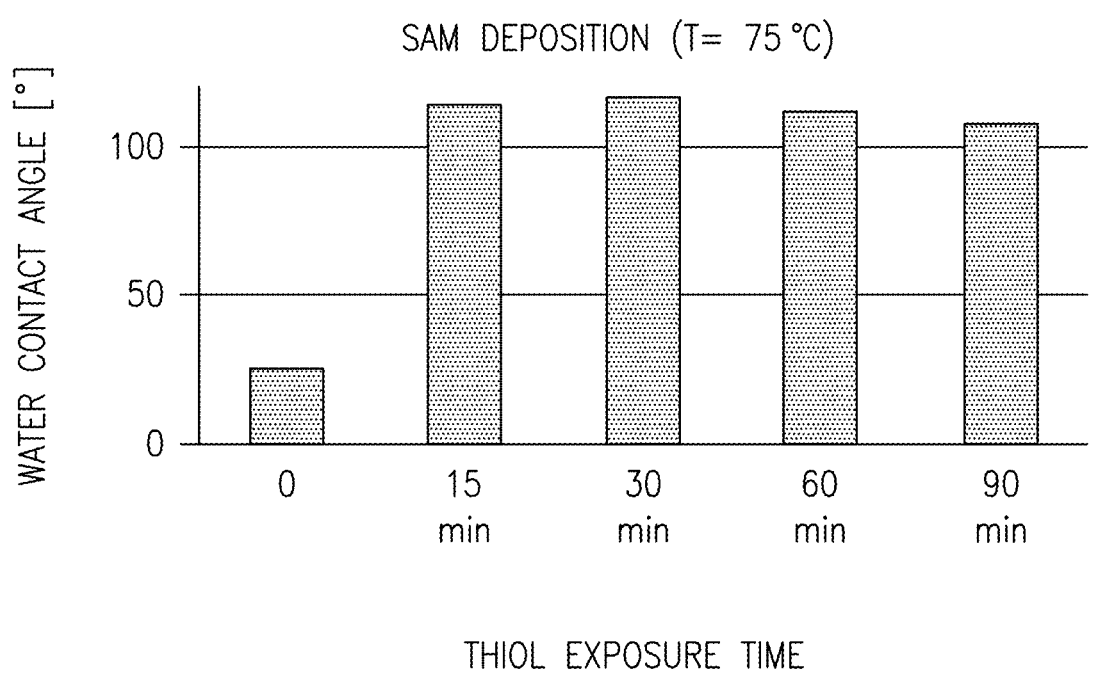
FIG. 8 is a bar graph illustrating water contact angle vs. time of exposure to a vapor precursor for a sulfur-containing self-assembled monolayer (SAM).

FIG. 8 shows the effect of time of exposure at 75° C. The measured water contact angles were greater than 100° after exposure to the vapor phase sulfur-containing monomer of 15 minutes or greater, indicating formation of an effective SAM layer. On smooth copper surfaces, water contact angles on SAMs with —$CH_3$ surface groups are about 110°, whereas on rough copper surfaces the water contact angle is even higher.

FTIR analysis of a sample with sulfur-containing SAM over copper shows that the SAM was formed by vapor deposition as described above, with the monomer source vessel heated to 55° C., and the deposition temperatures ranging from 75-150° C. The FTIR analysis indicated the presence of —$CH_2$ surface groups but not S—C surface groups, despite the fact that XPS analysis shows 5-6 atomic % of sulfur on the copper surface. Accordingly, the monomers coordinate the sulfur-containing groups with copper and present hydrophobic hydrocarbon surface groups, as indicated by high water contact angles.

Figure 9:
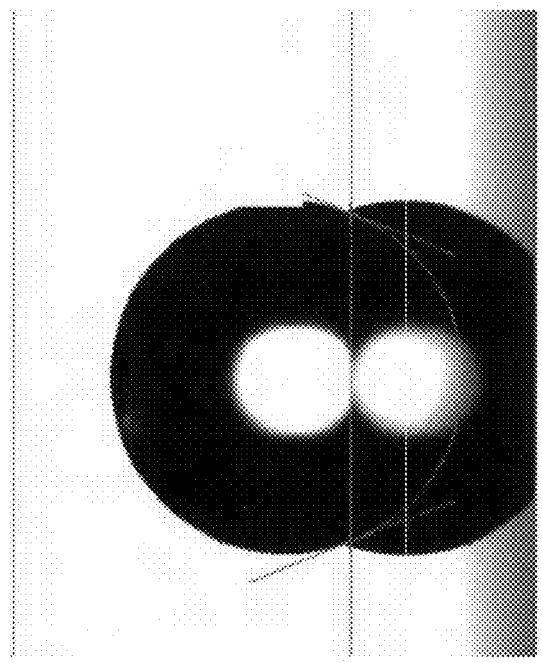
FIG. 9 is a micrograph illustrating water contact angle over a sulfur-containing SAM formed after hydrochloric acid (HCl) pretreatment.
Figure 10:
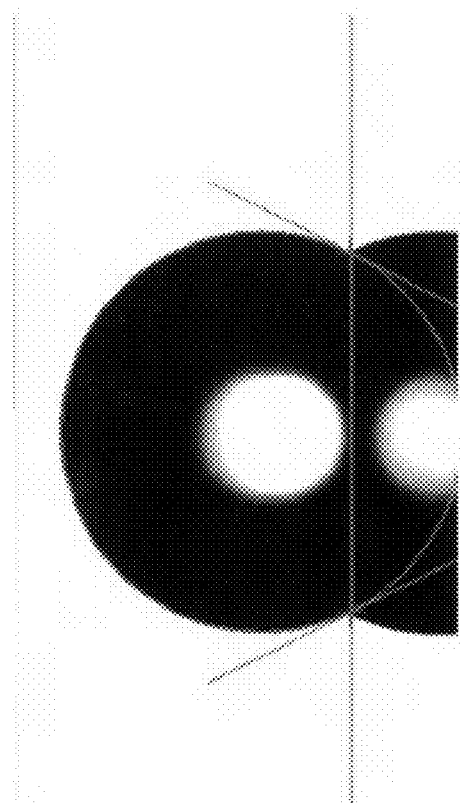
FIG. 10 is a micrograph illustrating water contact angle over a sulfur-containing SAM formed after formic acid (HCOOH) pretreatment.

FIGS. 9-10 demonstrate that high water contact angles result on the SAMs formed with both HCl liquid pretreatment (112°, FIG. 9) and HCOOH gas phase pretreatment (117°, FIG. 10).

Selective Passivation Layer Deposition Relative to Passivation Blocking Layer

FIGS. 11-15 illustrate that a passivation blocking layer can facilitate selective formation of an organic passivation layer on dielectric material relative to the passivation blocking layer.

Figure 11:
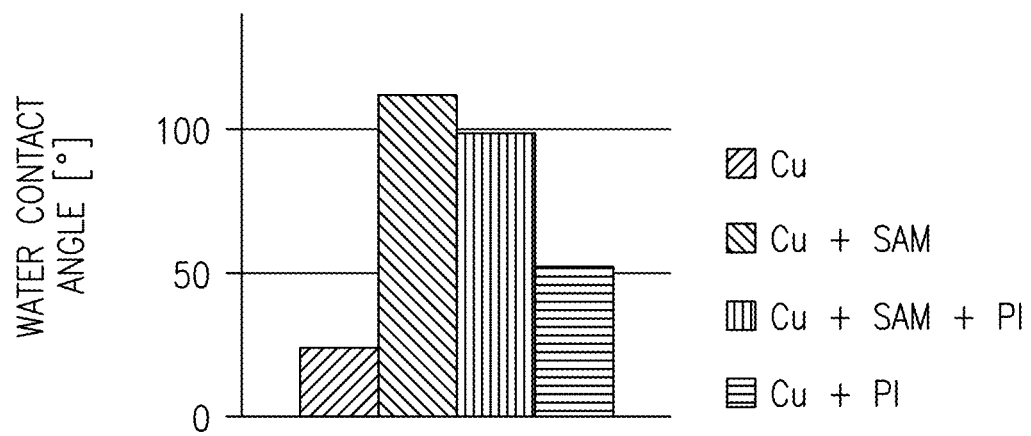
FIG. 11 is a bar graph illustrating water contact angle over a copper surface after exposure to deposition processes for sulfur-containing SAM and/or polymer.

FIG. 11 shows the results of experiments depositing polymer layers, particularly polyimide employing the processes described above, on copper and sulfur-containing SAM surfaces. The polyimide layer was deposited at 160° C. for 20 cycles, which process deposits about 4.4 nm of polyimide over native oxide. As shown, water contact angle hardly changed when the passivation blocking SAM was exposed to the polyimide deposition process, whereas the water contact angle increased when a bare copper surface was exposed to the polyimide deposition process.

Figure 12:
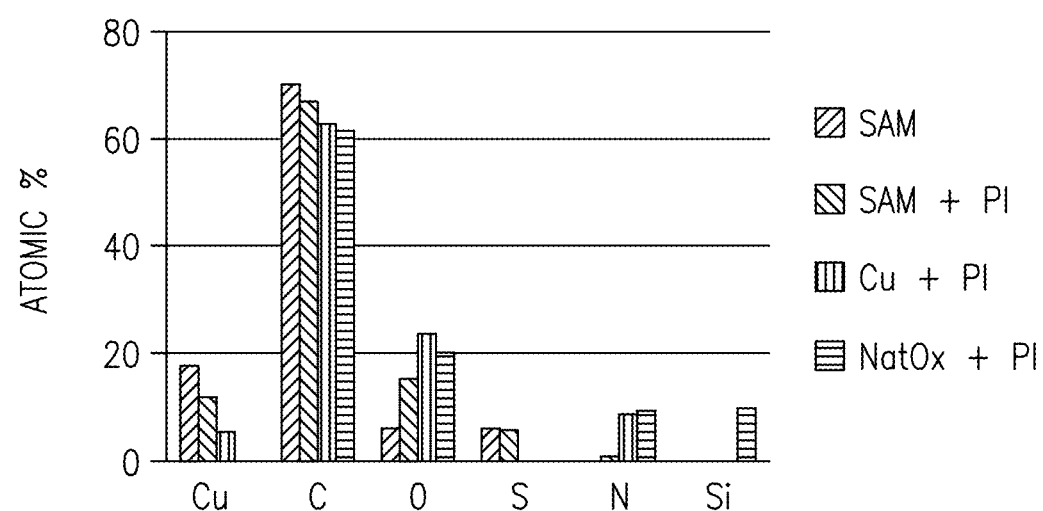
FIG. 12 is a bar graph illustrating material composition by XPS analysis for various materials after exposure to a polymer deposition process.

FIG. 12 shows the results of XPS analysis of the SAM surface, the SAM surface exposed to the polyimide deposition process, a bare copper surface exposed to the polyimide deposition process, and a native oxide surface exposed to the polyimide process. The amount of sulfur detected on the SAM surface was unchanged after exposure to the polyimide deposition process. The SAM surface had no detectable amount of nitrogen, and very little nitrogen (0.6 atomic %) after exposure to the polyimide deposition process. In contrast, both the bare copper and native oxide surfaces showed significant nitrogen content (around 10 atomic %). Both FIGS. 11 and 12 demonstrate that the sulfur-containing SAM inhibits deposition of the organic passivation layer thereover.

FIG. 13 shows XPS analysis of surfaces after exposure of various surfaces to various cycle numbers of an organic passivation layer deposition as described herein. In the experiments for FIG. 13, various cycles of polyimide were conducted at 190° C. The passivation blocking layer was a sulfur-containing SAM deposited from gas phase monomer in an F-120® reactor. The XPS analysis shows that the SAM inhibits polyimide growth thereover, whereas polyimide grows on bare copper and native oxide. Additionally, the water contact angle of the SAM was 120° prior to exposure to the polyimide deposition process, 100° after exposure to 100 cycles of the polyimide deposition process, and 95° after exposure to 250 cycles of the polyimide deposition process.

Figure 15:
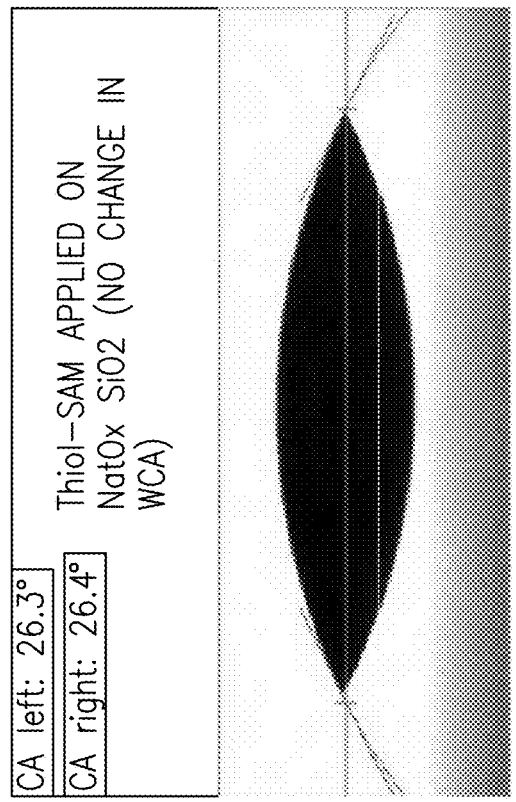
FIG. 15 is a micrograph illustrating water contact angle over an inorganic dielectric surface after exposure to the deposition process for the sulfur-containing SAM.
Figure 14:
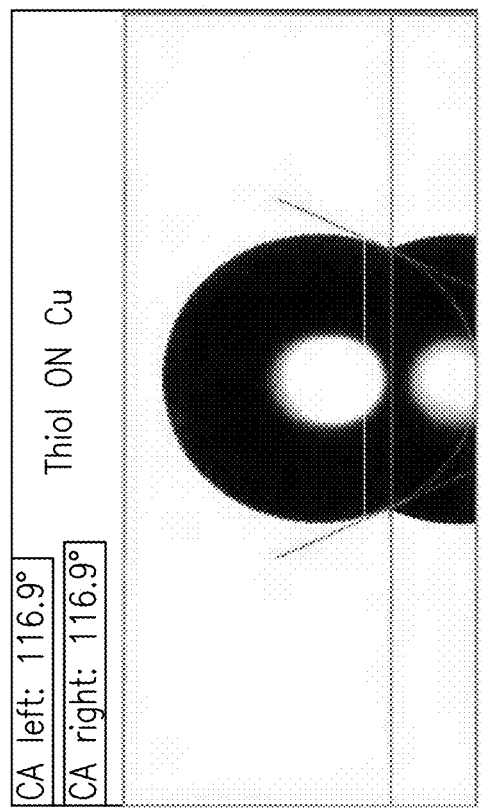
FIG. 14 is a micrograph illustrating water contact angle over a copper surface after exposure to a deposition process for a sulfur-containing SAM.

FIGS. 14 and 15 show that the sulfur-containing SAM can be selectively formed on metallic surfaces relative to dielectric surfaces. In particular, after exposure of copper to the sulfur-containing vapor phase monomer, the water contact angle on the surface was around 117°. In contrast, the water contact angle remained low (around 26°) and unchanged over a native oxide surface.

Deposition Equipment

Examples of suitable reactors that may be used in the selective deposition processes described herein include commercially available ALD equipment such as the F-120® reactor, Pulsar® reactor, such as a Pulsar 3000® or Pulsar 2000®, and Advance® 400 Series reactor, available from ASM America, Inc. of Phoenix, Ariz. and ASM Europe B.V., Almere, Netherlands. In addition to these ALD reactors, many other kinds of reactors capable growth of organic passivation layers, including CVD reactors, VDP reactors, and MLD reactors, can be employed.

The selective dielectric on dielectric deposition described herein with respect to FIGS. 1A-1D could be performed in up to five processes. (1) pretreatment, (2) selective organic passivation layer deposition on the first surface; (3) partial etch back, also referred to as a "clean-up" etch, of any organic material from over the second surface, (4) selective dielectric deposition on the second surface; and (5) removal of the organic passivation layer from over the first surface.

In one embodiment, tools for the sequence can be minimized by combining the (2) selective organic passivation layer deposition and the (3) partial etch-back in one chamber, and using a clustered chamber to conduct the (4) selective dielectric deposition on the second surface. The pretreatment can either be performed on another platform (e.g., wet bench) or omitted through tuning of certain recipes. The organic passivation layer removal may be performed in a separate ashing tool, such as those often used for removal of photoresist and other organic materials, or in the deposition chamber using the same or a similar chemistry used for the partial etch back of organic material. Thus, the deposition stages and intervening etch back can be performed in platform that comprises 2 reactors, including either 4 or 8 processing stations, for the polyimide deposition and etch back; and 2 reactors, including either 4 or 8 processing stations, for the selective dielectric deposition.

Figure 16:
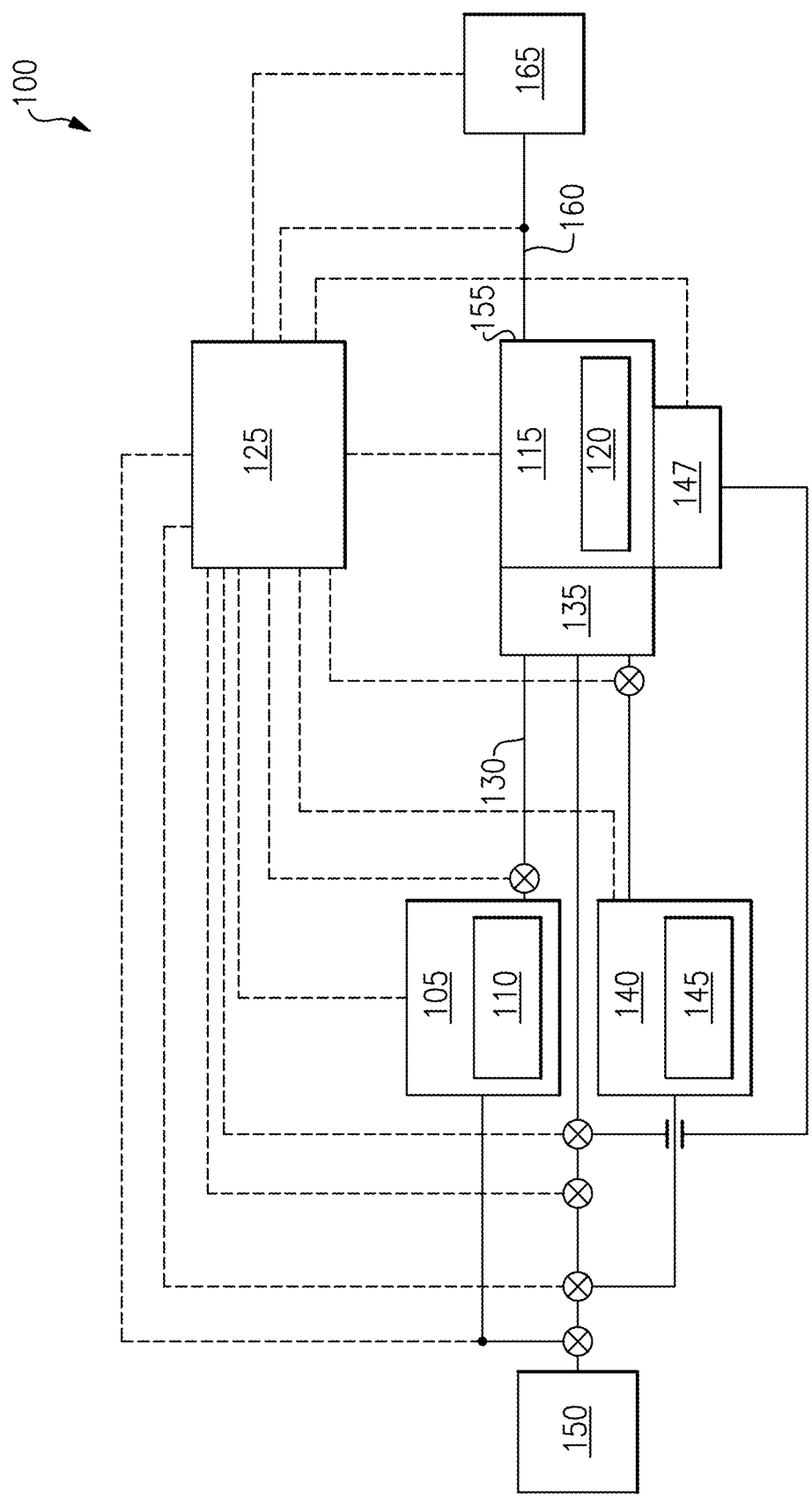
FIG. 16 is a schematic illustration of an apparatus configured for selective deposition of a polymer layer and in situ etch back from undesired surfaces.

Referring to FIG. 16, an apparatus 100 is provided for conducting polymer deposition and organic material etch back in situ. The apparatus 100 includes a reaction chamber defines a reaction space 115 configured to accommodate at least one substrate 120. The apparatus 100 also includes a first reactant vessel 105 configured for vaporizing a first organic reactant 110 to form a first reactant vapor. A gas line 130 fluidly connects the first reactant vessel 105 to a reaction space 115 within which a substrate 120 can be accommodated. The gas line 130 is configured to selectively transport the first reactant vapor from the first reactant vessel 105 to an inlet manifold 135 to the reaction space 115. The apparatus 100 also includes a second reactant vessel 140 holding a second reactant 145. In some embodiments, the second reactant 145 is naturally in a gaseous state; in other embodiments, the second reactant vessel 140 is also configured to vaporize the second reactant 145 from a natural liquid or solid state. The second reactant vessel 140 is in selective fluid communication with the inlet manifold 135. The inlet manifold 135 can include a shared distribution plenum across the chamber width, in a showerhead or cross-flow configuration, or can maintain separate paths to the reaction space 120 for separate reactants. For sequential deposition embodiments, it can be desirable to keep the reactant inlet paths separate until introduction to the reaction space 115 in order to avoid reactions along the surface of common flow paths for multiple reactants, which can lead to particle generation. The apparatus can in some embodiments include additional vessels for supply of additional reactants.

The illustrated apparatus 100 also includes a plasma source 147. Although illustrated schematically as if attached to the reaction space 115, the skilled artisan will appreciate that the plasma source maybe be a remote plasma source external to the reaction space 115, or may be an in situ plasma generator for direct plasma generation (e.g., capacitively coupled) within the reaction space 115. Alternatively or additionally, an ozone generator may be employed for removal of organic material, as described below with respect to FIGS. 24-25 (e.g., for partial etch back after selective deposition of organic material, for removal of an organic passivation layer, and/or for chamber cleaning).

One or more additional gas source(s) 150 is (are) in selective fluid communication with the first reactant vessel 105, the reaction space 115 and the plasma source 147 (to the extent separate from the reaction space 115). The gas source(s) 150 can include inert gases that can serve as purge and carrier gases, and other gases (e.g., Ar/H$_2$) for plasma etch back. Inert gas supply from the gas source(s) can also be in selective fluid communication with the second reactant vessel 140, as shown, and any other desired reactant vessels to serve as a carrier gas.

A control system 125 communicates with valves of the gas distribution system in accordance with organic passivation layer deposition and etch back methods and described herein. The control system 125 typically includes at least one processor and a memory programmed for desired processing. For sequential deposition processing, the valves are operated in a manner that alternately and repeatedly exposes the substrate to the reactants, whereas for simultaneous supply of the reactants in a conventional CVD process, the valves can be operated to simultaneously expose the substrate to mutually reactive reactants.

An exhaust outlet 155 from the reaction space 115 communicates through an exhaust line 160 with a vacuum pump 165. The control system 125 is configured to operate the vacuum pump 165 to maintain a desired operational pressure and exhaust excess reactant vapor and byproduct through the exhaust outlet 155.

The control system 125 can also control pressure and temperature in various components of the apparatus 100. For example, the control system can be programmed to keep the substrate 120 at a suitable temperature for the processes being performed. In one embodiment, control system 125 is also configured to maintain the first reactant 110 in the first reactant vessel 105 at a temperature A, and is configured to maintain the substrate 120 in the reaction space 115 at a temperature B, where the temperature B is lower than the temperature A. In an embodiment, the control system 125 or a separate temperature control is also configured to maintain the gas line 130 at a temperature C, where the temperature C is higher than the temperature A.

Accordingly, the apparatus 100 includes source vessels 105, 140 for vaporizing and supplying the reactants described above for polymer deposition (e.g., one vessel for a diamine and one vessel for a dianhydride precursor). The plasma source 147 communicates with gas source(s) 150 that include a source of H$_2$ and inert gas (e.g., noble gas, particularly argon). Additionally, the apparatus 100 includes a control system 125 programmed to supply gases and operate the plasma source in a manner to perform the polymer deposition described herein, as well as a hydrogen plasma etch back. The control system 125 preferably maintains the substrate 120 in a range of 180° C. to 220° C., more particularly about 190° C. to 210° C., such that the polymer deposition and etch back can be conducted at the same temperature sequentially, without removing the substrate 120 from the reaction space 115. The etch back may be from 1-20 seconds, particularly from 5-15 seconds. As an example, a 10 second etch using Ar/H$_2$ plasma at 200° C. was found to give ~4.5 nm etching of a polyimide layer. As another example, a pulsed ozone (O$_3$) etch process may be used for the etch back process, similar to the high O$_3$ concentration etch process for removal of the passivation layer and chamber cleaning as described below with reference FIGS. 24 and 25. As the skilled artisan will appreciate, process conditions may be modified for slower and more controlled etching for the purpose of partial etch back to minimize overetching of the desired passivation layer on the first surface. For example pulse durations can be lowered, or a single pulse may suffice, O$_3$ concentration can be lowered, and/or temperatures can be lowered relative to the polymer removal process described below with respect to FIG. 24. For example, the 125° C. process of FIG. 24 may be sufficient mild to serve for the partial etch back of any organic material from the surface on which organic material is to be minimized. Indeed, FIG. 25 demonstrates how etch rate depends strongly upon etch temperature for O$_3$ etching of polymer. Combining the selective deposition of the passivation layer with the partial etch back would not increase process time of the single chamber much, as the etch process is typically very short.

Figure 24:
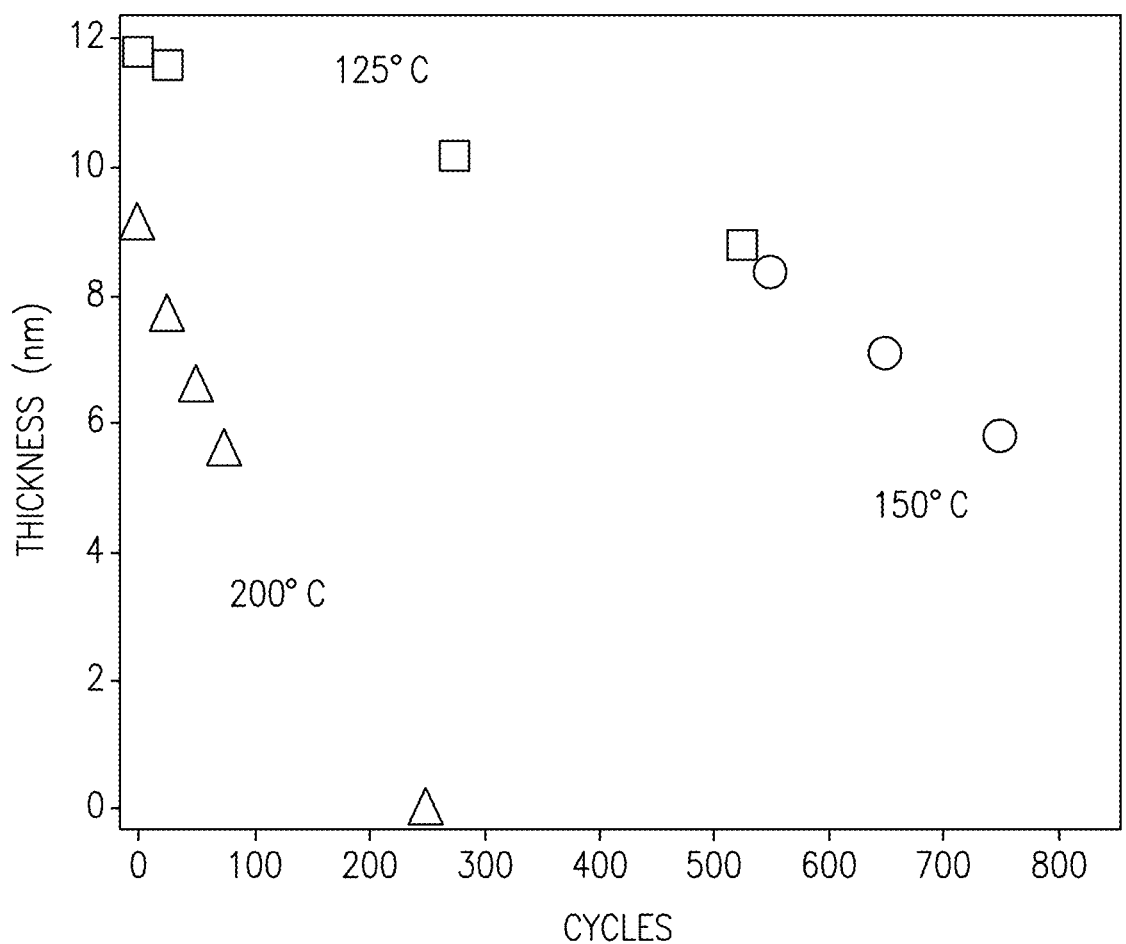
FIG. 24 is a graph illustrating polymer thickness as a function of etching pulses for three different etching temperatures using $O_3$ as an etchant.
Figure 25:
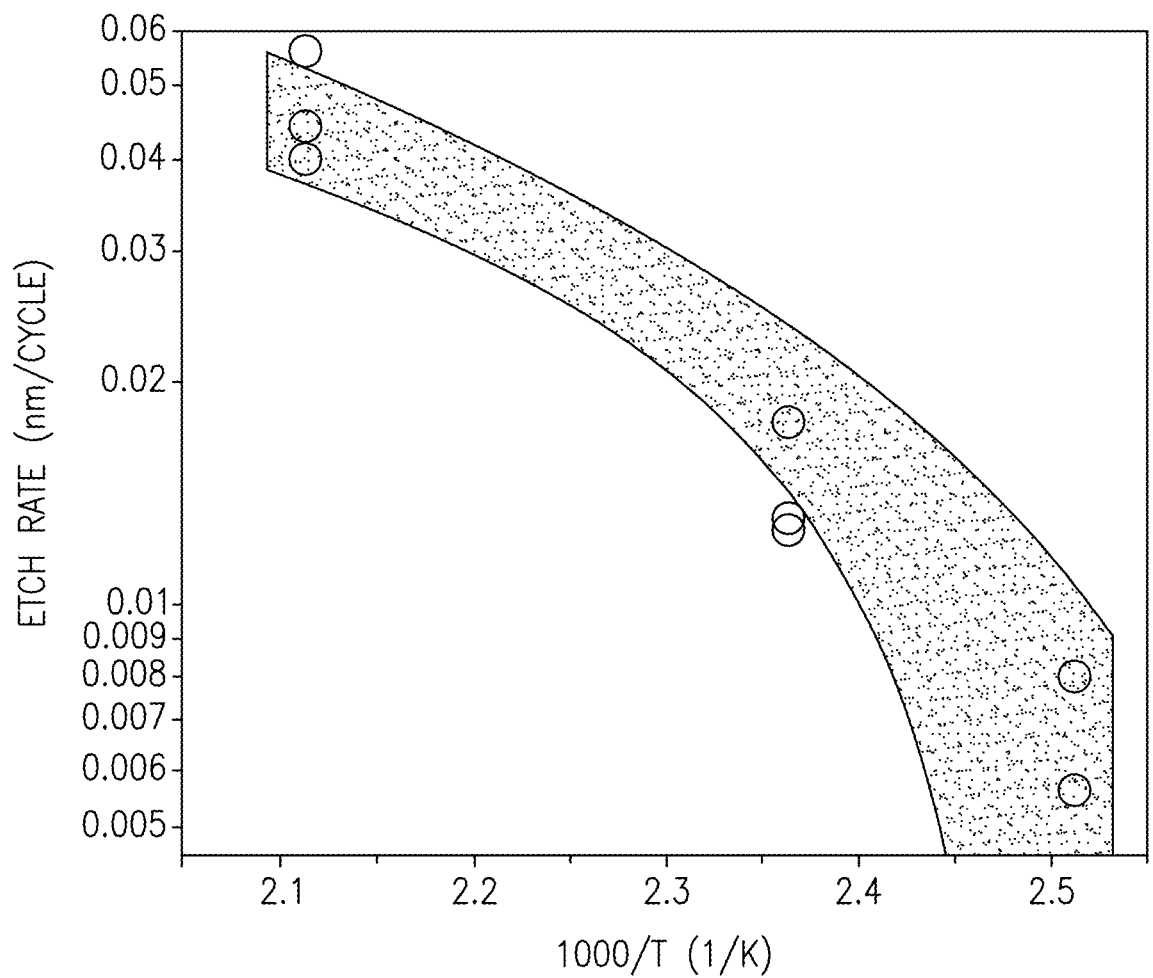
FIG. 25 is a graph illustrating the Arrhenius plot of etch rate as a function of inverse temperature for $O_3$ etching of a polymer.

The same equipment and etchants can also be used for removal of the passivation layer. For example, a high O$_3$ concentration etch process may be used, wherein the high O$_3$ concentration etch process is performed at 9 Torr, with 1 sec pulse/1 sec purge of O$_3$, an O$_3$ flow of 750 sccm, and an N$_2$ dilution flow of 1.2 slm, at 125° C. was found to give ~0.3 nm/min etching of a polyimide layer, as seen in FIG. 24. As an example, a high O$_3$ concentration etch process may be used, wherein the high O$_3$ concentration etch process is performed at 9 Torr, with 1 sec pulse/1 sec purge of O$_3$, an O$_3$ flow of 750 sccm, and an N$_2$ dilution flow of 1.2 slm, at 150° C. was found to give ~2.4 nm/min etching of a polyimide layer, as seen in FIG. 24. An activation energy of ~0.4 eV was calculated for a polyimide layer etch using O$_3$/N$_2$ from the graph shown in FIG. 24, as shown in the Arrhenius plot FIG. 25.

Ar/H$_2$ plasma or O$_3$ etching could also be used as a chamber etch to keep the reaction space 115 clean. As an example, a chamber etch was performed in an ASM Pulsar 3000 chamber with about 48 hours of O$_3$/N$_2$ exposure with an O$_3$ flow of 1.2 slm, inner chamber pressure of about 9 Torr, an O$_2$ flow of 1 slm (i.e., 2.5 V), N$_2$ flow of 0.020 slm (0.5V) and O$_3$ concentration set point of 250 g/Nm3 (power about 24% of the maximum value). The processing time for such a chamber etch may be shortened by optimizing the O$_3$ concentration and the O$_3$ injection point into the chamber.

The apparatus 100 configured for polymer deposition and etch back, could be a showerhead reactor with solid source vessels for DAH (with a vaporization temperature of about 40° C.) and PMDA (with vaporization temperature of about 170° C.). In one embodiment, the plasma source 147 comprises an in situ direct plasma (e.g., capacitively coupled) apparatus with argon and H$_2$ supply for the in situ etch back. In another embodiment, the apparatus 100 may be a cross-flow reactor rather than a showerhead reactor, but still having the above-noted with solid source vessels 105, 140 and direct plasma capability. In another embodiment, the plasma source 147 comprises a remote plasma is coupled to the reaction space 115 to supply plasma produces from an $Ar/H_2$ plasma. In another embodiment, the plasma source 147 could be replaced with an ozone generator coupled to the reaction space 115. The remote plasma or ozone generator could, for example, be connected to a showerhead reactor.

The polymer deposition apparatus 100 desirably includes self-cleaning capability to keep the reaction space 115 and exhaust lines 160 clean after multiple depositions. In some embodiments, the in situ or remote $Ar/H_2$ plasma source 147 noted above for etch back can be adapted for periodic chamber cleaning, possibly under higher power or temperatures, as it can operate in the absence of production substrates and only periodically (rather than every wafer). Alternatively, the polymer deposition chamber can be provided with a remote plasma supplied with $NF_3$ etch, or an ozone supply to conduct periodic chamber cleans, as described above with respect to FIGS. 24 and 25. In some embodiments, an $O_3/N_2$ supply can be adapted for periodic chamber cleaning, possibly under higher power or temperatures compared to the polymer partial etch back or removal processes, as the chamber clean process operates in the absence of production substrates and only periodically (rather than every wafer).

Line Edge Position

Figure 17:
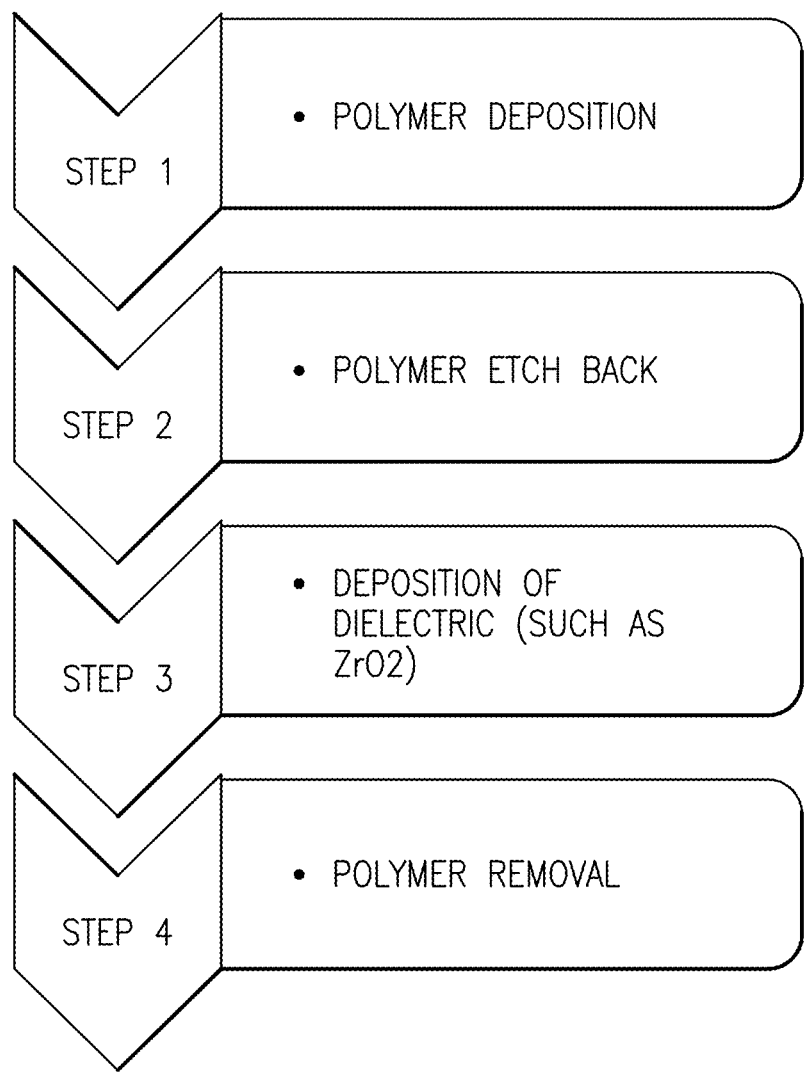
FIG. 17 is a flow diagram generally illustrating processes for selectively depositing a dielectric layer on second surfaces after selective passivation of first surfaces with organic material in accordance with embodiments.

Referring to FIG. 17 and in some embodiments, as described above, selective deposition on a second surface can be accomplished by selective passivation of a first surface following selective deposition of a dielectric, such as $ZrO_2$, on the second surface. In the illustrated flow chart, the first surface can be metallic (e.g, an embedded metal feature in an integrated circuit interlevel dielectric, or ILD), and the second surface can be dielectric (e.g., the ILD). The passivation can comprise a polymer or other organic material selectively deposited on the first surface relative to the second surface of a part in Step 1. Subsequently, a polymer etch back, sometimes referred to as a "clean-up" etch to perfect the selectivity, is performed to remove polymer that may have deposited on the second surface in Step 2, without removing all of the polymer from the first surface. As the polymer acts as a passivation layer, a dielectric material is selectively deposited on the second surface in Step 3. Any number of suitable dielectric materials may be used in Step 3. In some embodiments, the dielectric material may be selected from $ZrO_2$ and other metal oxides, such as transition metal oxides or aluminum oxide, or other dielectric oxides including mixtures having etch selectivity over $SiO_2$-based materials or slow etch rate in conditions in which $SiO_2$-based materials are etched. Even though some such metal oxides may have high k values, particularly higher than 5 or even higher than 10, they are thin, are located in positions that avoid significant parasitic capacitance in metallization structures, and advantageously allow for masking surfaces against selective etching of silicon oxide materials. In other embodiments, the dielectric can be a silicon oxide based material, but may be thicker to serve as an etch mask as described herein. In Step 4 of FIG. 17, the polymer passivation is removed from the first surface.

Figure 18:
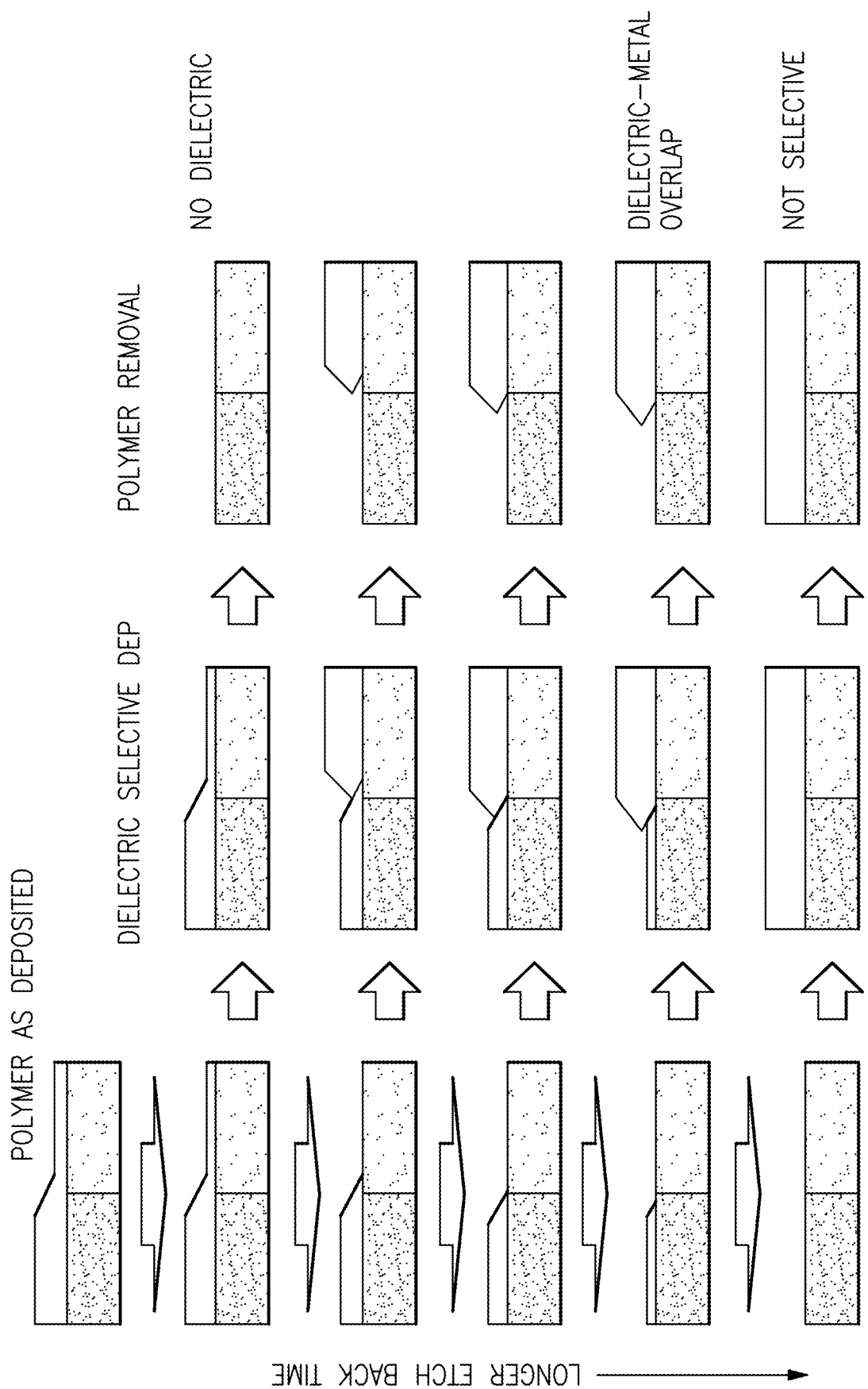
FIG. 18 is a flow diagram utilizing schematic cross sections of a portion of a substrate having first and second surfaces of different compositions, and generally illustrates the effect that the extent of etch back on the passivation material has on the relationship of the dielectric layer formed with the interface of the first and second surfaces.

FIG. 18 illustrates the effect that etch back time for removal of the passivation (e.g., polymer or other organic layer) from the second surface has on the dielectric layer formed. More specifically, the position of the edge of the selectively formed dielectric layer can be controlled relative to the boundary between the underlying metallic and dielectric surfaces by selecting the extent of the intermediate polymer etch back process. In an embodiment, polymer is deposited on the first surface relative to the second surface of a part, as described previously in Step 1 of FIG. 17, as seen in the $1^{st}$ row of illustrations in FIG. 18. As seen in the polymer as deposited illustration, preferential deposition of the polymer on the first surface creates a thicker polymer layer surface over the first surface, with a relatively thin polymer layer over the second surface, consequently having a downwardly sloped polymer thickness from the first surface to the second surface at the first-second surface boundary. Subsequently, a polymer etch back, as described previously in Step 2 of FIG. 17, may be performed for varying durations (or for the same durations with different etch rates, such as by different temperatures or etchant concentrations, or for different durations and different etch rates) to control the thickness and shape of the polymer layer, as seen in the $2^{nd}$ through $6^{th}$ rows of the first column of illustrations in FIG. 18. The etch back may be isotropic or anisotropic. In some embodiments, a polymer etch time is minimal and the polymer etch does not remove sufficient polymer to expose the second surface, as seen in the $2^{nd}$ row of illustrations in FIG. 18. In this case, the subsequent selective dielectric deposition does not work because both the first and second surfaces are covered with the passivation layer, and even if a small amount of dielectric deposits it will be removed by a lift-off process with removal of the passivation layer. In some embodiments, a polymer etch time is selected to remove the majority of the polymer formed from the second surface, but leave a polymer layer leading edge that extends over the first-second surface boundary onto the second surface, as seen in the $3^{rd}$ row of illustrations in FIG. 18. In this case, subsequent selective deposition of the dielectric and removal of the polymer leaves a gap between the deposited dielectric edge and the first-second surface boundary. In some embodiments, a polymer etch time is selected to remove the polymer from the second surface, and a polymer layer edge is left aligned with the first-second surface boundary, as seen in the $4^{th}$ row of illustrations in FIG. 18. In this case, subsequent selective deposition of the dielectric and removal of the polymer leaves the bottom surface edge of deposited dielectric aligned with the first-second surface boundary. In some embodiments, a polymer etch time is selected to remove the polymer from the second surface and a portion of the polymer from the first surface, and a first gap exists between a polymer layer leading edge and first-second surface boundary, as seen in the $5^{th}$ row of illustrations in FIG. 18. In this case, subsequent selective deposition of the dielectric and removal of the polymer leaves the deposited dielectric extending over the first-second surface boundary and overlapping with the first surface. If the polymer etch time is performed for an extended period of time and the polymer etch completely removes the polymer from both the first surface and the second surface, as seen in the $6^{th}$ row of illustrations in FIG. 18, then subsequent dielectric deposition is not selective.

Thus, selective dielectric selective deposition and partial polymer etch back, as described previously in Steps 3 and 4 of FIG. 17, may be performed to create various relationships between the edge of the selectively deposited dielectric layer on the second surface and the interface between the first and second surfaces, depending on the extent of the passivation etch back following its selective deposition, as seen in the right-most images of the $2^{nd}$ through $6^{th}$ rows of the third column of illustrations in FIG. 17. In some embodiments, no dielectric layer is formed because the polymer layer passivated the second surface, as seen in the $2^{nd}$ row of illustrations in FIG. 18. In some embodiments, a gap exists between a dielectric on the second surface first surface, as seen in the 3$^{rd}$ row of illustrations in FIG. 18. In some embodiments, the dielectric layer edge is aligned with the first-second surface boundary, as seen in the 4$^{th}$ row of illustrations in FIG. 18. In some embodiments, the dielectric layer overlaps the first surface, as seen in the 5$^{th}$ row of illustrations in FIG. 18. In some arrangements, the dielectric layer forms on both the first surface and the second surface because no polymer layer passivated the first surface, as seen in the 6$^{th}$ row of illustrations in FIG. 18.

Figure 19:
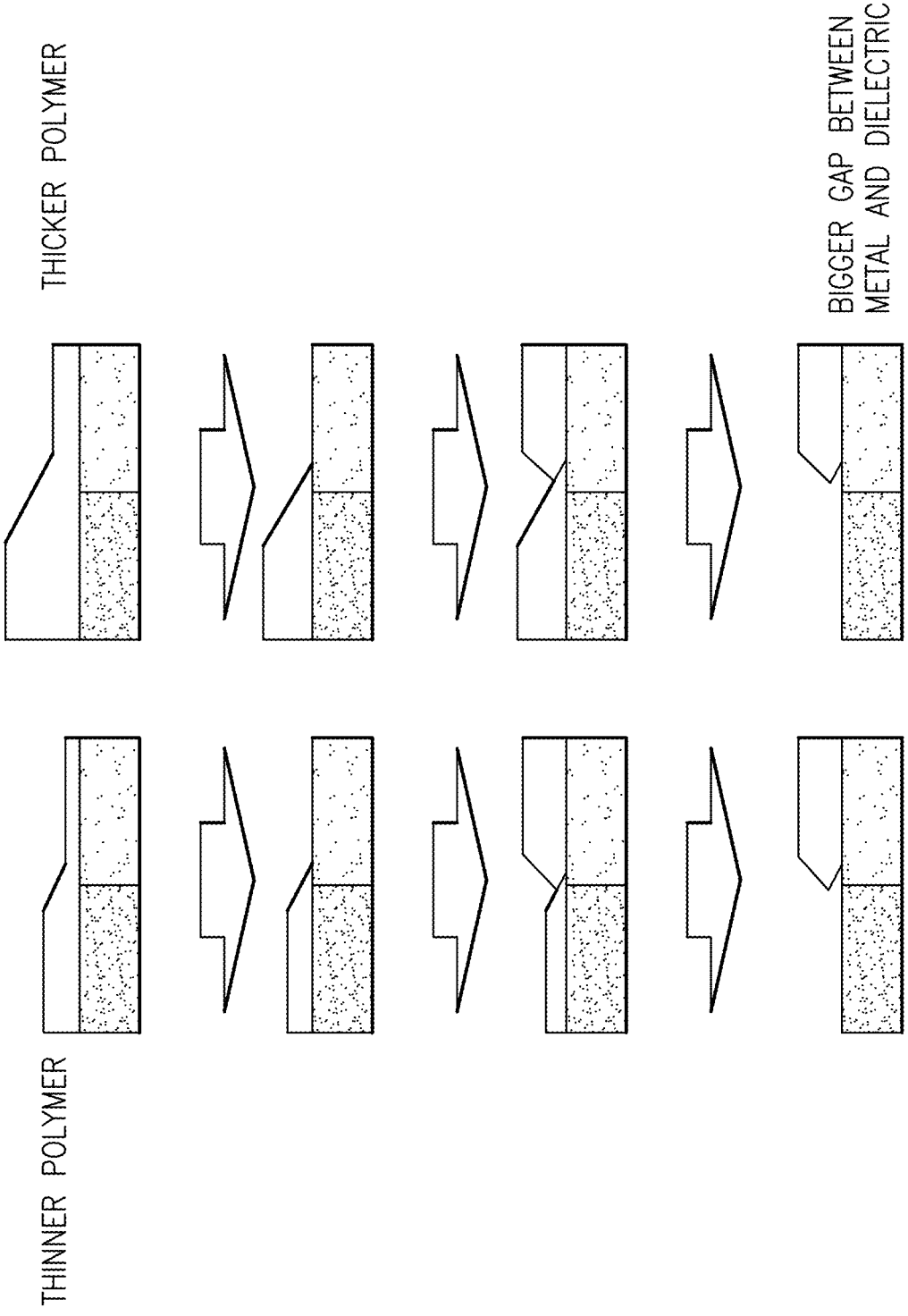
FIG. 19 is a flow diagram utilizing schematic cross sections of a portion of a substrate having first and second surfaces of different compositions, and generally illustrates the effect passivation layer thickness has on the relationship of the dielectric layer formed with the interface of the first and second surfaces.

FIG. 19 illustrates the effect that passivation layer deposition thickness has on the dielectric layer formed. More specifically, the position of the edge of the selectively formed dielectric layer can be controlled relative to the boundary between the underlying metallic and dielectric surfaces by selecting the thickness of the intermediate polymer passivation layer. As passivation layer deposition thickness increases, the passivation layer thicknesses on both the first surface and second surface are increased. However, because the passivation layer is selectively deposited on the first surface, the passivation thickness over the second surface increases less than the passivation layer thickness over the first surface. Therefore, a passivation etch back, dielectric deposition and passivation removal will create selective dielectric layers with varying positions relative to the first-second surface boundary. In some embodiments, a passivation layer is deposited which produces a gap between a selectively deposited dielectric layer edge and the first-second surface boundary, as seen in as seen in the 1$^{st}$ column of illustrations in FIG. 19. In some embodiments, a thicker polymer layer is deposited which produces a larger gap between a selectively deposited dielectric layer edge and the first surface, as seen in as seen in the 2$^{nd}$ column of illustrations in FIG. 19.

Figure 20:
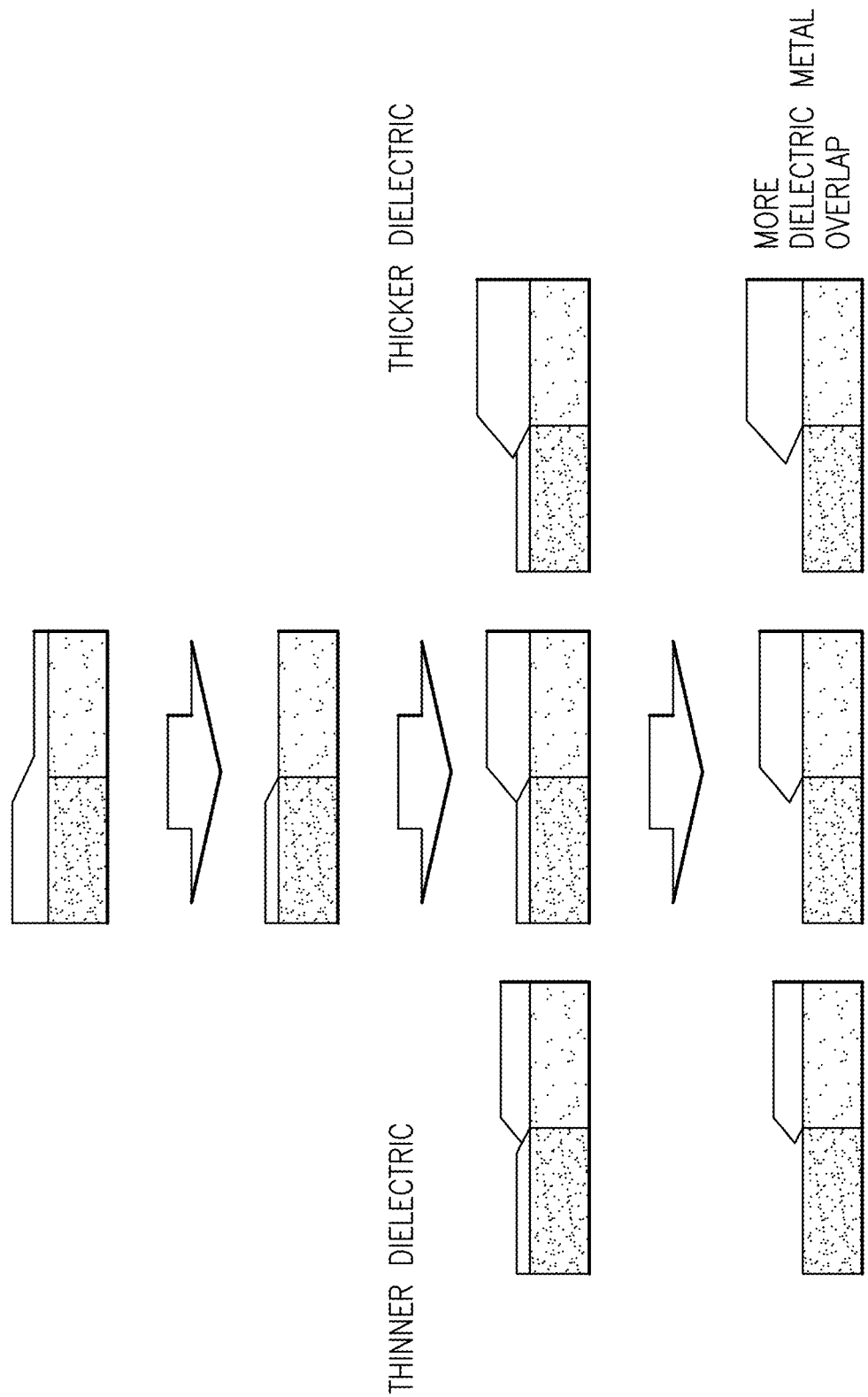
FIG. 20 is a flow diagram utilizing schematic cross sections of a portion of a substrate having first and second surfaces of different compositions, and generally illustrates the effect dielectric thickness has on the relationship of the dielectric layer formed with the interface of the first and second surfaces.

FIG. 20 illustrates the effect selectively deposited dielectric thickness has on the relative positions of the dielectric layer formed and the first-second surface boundary. More specifically, the position of the edge of the selectively formed dielectric layer can be controlled relative to the boundary between the underlying metallic and dielectric surfaces by selecting the thickness of the selective dielectric layer. As dielectric deposition thickness selectively deposited on the second surface increases, the dielectric overhang edge increasingly extends further past the first-second surface boundary. In some embodiments, a dielectric layer is deposited which produces a certain overhang structure, as seen in as seen in the 1$^{st}$ column of illustrations in FIG. 20. In some embodiments, a thicker dielectric layer is deposited which produces a greater overhang, as seen in as seen in the 2$^{nd}$ column of illustrations in FIG. 20. In some embodiments, an even thicker dielectric layer is deposited which produces an even greater dielectric overhang over the first surface, as seen in as seen in the 3$^{rd}$ column of illustrations in FIG. 20. For certain subsequent processes, such as anisotropic processing (e.g., anisotropic reactive ion etching), the extent of the overhang can shadow portions of the first surface and protect against the subsequent processing.

Thus, in some embodiments, though largely selectively formed over the dielectric surface similar to FIG. 1D, the dielectric layer is selectively deposited to produce an overhang and/or overlap with the metallic feature. In some embodiments, the dielectric layer does not comprise an overhang or overlap, and the edge of the selectively deposited dielectric on dielectric can be aligned with the edge of the metallic feature or there can be a gap between the edge of the selectively deposited dielectric layer and the metallic feature. Because of the selective deposition techniques taught herein, the selectively deposited dielectric layer may have features characteristic of selective deposition, without the use of traditional masking and etching to pattern the dielectric layer. For example, the edge of the dielectric layer may be tapered with a slope of less than 45 degrees, rather than having a vertical or steeply sloped sidewall, as is typical of photolithographically patterned layers. This characteristic etch profile may remain whether or not the selectively deposited layer was subjected to a clean-up etch, or partial etch back.

Figure 21A:
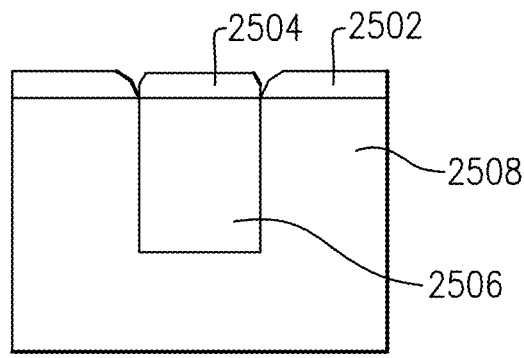
FIG. 21A is a schematic cross section of a portion of substrate having flush first and second surfaces of different compositions with passivation and dielectric layers selectively deposited thereover, respectively.

FIGS. 21A-21D illustrate how topography can affect the relationship between a selectively deposited dielectric and the boundary between first and second surfaces FIG. 21A illustrates a planar structure that results in an edge of a selectively deposited dielectric 2502 being aligned with the first-second surface boundary. The first surface that is passivated by a passivation layer 2504, for example a polymer material, can be defined by a metallic material, such as embedded metal 2506, and the second surface can be defined by a low k dielectric, such as an interlevel dielectric (ILD) 2508. The passivation layer 2504 is selectively deposited over the first surface and the dielectric layer 2502 is selectively deposited over the second surface, wherein the edge of the dielectric layer 2502 is aligned with the first-second surface boundary.

Figure 21B:
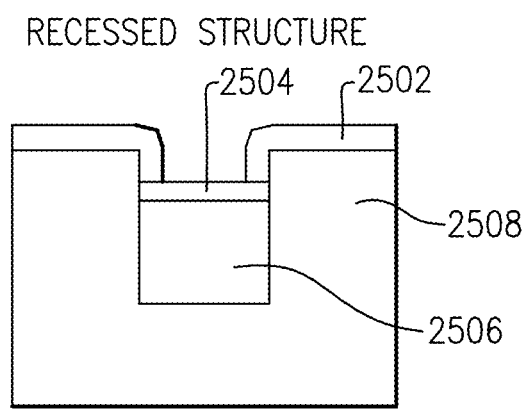
FIG. 21B is a schematic cross section of a portion of substrate having first and second surfaces of different compositions with the first surfaces recessed relative to the second surfaces and passivation and dielectric layers selectively deposited thereover, respectively.

FIG. 21B illustrates a recessed first surface relative to the second surface. As above, the first surface can comprise a metallic material 2506 embedded and recessed with in a low k dielectric material 2508 that defines the second surface. The passivation layer 2504 is selectively formed over the first surface within the recess. The dielectric layer 2502 is disposed over the second surface and over the recess walls, wherein the edge of the dielectric layer 2502 meets the surface of the passivation layer 2504. Removal of the passivation layer 2504 will result in the dielectric layer 2502 selectively formed on the second surface but overlapping with the first surface (e.g., metallic feature 2506).

Figure 21C:
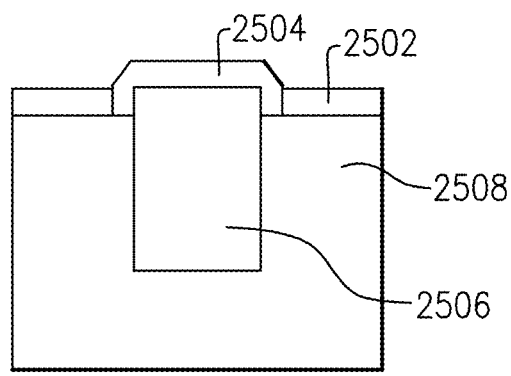
FIG. 21C is a schematic cross section of a portion of substrate having first and second surfaces of different compositions with first surfaces elevated relative to the second surfaces and with passivation and dielectric layers selectively deposited thereover, respectively.

FIG. 21C illustrates an elevated first surface with respect to the second surface. The first surface can be defined by a metallic material 2506 embedded in and protruding above the second surface, which can be a low k dielectric material 2508. The passivation layer 2504 is disposed over the first surface, including protruding side walls, and thus at least partially disposed over the second surface. The dielectric layer 2502 is disposed over the second surface but is spaced from the first surface by the thickness of the passivation material 2504 on the side walls. Thus, after removal of the passivation layer 2504, there is a gap between the dielectric layer 2502 and the first surface (e.g., protruding metallic feature 2606)

Figure 21D:
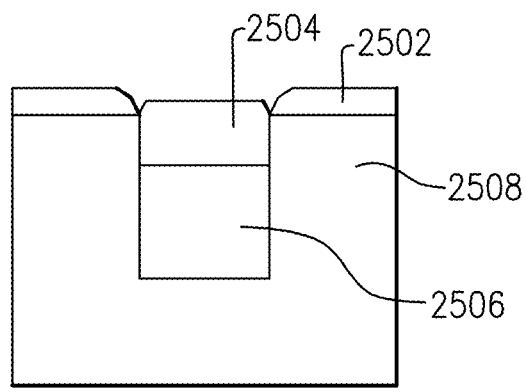
FIG. 21D is a schematic cross section of a portion of substrate having first and second surfaces of different compositions with first surfaces recessed relative to the second surfaces and with passivation and dielectric layers selectively deposited thereover, respectively.

FIG. 21D illustrates a recessed first surface of some embodiments, similar to FIG. 21B but with a thicker passivation layer 2504 filling the recess. In this case, after removal of the passivation layer 2504, a gap is left between the selectively deposited dielectric layer 2502 on the second surface and the first surface. In this case, the gap takes the form of a vertical sidewall of the second surface, which is then exposed to subsequent processing.

Thus, FIGS. 18-21D illustrate variables that can be adjusted to tune the position of a selectively deposited dielectric 2502 (e.g., on dielectric second surface) relative to an interface between the first and second surfaces (e.g., between a metallic feature 2506 and low k dielectric 2508). In particular, FIG. 18 shows how extent or time for passivation layer etch back can affect the relative positions; FIG. 19 shows how thickness of the selectively deposited passivation layer can affect the relative positions; FIG. 20 shows how thickness of the selectively deposited dielectric layer can affect the relative positions; and FIGS. 21A-21D show how topography of the first and second surfaces can affect the relative positions. These variables can thus be adjusted to affect whether the selectively deposited dielectric on the second surface is aligned with, has a gap relative to, or overlaps the first surface.

Example Applications

Figure 22A:
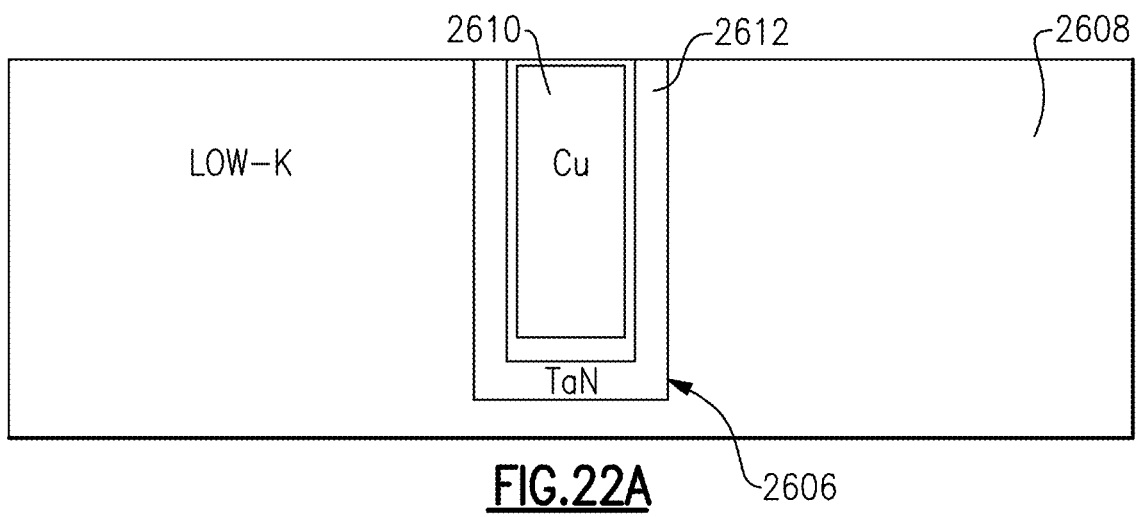
FIG. 22A is a schematic cross section of a portion of a substrate with an embedded metal feature.

FIGS. 22A-22E illustrate a device and process of creating a device, in some embodiments, with improved electrical isolation. FIG. 22A illustrates a partially fabricated integrated circuit with an embedded metallic feature 2606 that defines a first surface which is flush with a second surface, defined by the surrounding low k material 2608, similar to the planar structure shown in FIG. 21A. The metallic feature comprises a first material further comprising Cu 2610 and TaN barrier material 2612 positioned within a first low-k dielectric material 2608.

Figure 22B:
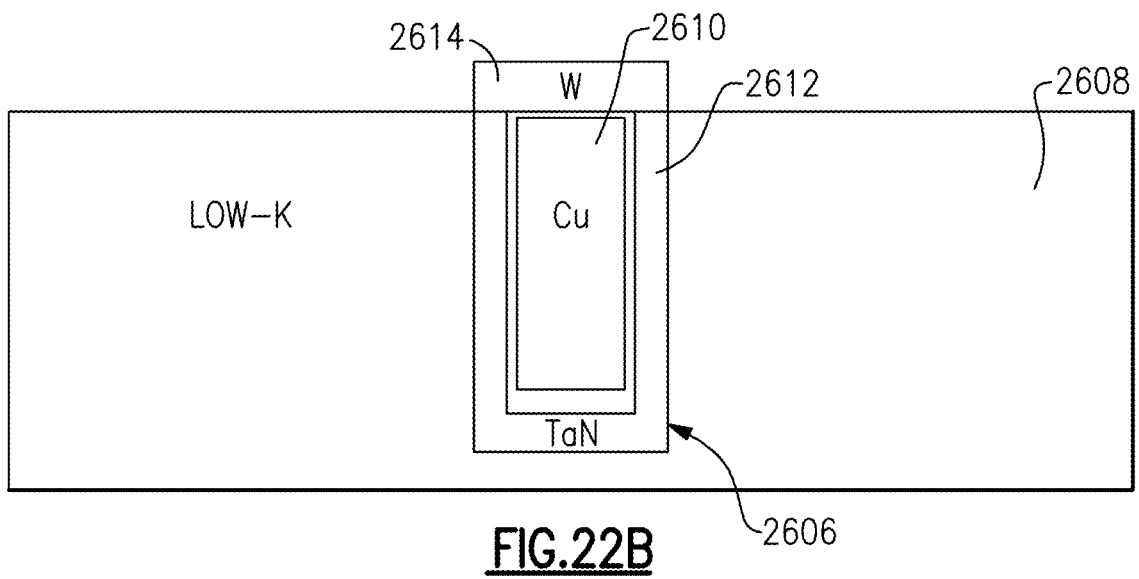
FIG. 22B is a schematic cross section of the substrate of FIG. 22A after formation of a metal cap to define a first surface.

FIG. 22B illustrates the device of FIG. 22A subsequent to a conductive barrier layer 2614 over the first material. In some embodiments, the barrier layer 2614 may be W. While illustrated as protruding, in some embodiments the barrier material 2614 over the Cu 2610 line or via may be embedded in and flush with the surrounding low k material 2608.

Figure 22C:
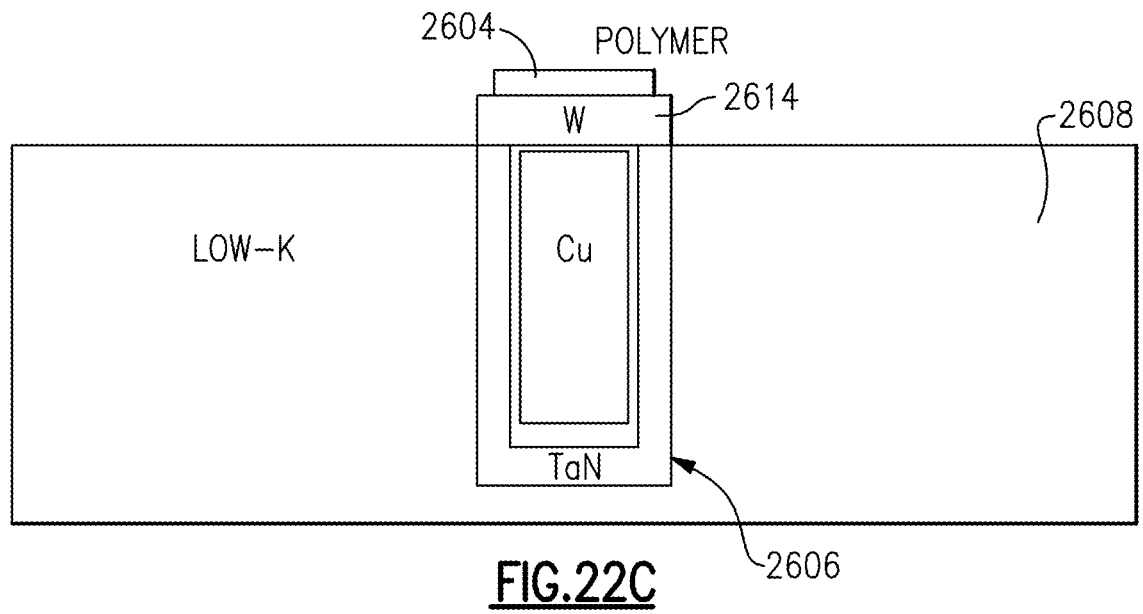
FIG. 22C is a schematic cross section of the substrate of FIG. 22B after selective passivation deposition and etch back, leaving a passivation film over the metal cap with edges of the metal cap exposed.

FIG. 22C illustrates the device of FIG. 22B subsequent to the selective deposition of a passivation layer 2604 over the first surface now defined by the metallic barrier layer 2614 (W), wherein edges of the first surface are exposed. In some embodiments, the passivation layer 2604 may be an organic material, such as a polymer. In some embodiments, the selective deposition of the passivation layer 2604 is followed by an etch back of the passivation layer material sufficient to expose some of the metallic first surface.

Figure 22D:
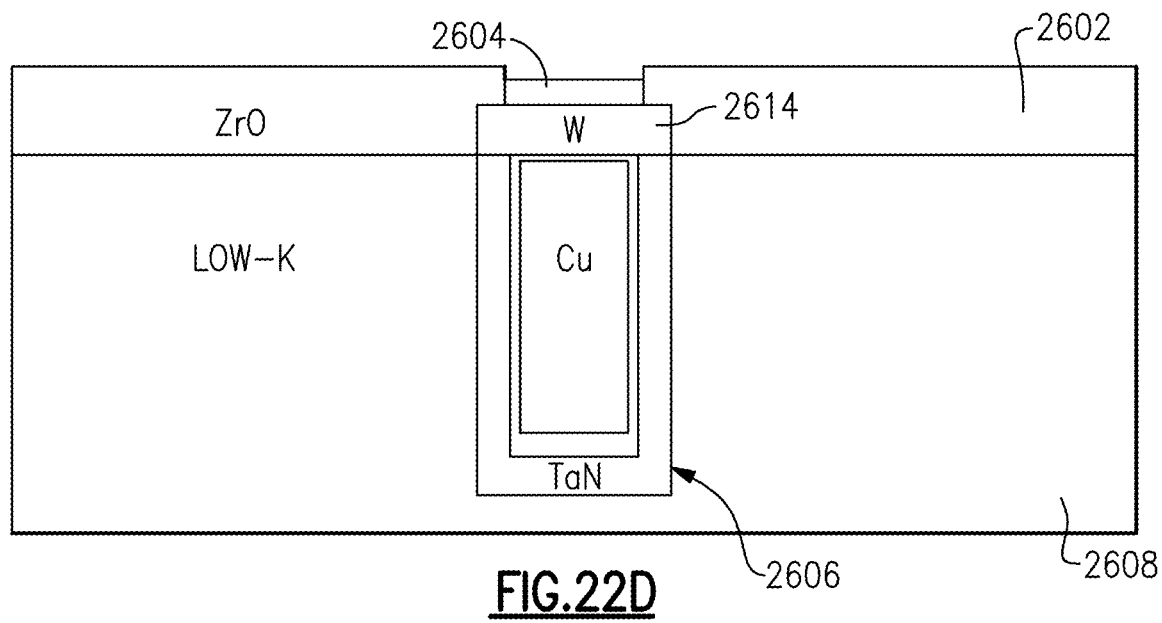
FIG. 22D is a schematic cross section of the substrate of FIG. 22C after selective deposition of a dielectric material over low k surfaces of the substrate, where the deposited dielectric resists etching of low k materials and overlaps with the metal cap.

FIG. 22D illustrates the device of FIG. 22C subsequent to the selective deposition of a dielectric layer 2602 over the second surface, overlapping with the metallic first surface. In some embodiments, the dielectric layer 2602 may be a high-k material. In some embodiments, the high-k material may be $ZrO_2$. In some embodiments, the selective dielectric layer 2602 may be a low-k material, such as SiOC, $Al_2O_3$, and SiN. In some embodiments, the selectively deposited dielectric material 2602 may serve as an etch stop with respect to subsequent etches through low k material 2608 to open trenches or vias that expose the metallic barrier material 2614.

Figure 22E:
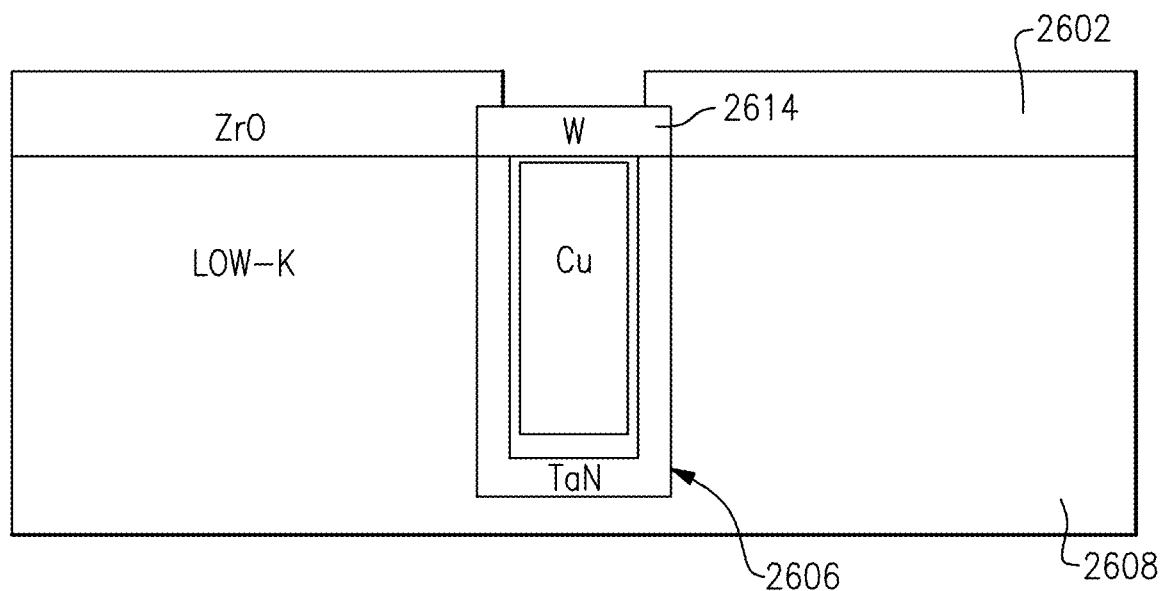
FIG. 22E is a schematic cross section of the substrate of FIG. 22D after removal of the passivation layer.

FIG. 22E illustrates the device of FIG. 22D subsequent to removal of the polymer passivation layer 2604, thereby exposing the underlying metal layer surface (of barrier material 2614 in this cae). The selective dielectric 2602 overlaps the metallic first surface defined by barrier layer 2614 and reduces the risk of shorting when a subsequent metallic feature (e.g., overlying metal line or via) is formed thereover. In particular, a low k material is deposited over the structure of FIG. 22E, and openings are created and filled with metal. The openings are created by masking and selective low k etching, and the etch stops on the selectively deposited dielectric (e.g., $ZrO_2$). The overlap of the selectively deposited dielectric 2602 with the metallic feature defined by the barrier layer 2614, resulting from the selection of conditions during the passivation, etch-back, dielectric deposition and/or topography, protects against misalignment. Thus the overlap prevents contact with adjacent metallic features or undesired etching of the lower low k material 2608. Note that the selectively deposited dielectric material 2602 can stay in the final integrated circuit device, having served as an etch stop between ILD layers. Although ordinarily high k materials are avoided in metallization processes, parasitic capacitance is minimal. Minimal parasitic capacitance is due to the predominant position of the high k material over the low k material, the thinness of the high k material due to its functions, and the advantage of high selectivity for this dielectric capping layer over high k material outweighs slight parasitic capacitance introduced by the material selection. Of course, high etch selectivity may also be achieved with lower k materials to be selectively deposited on the ILD.

Figure 23A:
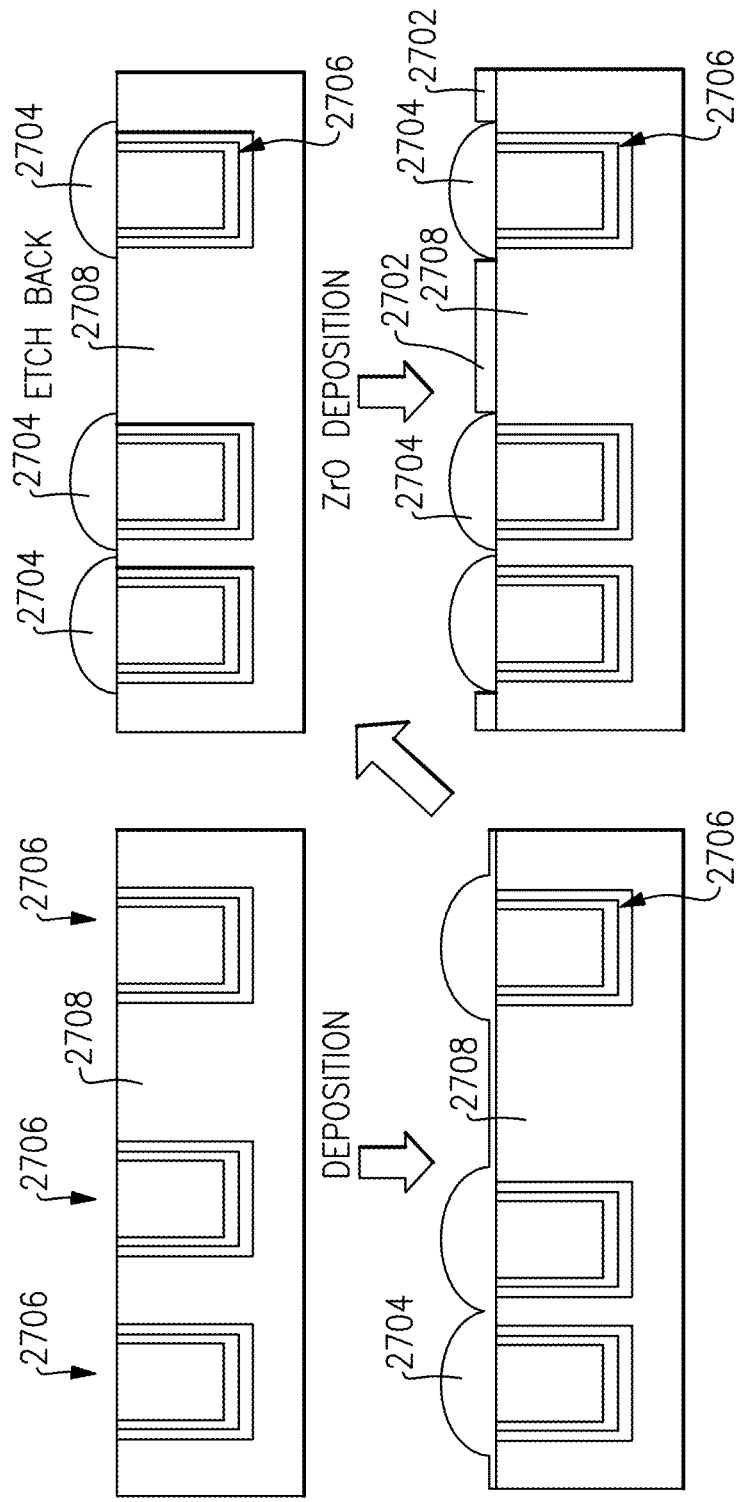
FIG. 23A is a flow diagram showing schematic cross sections of a portion of a substrate having first and second surfaces of different compositions, and generally illustrates selective passivation of the first surfaces, etch back in a manner that leaves the passivation overlapping with the second surfaces, and selective deposition of a dielectric etch mask on the remainder of the second surfaces.
Figure 23B:
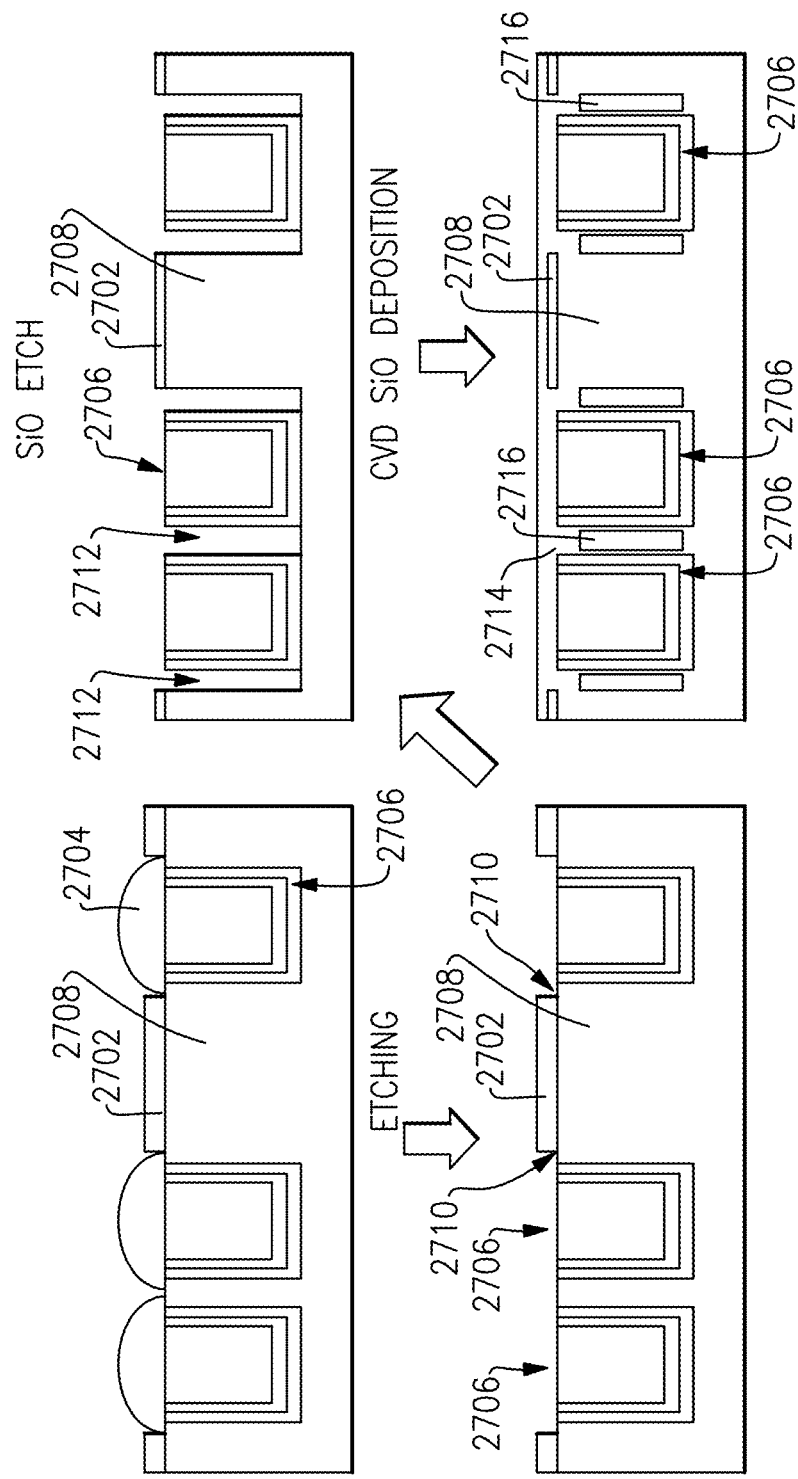
FIG. 23B are schematic cross sections of the substrate of FIG. 23A, following removal of the passivation layers, leaving gaps between the first surfaces and the dielectric etch mask, selective etching of the low k material exposed in the gaps, and deposition to leave air-gaps within the substrate.

FIGS. 23A-23B illustrate a device and process of creating a device, in some embodiments, with air-gaps, which may be desirable for a variety of reasons, such as reduction of parasitic capacitance between closely spaced metallic features (e.g., metal lines) in an integrated circuit. FIG. 23A illustrates planar surface of a partially fabricated integrated circuit of some embodiments, similar to the device previously shown in FIG. 21A. The initial structure may be a first surface defined by a metallic feature 2706 (e.g., Cu line with dielectric and barrier liners) surrounded by a second surface defined by dielectric material 2608 (e.g., low k ILD). A passivation layer 2704 is selectively deposited over the first surface, and an etch back performed to expose the second surface in a manner that leaves the passivation layer 2704 over the first surface and partially over the second surface. A dielectric 2702 is selectively deposited over the second surface, wherein the dielectric layer edge is spaced away from the first-second surface boundary onto the second surface. FIG. 23B illustrates the device of FIG. 23A subsequent to the removal of the passivation layer 2704 to expose the first surface and partially expose the second surface previously covered by the first material, leaving a gap 2710 between the selectively deposited dielectric material and the first surface (metallic feature 2706). Subsequently selectively etching the exposed second material forms cavities 2712 in those gaps 2710 next to the metallic features. In some embodiments, the second material that is selectively etched is SiO. In some embodiments, selective etching is an HBr dry etch. An HBr dry etch can selectively etch silicon oxide at about 6-8 nm/min, whereas certain other materials are etched at lower rates such as silicon nitride (<0.3 nm/min) and zirconium oxide (<0.3 nm/min), and likely will not etch tungsten without chlorine (e.g., $Cl_2$) or sulfur hexafluoride (e.g., $SF_6$). Deposition of a third material 2714, such as standard low k material, with sufficiently low conformality leaves air-gaps 2716 within the low k material 2708 adjacent to a lateral sides of the metallic features 2706. As is known in the art, the air cavities lower the overall k value of the ILD and reduce parasitic capacitance between metallic features.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A method of selective deposition on a second surface of a part relative to a first surface of the part, where the first and second surfaces have different compositions, the method comprising:
   selectively forming a passivation layer comprising a polymer from vapor phase reactants directly on the first surface without catalytic agents on the first surface while leaving the second surface without the passivation layer;

selectively depositing a structural layer comprising a dielectric material from vapor phase reactants on the second surface relative to the passivation layer;

etching back the passivation layer prior to selectively depositing the structural layer, wherein the passivation layer has a tapered edge, such that etching back moves a position of an edge of the structural layer relative to a boundary between the first and second surfaces; and selectively removing the passivation layer from the first surface without removing the structural layer after selectively depositing the structural layer, wherein material of the first surface on which the passivation layer was directly deposited remains after selectively removing the passivation layer.

2. The method of claim 1, wherein etching back comprises etching any polymer from the second surface while leaving some polymer on the first surface.

3. The method of claim 2, wherein the structural layer overlaps with the first surface.

4. The method of claim 3, wherein the first surface is elevated above the second surface.

5. The method of claim 1, wherein selectively forming the passivation layer comprises depositing polyimide.

6. The method of claim 1, wherein the first surface comprises a metallic material and the second surface comprises an inorganic dielectric material.

7. The method of claim 1, wherein the first surface comprises an inorganic dielectric material and the second surface comprises a metallic material.

8. The method of claim 7, wherein selectively forming the passivation layer comprises forming a passivation blocking layer on the second surface and subsequently selectively vapor depositing a polymer layer on the first surface relative to the passivation blocking layer.

9. The method of claim 8, further comprising removing the passivation blocking layer from the second surface without removing the passivation layer from the first surface and subsequently selectively depositing the structural layer on second surface relative to the passivation layer.

10. The method of claim 1, wherein selectively removing the passivation layer from the first surface leaves a gap exposing the second surface between the edge of the structural layer and the underlying boundary between the first and second surfaces.

11. The method of claim 1, wherein the structural layer includes a taper with a slope of less than 45 degrees relative to the second surface.

12. The method of claim 1, wherein the edge of the structural layer encroaches over the first surface.

13. The method of claim 1, wherein the edge of the structural layer is over the second surface and withdrawn from the boundary between the first and second surfaces.

14. A method of selective deposition on a second surface of a part relative to a first surface of the part, where the first and second surfaces have different compositions, the method comprising:

selectively forming a passivation layer comprising a polymer on the first surface relative to the second surface, wherein selectively forming comprises alternately and sequentially exposing the first and second surfaces to first and second vapor phase reactants, and wherein selectively forming leaves the second surface without the passivation layer; and selectively depositing a structural layer comprising a dielectric material from vapor phase reactants on the second surface relative to the passivation layer, wherein the structural layer comprises an edge that is tapered with a slope of less than 45 degrees relative to the second surface.

15. The method of claim 14, wherein selectively forming the passivation layer comprises selective atomic layer deposition.

16. The method of claim 14, wherein the first surface comprises a metallic material and the second surface comprises an inorganic dielectric material.

17. The method of claim 14, wherein selectively forming the passivation layer further comprises depositing a larger amount of passivation layer on a first surface than the second surface and wherein selectively forming further comprises etching any polymer from the second surface while leaving at least some polymer on the first surface.

18. The method of claim 14, further comprising etching back the passivation layer, wherein the passivation layer has a tapered edge, such that etching back moves a position of the edge of the structural layer relative to a boundary between the first and second surfaces.

19. A method of selective deposition on a second surface of a part relative to a first surface of the part, where the first and second surfaces have different compositions, the method comprising:

selectively forming a passivation layer comprising a polymer from vapor phase reactants on the first surface while leaving the second surface without the passivation layer;

selectively depositing a structural layer from vapor phase reactants on the second surface relative to the passivation layer;

selectively removing the passivation layer from the first surface after selectively depositing the structural layer on the second surface without removing the structural layer, wherein after removing the passivation layer, a gap exposing the second surface exists between an edge of the structural layer and a boundary between the first and second surfaces; and selectively etching the second surface in the gap to form a cavity.

* * * * *